United States Patent
Nitta et al.

(10) Patent No.: US 7,339,236 B2
(45) Date of Patent: Mar. 4, 2008

(54) SEMICONDUCTOR DEVICE, DRIVER CIRCUIT AND MANUFACTURING METHOD OF SEMICONDUCTOR DEVICE

(75) Inventors: Tetsuya Nitta, Tokyo (JP); Yasunori Yamashita, Tokyo (JP); Shinichiro Yanagi, Tokyo (JP); Fumitoshi Yamamoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 181 days.

(21) Appl. No.: 11/352,344

(22) Filed: Feb. 13, 2006

(65) Prior Publication Data

US 2006/0180862 A1     Aug. 17, 2006

(30) Foreign Application Priority Data

Feb. 16, 2005   (JP)   ............................. 2005-038705
Dec. 27, 2005   (JP)   ............................. 2005-374306

(51) Int. Cl.
*H01L 27/01*   (2006.01)
*H01L 29/76*   (2006.01)
*H01L 21/336*  (2006.01)

(52) U.S. Cl. ...................... 257/347; 257/350; 257/378; 257/409; 257/E29.255; 257/E29.174; 257/E29.197; 257/E21.415; 438/197; 438/202; 438/479

(58) Field of Classification Search ............... 257/347, 257/350, 378, 409, 492, 493, 565, E29.174, 257/E29.197, E29.255, E21.372, E21.382, 257/E21.415, E21.416; 438/197, 202, 311, 438/479

See application file for complete search history.

(56) References Cited

U.S. PATENT DOCUMENTS

| | | | | |
|---|---|---|---|---|
| 5,359,221 A | * | 10/1994 | Miyamoto et al. | ........... 257/408 |
| 5,656,844 A | * | 8/1997 | Klein et al. | .................. 257/347 |
| 5,994,739 A | * | 11/1999 | Nakagawa et al. | ......... 257/350 |
| 6,872,642 B2 | * | 3/2005 | Oda et al. | .................... 438/528 |
| 2006/0118902 A1 | * | 6/2006 | Ikuta et al. | ................. 257/491 |
| 2006/0220130 A1 | * | 10/2006 | Sato et al. | ................... 257/347 |
| 2007/0090451 A1 | * | 4/2007 | Lee | ........................... 257/327 |

FOREIGN PATENT DOCUMENTS

| | | |
|---|---|---|
| JP | 11-87728 | 3/1999 |
| JP | 2003-197919 | 7/2003 |

* cited by examiner

*Primary Examiner*—T. N. Quach
(74) *Attorney, Agent, or Firm*—Oblon, Spivak, McClelland, Maier & Neustadt, P.C.

(57) ABSTRACT

The present invention provides a semiconductor technology capable of suppressing an increase in threshold voltage of a transistor and, also, improving a withstand voltage between a source region and a drain region. Source and drain regions of a p channel type MOS transistor are formed in an $n^-$ type semiconductor layer in an SOI substrate. In addition, an n type impurity region is formed in the semiconductor layer. The impurity region is formed over the entire bottom of the source region at a portion directly below this source region, and is also formed directly below the semiconductor layer between the source region and the drain region. A peak position of an impurity concentration in the impurity region is set below a lowest end of the source region at a portion directly below an upper surface of the semiconductor layer between the source region and the drain region.

14 Claims, 40 Drawing Sheets

US 7,339,236 B2

SEMICONDUCTOR DEVICE, DRIVER CIRCUIT AND MANUFACTURING METHOD OF SEMICONDUCTOR DEVICE

BACKGROUND OF THE INVENTION

1. Field of the Invention

The present invention relates to a semiconductor device having a transistor formed on a substrate where a semiconductor substrate, an insulating layer and a semiconductor layer are layered in this order, a driver circuit including this semiconductor device, and a manufacturing method of this semiconductor device.

2. Description of the Background Art

A conventional technology for forming a MOS transistor on an SOI (Silicon On Insulator) substrate where a semiconductor substrate, an insulating layer and a semiconductor layer are layered in this order, has been proposed for enhancing the performance of the device. Japanese Patent Application Laid-Open No. 11-87728 (1999), for example, discloses a technology for implementing, using an SOI substrate, a semiconductor device having a MOS transistor that is operable at high speed with a low voltage. In addition, Japanese Patent Application Laid-Open No. 2003-197919 discloses a technology for implementing, using an SOI substrate, a semiconductor device having a MOS transistor that is operable with a low voltage and with a small amount of leak current.

In conventional semiconductor devices where a p channel type MOS transistor is formed on an SOI substrate, the potential of the drain region of the MOS transistor that has been formed in the semiconductor layer of the SOI substrate and the potential of the rear face of the SOI substrate, that is, the potential of the semiconductor substrate of the SOI substrate, are in some cases set at the same potential, in order to stabilize the device properties. At this time, an electrical field is applied to the semiconductor layer of the SOI substrate via an insulating layer. Therefore, this semiconductor layer tends to easily deplete, due to the field plate effect. As a result, punch-through tends to easily occur between the source region and the drain region of the MOS transistor, and in some cases, the withstand voltage therebetween is lowered.

In addition, though a method for restricting extension of the depletion layer through the formation of the source region in the upper surface of an impurity region which has an impurity concentration higher than that of the semiconductor layer of the SOI substrate, and which is provided in the upper surface of this semiconductor layer is possible, this method makes the impurity concentration in the region where the channel layer of the MOS transistor is formed increase, and the threshold voltage of the MOS transistor increases.

SUMMARY OF THE INVENTION

An object of the present invention is to provide a semiconductor technology capable of suppressing an increase in threshold voltage and, also, improving a withstand voltage in a transistor formed in a substrate where a semiconductor substrate, an insulating layer and a semiconductor layer are layered in this order.

A first semiconductor device according to the present invention includes a semiconductor substrate, an insulating layer, an n type semiconductor layer, a p channel type MOS transistor, and an n type impurity region having an impurity concentration higher than that of the semiconductor layer. The insulating layer is formed on the semiconductor substrate. The semiconductor layer is formed on the insulating layer. The MOS transistor is formed in the semiconductor layer. The impurity region is formed in the semiconductor layer. The MOS transistor has p type source and drain regions which are formed in an upper surface of the semiconductor layer at a distance from each other. The impurity region, at least, is formed over the entire bottom of the source region at a portion directly below the source region and is formed directly below the semiconductor layer between the source region and the drain region. A peak position of the impurity concentration in the impurity region is set below a lowest end of the source region at a portion directly below the upper surface of the semiconductor layer between the source region and the drain region.

The impurity region having an impurity concentration higher than that of the semiconductor layer is formed over the entire bottom of the source region at a portion directly below this source region, and is formed directly below the semiconductor layer between the source region and the drain region. Therefore, even in the case where the potential of the drain region and the potential of the semiconductor substrate are set at the same potential in order to achieve stability in the device properties, it becomes difficult for a depletion layer to extend to the source region and to the semiconductor layer between the source region and the drain region. Accordingly, the occurrence of punch-through between the source region and the drain region can be suppressed, and the withstand voltage therebetween can be improved.

Furthermore, the peak position of the impurity concentration in the impurity region is set below the lowest end of the source region at a portion directly below the upper surface of the semiconductor layer between the source region and the drain region. Therefore, it is possible to suppress an increase in n type impurity concentration in a region where the channel layer is formed between the source region and the drain region. Accordingly, it is possible to suppress an increase in threshold voltage of the MOS transistor.

A first driver circuit according to the present invention has an output stage which is configured by two transistors connected in a totem pole manner between a first voltage and a second voltage lower than the first voltage, and outputs a driving voltage from the output stage. The driver circuit includes a semiconductor device. The semiconductor device includes a semiconductor substrate, an insulating layer, an n type semiconductor layer, a p channel MOS transistor, and an n type impurity region having an impurity concentration higher than that of the semiconductor layer. The insulating layer is formed on the semiconductor substrate. The semiconductor layer is formed on the insulating layer. The MOS transistor in the semiconductor device is formed in the semiconductor layer. The impurity region is formed in the semiconductor layer. The MOS transistor in the semiconductor device has p type source and drain regions which are formed in an upper surface of the semiconductor layer at a distance from each other. The impurity region, at least, is formed over the entire bottom of the source region at a portion directly below the source region and is formed directly below the semiconductor layer between the source region and the drain region. A peak position of the impurity concentration in the impurity region is set below a lowest end of the source region at a portion directly below the upper surface of the semiconductor layer between the source region and the drain region. The MOS transistor in the semiconductor device is used as the transistor on the first voltage side in the output stage.

A second driver circuit according to the present invention has an output stage which is configured by two transistors connected in a totem pole manner between a first voltage and a second voltage lower than the first voltage, and outputs a driving voltage from the output stage. The driver circuit includes a semiconductor device. The semiconductor device includes a semiconductor substrate, an insulating layer, an n type semiconductor layer, a p channel type insulating gate type bipolar transistor, and an n type first impurity region having an impurity concentration higher than that of the semiconductor layer. The insulating layer is formed on the semiconductor substrate. The semiconductor layer is formed on the insulating layer. The insulating gate type bipolar transistor is formed in the semiconductor layer. The first impurity region is formed in the semiconductor layer. The insulating gate type bipolar transistor has a p type emitter region and a p type second impurity region which are formed in an upper surface of the semiconductor layer at a distance from each other, and an n type collector region which is formed in the semiconductor layer in contact with the second impurity region. The first impurity region, at least, is formed over the entire bottom of the emitter region at a portion directly below the emitter region and is formed directly below the semiconductor layer between the emitter region and the second impurity region. A peak position of the impurity concentration in the first impurity region is set below a lowest end of the emitter region at a portion directly below the upper surface of the semiconductor layer between the emitter region and the second impurity region. The insulating gate type bipolar transistor in the semiconductor device is used as the transistor on the first voltage side in the output stage.

As the transistor on the high voltage side of the output stage, a transistor having high gate withstand voltage and low threshold voltage is used. Therefore, a high gate voltage can be applied to the transistor on the high voltage side, and the output current of the transistor on the high voltage side can be made large. Accordingly, even in the case where a high gate voltage is outputted from a circuit in the stage before the output stage, this gate voltage can be directly applied to a gate terminal of the transistor on the high voltage side in the output stage. Thus, a circuit configuration of this driver circuit can be simplified, and an operation speed of this transistor on the high voltage side can be improved.

A first manufacturing method of a semiconductor device according to the present invention is a method for manufacturing a semiconductor device including a semiconductor substrate, an insulating layer, an n type semiconductor layer, a p channel type MOS transistor, and an n type impurity region having an impurity concentration higher than that of the semiconductor layer, and includes steps (a) and (b). The insulating layer is formed on the semiconductor substrate. The semiconductor layer is formed on the insulating layer. The MOS transistor is formed in the semiconductor layer. The impurity region is formed in the semiconductor layer. The MOS transistor has p type source and drain regions which are formed in an upper surface of the semiconductor layer at a distance from each other. The impurity region, at least, is formed over the entire bottom of the source region at a portion directly below the source region and is formed directly below the semiconductor layer between the source region and the drain region. A peak position of the impurity concentration in the impurity region is set below a lowest end of the source region at a portion directly below the upper surface of the semiconductor layer between the source region and the drain region. The step (a) is a step of preparing an SOI substrate including the semiconductor substrate, the insulating layer and the semiconductor layer. The step (b) is a step of forming the MOS transistor and the impurity region in the semiconductor layer. The step (b) includes steps (b-1) and (b-2). The step (b-1) is a step of introducing n type impurities into the semiconductor layer from above, thereby forming the impurity region in such a manner that the impurity region is buried into the semiconductor layer so as not to be exposed from the semiconductor layer. The step (b-2) is a step of forming the drain and source regions of the MOS transistor in the upper surface of the semiconductor layer.

N type impurities are introduced into the semiconductor layer from above; thus, the impurity region is formed in such a manner that the impurity region is buried into the semiconductor layer so as not to be exposed from the semiconductor layer. Therefore, the manufacturing method can be simplified and the cost for processing can be reduced in comparison with a case where an impurity region is formed in an upper surface of a semiconductor layer, and then, another semiconductor layer is formed on this semiconductor layer so that the impurity region is buried into the semiconductor layer.

A second manufacturing method of a semiconductor device according to the present invention is a method for manufacturing a semiconductor device including a semiconductor substrate, an insulating layer, an n type semiconductor layer, a p channel type MOS transistor, an n type first impurity region having an impurity concentration higher than that of the semiconductor layer, an NPN transistor, an n type second impurity region having an impurity concentration higher than that of the semiconductor layer, and includes steps (a) to (c). The insulating layer is formed on the semiconductor substrate. The semiconductor layer is formed on the insulating layer. The MOS transistor and the NPN transistor are formed in the semiconductor layer. The first and second impurity regions are formed in the semiconductor layer. The MOS transistor has p type source and drain regions which are formed in an upper surface of the semiconductor layer at a distance from each other. The first impurity region, at least, is formed over the entire bottom of the source region at a portion directly below the source region and is formed directly below the semiconductor layer between the source region and the drain region. A peak position of the impurity concentration in the first impurity region is set below a lowest end of the source region at a portion directly below the upper surface of the semiconductor layer between the source region and the drain region. The NPN transistor has a p type base region, an n type emitter region, and an n type third impurity region electrically connected to a collector electrode. The base region is formed in the upper surface of the semiconductor layer. The emitter region is formed in an upper surface of the base region. The third impurity region is formed in the upper surface of the semiconductor layer at a distance from the base region. The second impurity region is provided at least directly below the emitter region and the base region. The step (a) is a step of preparing an SOI substrate including the semiconductor substrate, the insulating layer and the semiconductor layer. The step (b) is a step of simultaneously forming the first impurity region and the second impurity region. The step (c) is a step of forming the drain and source regions of the MOS transistor, and the base region, emitter region and third impurity region of the NPN transistor.

The first impurity region and the second impurity region are formed simultaneously. Therefore, it is possible to form a MOS transistor having a high withstand voltage and a low threshold voltage and an NPN transistor having a collector region with low resistance, without increasing the number of steps.

A third manufacturing method of a semiconductor device according to the present invention is a method for manufacturing a semiconductor device including a semiconductor substrate, an insulating layer, an n type semiconductor layer, a p channel type MOS transistor, an n type first impurity region having an impurity concentration higher than that of the semiconductor layer, a PNP transistor, and an n type second impurity region having an impurity concentration higher than that of the semiconductor layer, and includes steps (a) to (c). The insulating layer is formed on the semiconductor substrate. The semiconductor layer is formed on the insulating layer. The MOS transistor and the PNP transistor are formed in the semiconductor layer. The first and second impurity regions are formed in the semiconductor layer. The MOS transistor has p type source and drain regions which are formed in an upper surface of the semiconductor layer at a distance from each other. The first impurity region, at least, is formed over the entire bottom of the source region at a portion directly below the source region and is formed directly below the semiconductor layer between the source region and the drain region. A peak position of the impurity concentration in the first impurity region is set below a lowest end of the source region at a portion directly below the upper surface of the semiconductor layer between the source region and the drain region. The PNP transistor has an n type third impurity region electrically connected to a base electrode, a p type collector region, and a p type emitter region. The third impurity region and the collector region are formed in the upper surface of the semiconductor layer. The emitter region is formed in the upper surface of the semiconductor layer between the third impurity region and the collector region. The second impurity region is provided at least directly below the emitter region. The step (a) is a step of preparing an SOI substrate including the semiconductor substrate, the insulating layer and the semiconductor layer. The step (b), is a step of simultaneously forming the first impurity region and the second impurity region. The step (c) is a step of forming the drain and source regions of the MOS transistor and the third impurity region, collector region and emitter region of the PNP transistor.

The first impurity region and the second impurity region are formed simultaneously. Therefore, it is possible to form a MOS transistor having a high withstand voltage and a low threshold voltage and a PNP transistor having a high withstand voltage between the emitter and the collector, without increasing the number of steps.

A second semiconductor device according to the present invention includes a semiconductor substrate, an insulating layer, an n type semiconductor layer, a p channel type insulating gate type bipolar transistor, and an n type first impurity region having an impurity concentration higher than that of the semiconductor layer. The insulating layer is formed on the semiconductor substrate. The semiconductor layer is formed on the insulating layer. The insulating gate type bipolar transistor is formed in the semiconductor layer. The first impurity region is formed in the semiconductor layer. The insulating gate type bipolar transistor has a p type emitter region and a p type second impurity region which are formed in an upper surface of the semiconductor layer at a distance from each other, and an n type collector region which is formed in the semiconductor layer in contact with the second impurity region. The first impurity region, at least, is formed over the entire bottom of the emitter region at a portion directly below the emitter region and is formed directly below the semiconductor layer between the emitter region and the second impurity region. A peak position of the impurity concentration in the first impurity region is set below a lowest end of the emitter region at a portion directly below the upper surface of the semiconductor layer between the emitter region and the second impurity region.

The first impurity region having an impurity concentration higher than that of the semiconductor layer is formed over the entire bottom of the emitter region at a portion directly below this emitter region, and is formed directly below the semiconductor layer between the emitter region and the second impurity region. Therefore, even in the case where the potential of the collector region and the potential of the semiconductor substrate are set at the same potential in order to achieve stability in the device properties, it becomes difficult for a depletion layer to extend to the emitter region and to the semiconductor layer between the emitter region and the second impurity region. Accordingly, the occurrence of punch-through between the emitter region and the second impurity region can be suppressed, and the withstand voltage therebetween can be improved.

Furthermore, the peak position of the impurity concentration in the first impurity region is set below the lowest end of the emitter region at a portion directly below the upper surface of the semiconductor layer between the emitter region and the second impurity region. Therefore, it is possible to suppress an increase in n type impurity concentration in a region where the channel layer is formed between the emitter region and the second impurity region. Accordingly, it is possible to suppress an increase in threshold voltage of the insulating gate type bipolar transistor.

A fourth manufacturing method of a semiconductor device according to the present invention is a method for manufacturing a semiconductor device including a semiconductor substrate, an insulating layer, an n type semiconductor layer, a p channel type insulating gate type bipolar transistor, and an n type first impurity region having an impurity concentration higher than that of the semiconductor layer, and includes steps (a) and (b). The insulating layer is formed on the semiconductor substrate. The semiconductor layer is formed on the insulating layer. The insulating gate type bipolar transistor is formed in the semiconductor layer. The first impurity region is formed in the semiconductor layer. The insulating gate type bipolar transistor has a p type emitter region and a p type second impurity region which are formed in an upper surface of the semiconductor layer at a distance from each other, and an n type collector region which is formed in the semiconductor layer in contact with the second impurity region. The first impurity region, at least, is formed over the entire bottom of the emitter region at a portion directly below the emitter region and is formed directly below the semiconductor layer between the emitter region and the second impurity region. A peak position of the impurity concentration in the first impurity region is set below a lowest end of the emitter region at a portion directly below the upper surface of the semiconductor layer between the emitter region and the second impurity region. The step (a) is a step of preparing an SOI substrate including the semiconductor substrate, the insulating layer and the semiconductor layer. The step (b) is a step of forming the insulating gate type bipolar transistor and the first impurity region in the semiconductor layer. The step (b) includes steps (b-1) and (b-2). The step (b-1) is a step of introducing n type impurities into the semiconductor layer from above, thereby forming the first impurity region in such a manner that the first impurity region is buried into the semiconductor layer so as not to be exposed from the semiconductor layer. The step (b-2) is a step of forming the emitter region, collector region and second impurity region of the insulating gate type bipolar transistor in the upper surface of the semiconductor layer.

N type impurities are introduced into the semiconductor layer from above; thus, the first impurity region is formed in such a manner that the first impurity region is buried into the semiconductor layer so as not to be exposed from the semiconductor layer. Therefore, the manufacturing method can be simplified and the cost for processing can be reduced in comparison with a case where a first impurity region is formed in an upper surface of a semiconductor layer, and then, another semiconductor layer is formed on this semiconductor layer so that the first impurity region is buried into the semiconductor layer.

A fifth manufacturing method of a semiconductor device according to the present invention is a method for manufacturing a semiconductor device including a semiconductor substrate, an insulating layer, an n type semiconductor layer, a p channel type insulating gate type bipolar, an n type first impurity region having an impurity concentration higher than that of the semiconductor layer, an NPN transistor, and an n type second impurity region having an impurity concentration higher than that of the semiconductor layer, and includes steps (a) to (c). The insulating layer is formed on the semiconductor substrate. The semiconductor layer is formed on the insulating layer. The insulating gate type bipolar transistor and the NPN transistor are formed in the semiconductor layer. The first and second impurity regions are formed in the semiconductor layer. The insulating gate type bipolar transistor has a p type emitter region and a p type third impurity region which are formed in an upper surface of the semiconductor layer at a distance from each other, and an n type collector region which is formed in the semiconductor layer in contact with the third impurity region. The first impurity region, at least, is formed over the entire bottom of the emitter region at a portion directly below the emitter region and is formed directly below the semiconductor layer between the emitter region and the third impurity region. A peak position of the impurity concentration in the first impurity region is set below a lowest end of the emitter region at a portion directly below the upper surface of the semiconductor layer between the emitter region and the third impurity region. The NPN transistor has a p type base region which is formed in the upper surface of the semiconductor layer, an n type emitter region which is formed in an upper surface of the base region, and an n type fourth impurity region which is formed in the upper surface of the semiconductor layer at a distance from the base region and is electrically connected to a collector electrode. The second impurity region is provided at least directly below the emitter region and base region of the NPN transistor. The step (a) is a step of preparing an SOI substrate including the semiconductor substrate, the insulating layer and the semiconductor layer. The step (b) is a step of simultaneously forming the first impurity region and the second impurity region. The step (c) is a step of forming the emitter region, collector region and third impurity region of the insulating gate type bipolar transistor and the base region, emitter region and fourth impurity region of the NPN transistor.

The first impurity region and the second impurity region are formed simultaneously. Therefore, it is possible to form an insulating gate type bipolar transistor having a high withstand voltage and a low threshold voltage and an NPN transistor having a collector region with low resistance, without increasing the number of steps.

A sixth manufacturing method of a semiconductor device according to the present invention is a method for manufacturing a semiconductor device including a semiconductor substrate, an insulating layer, an n type semiconductor layer, a p channel type insulating gate type bipolar transistor, an n type first impurity region having an impurity concentration higher than that of the semiconductor layer, a PNP transistor, and an n type second impurity region having an impurity concentration higher than that of the semiconductor layer, and includes steps (a) to (c). The insulating layer is formed on the semiconductor substrate. The semiconductor layer is formed on the insulating layer. The insulating gate type bipolar transistor and the PNP transistor are formed in the semiconductor layer. The first and second impurity regions are formed in the semiconductor layer. The insulating gate type bipolar transistor has a p type emitter region and a p type third impurity region which are formed in an upper surface of the semiconductor layer at a distance from each other, and an n type collector region which is formed in the semiconductor layer in contact with the third impurity region. The first impurity region, at least, is formed over the entire bottom of the emitter region at a portion directly below the emitter region and is formed directly below the semiconductor layer between the emitter region and the third impurity region. A peak position of the impurity concentration in the first impurity region is set below a lowest end of the emitter region at a portion directly below the upper surface of the semiconductor layer between the emitter region and the third impurity region. The PNP transistor has an n type fourth impurity region which is formed in the upper surface of the semiconductor layer, and is electrically connected to a base electrode, a p type collector region which is formed in the upper surface of the semiconductor layer, and a p type emitter region which is formed in the upper surface of the semiconductor layer between the fourth impurity region and the p type collector region. The second impurity region is provided at least directly below the emitter region of the PNP transistor. The step (a) is a step of preparing an SOI substrate including the semiconductor substrate, the insulating layer and the semiconductor layer. The step (b) is a step of simultaneously forming the first impurity region and the second impurity region. The step (c) is a step of forming the emitter region, collector region and third impurity region of the insulating gate type bipolar transistor and the fourth impurity region, p type collector region and emitter region of the PNP transistor.

The first impurity region and the second impurity region are formed simultaneously. Therefore, it is possible to form an insulating gate type bipolar transistor having a high withstand voltage and a low threshold voltage and a PNP transistor having a high withstand voltage between the emitter and the collector, without increasing the number of steps.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
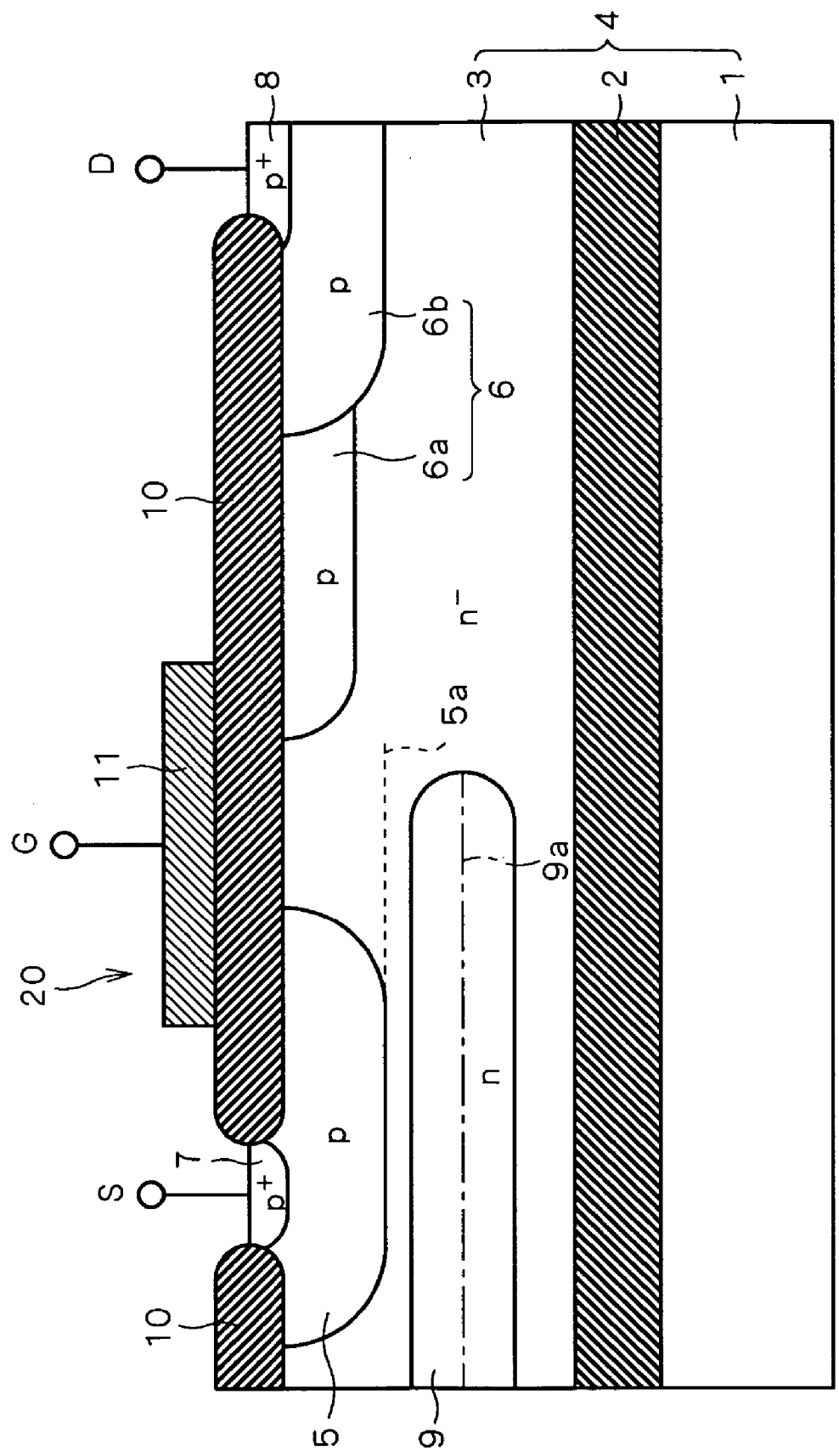
FIG. 1 is a sectional view showing a portion of the structure of a semiconductor device according to the first embodiment of the present invention.

FIG. 1 is a sectional view showing a portion of the structure of a semiconductor device according to the first embodiment of the present invention. As shown in FIG. 1, the semiconductor device according to the first embodiment is provided with an SOI substrate 4 and a p channel type MOS transistor 20 that is formed in this SOI substrate 4. The SOI substrate 4 has a semiconductor substrate 1, an insulating layer 2 that is formed on this semiconductor substrate 1, and an n$^-$ type semiconductor layer 3 that is formed on this insulating layer 2. The semiconductor substrate 1 is, for example, a silicon substrate, the insulating layer 2 is, for example, a silicon oxide film and the semiconductor layer 3 is, for example, a silicon layer.

The MOS transistor 20 is formed in the semiconductor layer 3 of the SOI substrate 4, and is provided with a p type source region 5 and a p type drain region 6. The source region 5 and the drain region 6 are formed in an upper surface of the semiconductor layer 3 at a distance from each other. The drain region 6 is made of a p type offset region 6a and a p type impurity region 6b. The impurity region 6b is formed at a distance from the source region 5, and the offset region 6a is formed so as to extend from the end of the impurity region 6b on the source region 5 side toward the source region 5.

A p$^+$ type impurity region 7 is formed in an upper surface of the source region 5, and a p$^+$ type impurity region 8 is formed in an upper surface of the impurity region 6b in the drain region 6. A source electrode and a drain electrode, neither shown, are formed on the impurity regions 7 and 8, respectively.

A field oxide film 10 is formed on the upper surface of the semiconductor layer 3 excluding the upper surface of the impurity regions 7 and 8, where the portion of the field oxide film that is formed on the semiconductor layer 3 between the source region 5 and the drain region 6 functions as a gate insulating film of the MOS transistor 20. In addition, a gate electrode 11 of the MOS transistor 20 is formed on the field oxide film 10 which functions as the gate insulating film so as to cover the end of the source region 5 on the drain region 6 side and the end of the offset region 6a on the source region 5 side as viewed from the top. The field oxide film 10 is a silicon oxide film having a film thickness of, for example, no less than 200 nm, and the gate electrode 11 is a layered film of, for example, a doped polysilicon film and a tungsten silicide film.

The semiconductor device according to the first embodiment is further provided with an n type impurity region 9 which is formed in the semiconductor layer 3 and has an impurity concentration higher than that of this semiconductor layer 3. The impurity region 9 is formed over the entire bottom of the source region 5 at a distance from this source region 5 at a portion directly below the source region 5. In other words, the impurity region 9 is formed over the entire bottom of the source region 5 as viewed from the bottom. Furthermore, the impurity region 9 extends to a portion directly below the semiconductor layer 3 between the source region 5 and the drain region 6 so as to exist directly below the channel region of the MOS transistor 20 which is formed between the source region 5 and the drain region 6. Accordingly, a peak position 9a in the impurity concentration (hereinafter, referred to as "concentration peak position 9a") exists below a lowest end 5a of the source region 5 throughout the entire impurity region 9.

In the semiconductor device according to the first embodiment which has the structure, a voltage is applied across the source region 5 and the drain region 6 of the MOS transistor 20, so that the source region 5 becomes of a high potential, and a negative gate potential is applied to the gate electrode 11. Furthermore, in order to stabilize the device properties, the potential of the rear face of the SOI substrate 4, that is, the potential of the semiconductor substrate 1, is set at a value that is the same as the potential of the drain region 6. As a result of this, a channel layer is formed in the semiconductor layer 3 between the source region 5 and the drain region 6, and this makes the MOS transistor 20 of an ON state so that a current flows between the source region 5 and the drain region 6, and the MOS transistor 20 functions as a semiconductor switch.

In addition, in the semiconductor device according to the first embodiment, the film thickness of the field oxide film 10 which functions as the gate insulating film of the MOS transistor 20 is set at no less than 200 nm. Therefore, it is possible to apply a high potential having an absolute value of no less than 100 V, to the gate electrode 11. Accordingly, the semiconductor device according to the first embodiment can be used in the scan driver IC of, for example, a plasma display panel (PDP).

Figure 2:
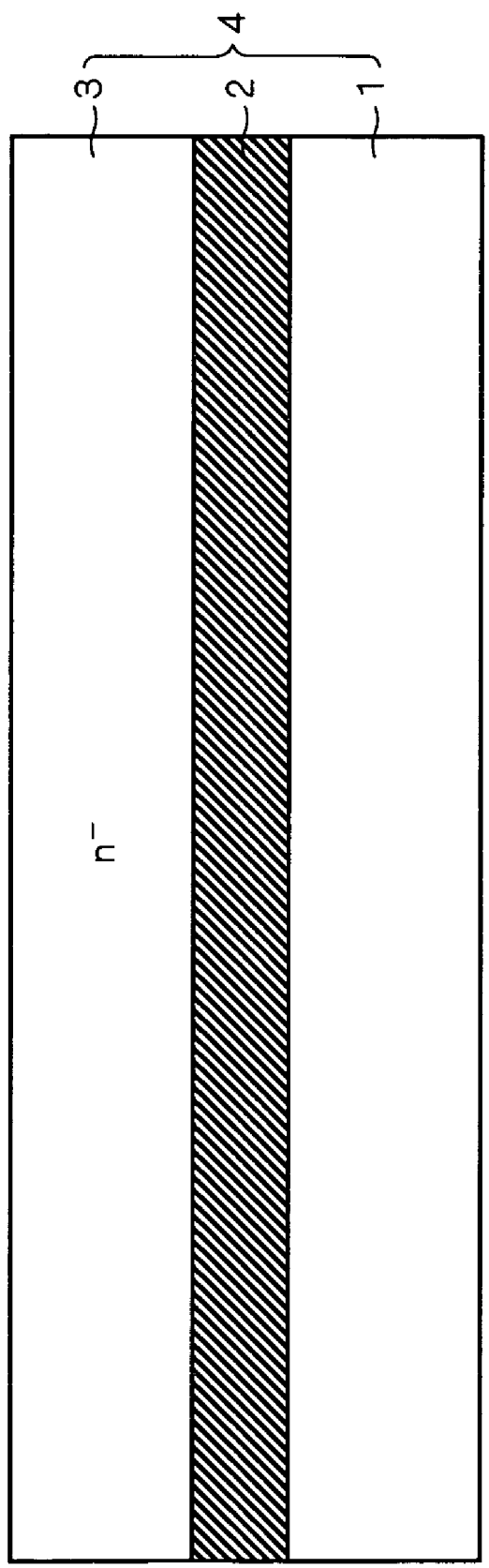
FIGS. 2 to 9 are sectional views showing the steps in a manufacturing method of the semiconductor device according to the first embodiment of the present invention in chronological order.

Next, a manufacturing method of the semiconductor device according to the first embodiment shown in FIG. 1 is described. FIGS. 2 to 9 are sectional views showing the steps in a manufacturing method of the semiconductor device according to the first embodiment in chronological order. As shown in FIG. 2, first, an SOI substrate 4 is formed. Here, the thickness of the semiconductor layer 3 in the SOI substrate 4 is half of the thickness of the semiconductor layer 3 after completion. In the present embodiment, the thickness of the semiconductor layer 3 after completion is set at, for example, 5 μm. Therefore, the thickness of the semiconductor layer 3 at this stage is set at 2.5 μm. In addition, the impurity concentration of the semiconductor layer 3 is set at, for example, $2.0 \times 10^{15}$ ions/cm$^3$.

Figure 3:
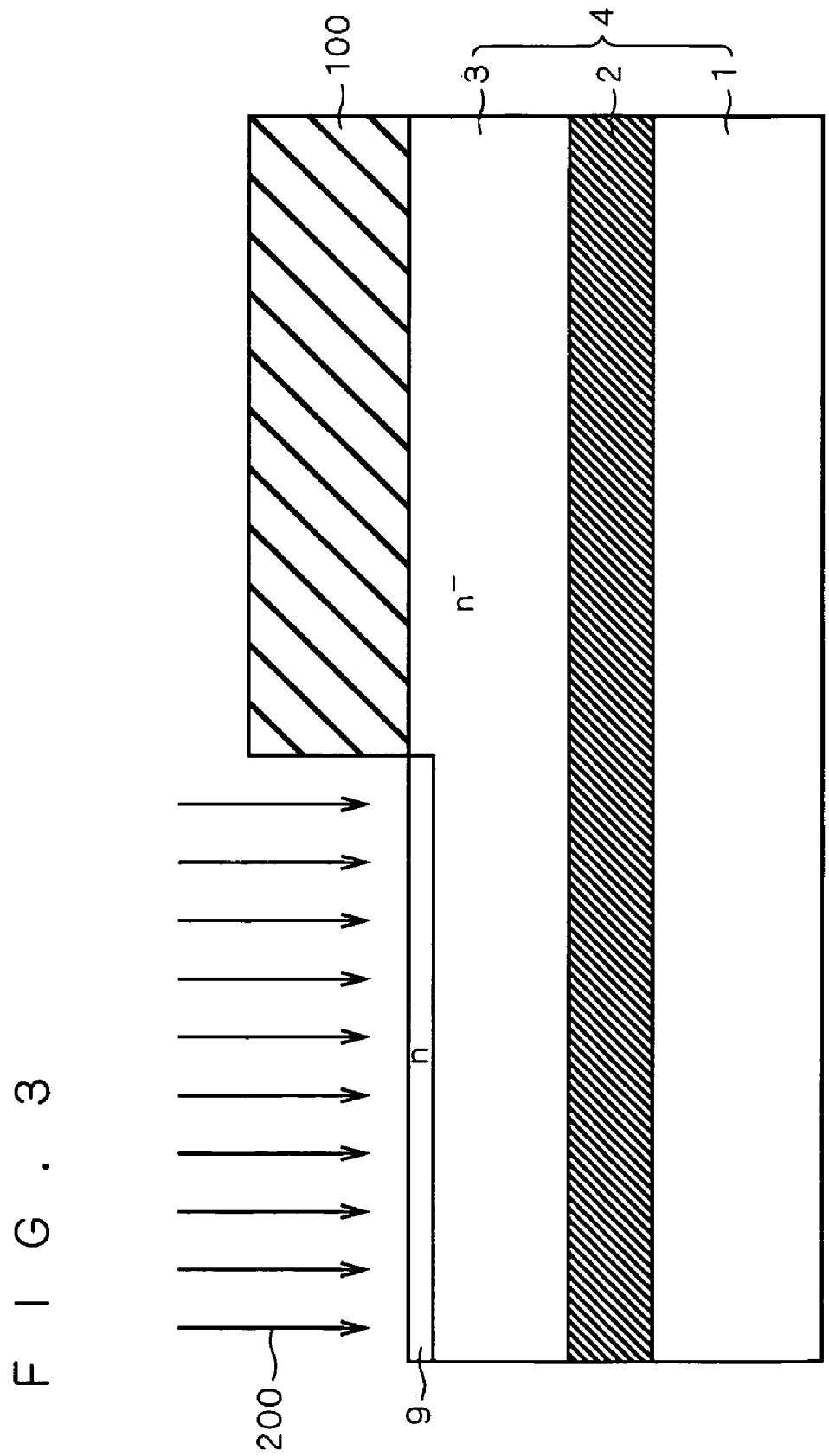

Next, as shown in FIG. 3, a resist 100 having a predetermined pattern with an opening is formed on the semiconductor layer 3. After that, the resist 100 is used as a mask, and ions of an n type impurity 200, such as phosphorous, are implanted in the exposed upper surface of the semiconductor layer 3, and then, the resist 100 that is used as a mask is removed. At this time, the energy for implantation is set at, for example, approximately 50 keV, and the amount for implantation is set at approximately $5.0 \times 10^{12}$ ions/cm$^2$. As a result of this, an impurity region 9 is selectively formed in the upper surface of the semiconductor layer 3. Here, this impurity region 9 is made to diffuse in the subsequent step of heat treatment.

Figure 4:
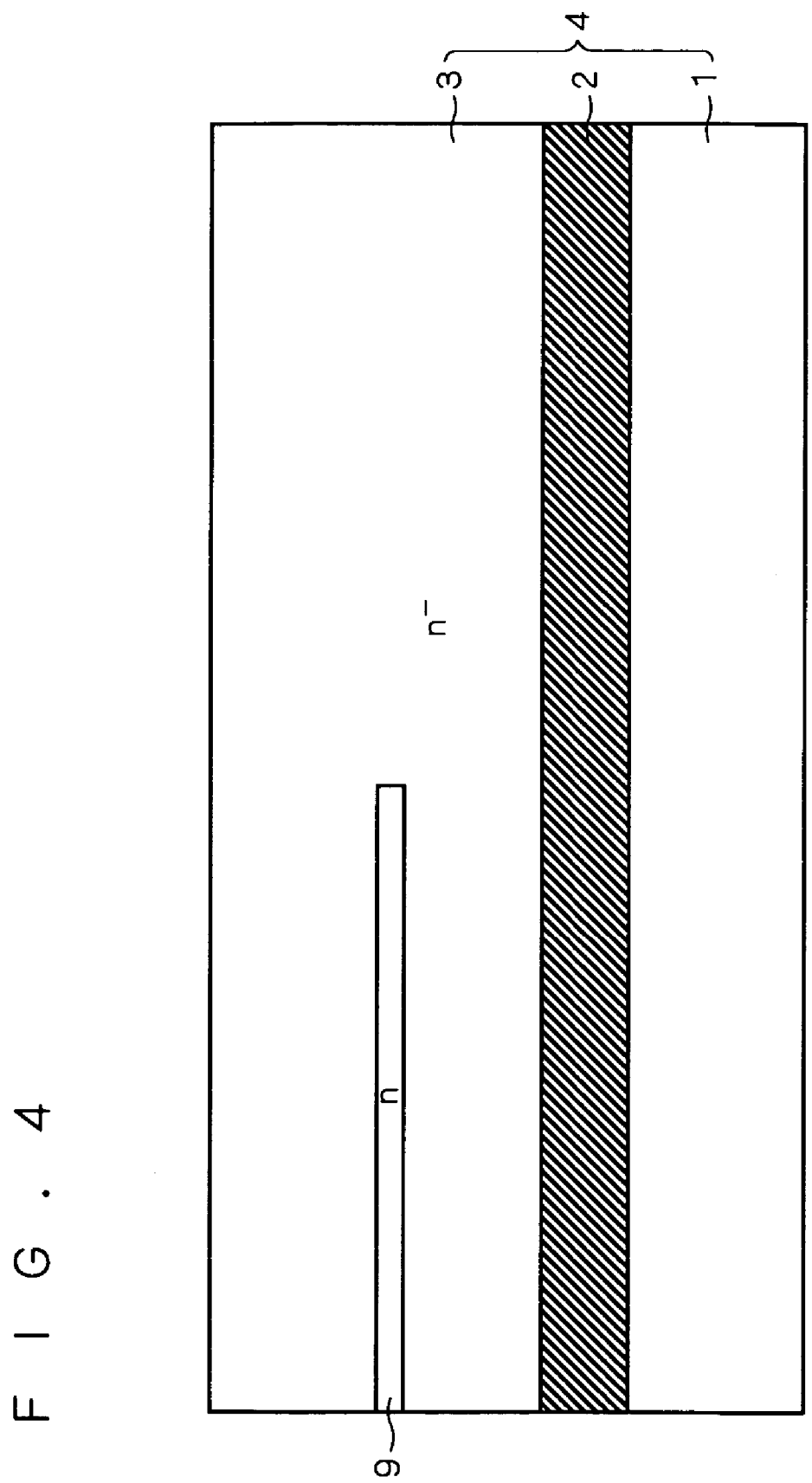
Figure 5:
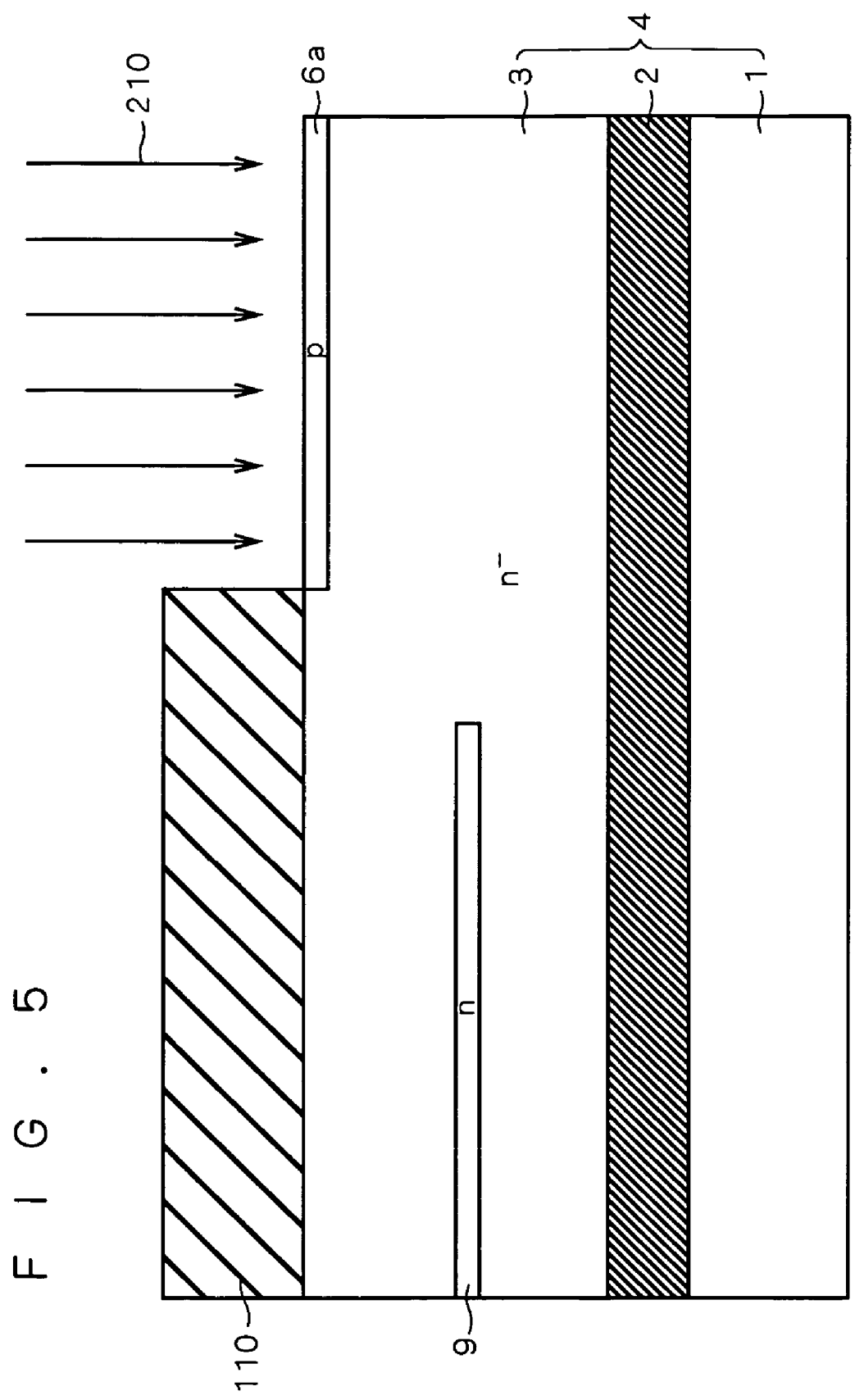

Next, as shown in FIG. 4, the thickness of the semiconductor layer 3 is increased to up to 5.0 μm in accordance with an epitaxial growth method. As a result of this, the impurity region 9 is buried in this semiconductor layer 3 without being exposed from the upper surface of the semiconductor layer 3. After that, as shown in FIG. 5, a resist 110 having a predetermined pattern with an opening is formed on the semiconductor layer 3. Next, the resist 110 is used as a mask, and ions of a p type impurity 210, such as boron, are implanted in the exposed upper surface of the semiconductor layer 3, and then, the resist 110 that is used as a mask is removed. At this time, the energy for implantation is set at, for example, approximately 100 keV, and the amount for implantation is set at approximately $3.0 \times 10^{12}$ ions/cm$^2$. As a result of this, an offset region 6a is selectively formed in the upper surface of the semiconductor layer 3. Here, this offset region 6a is made to diffuse in the subsequent step of heat treatment.

Figure 6:
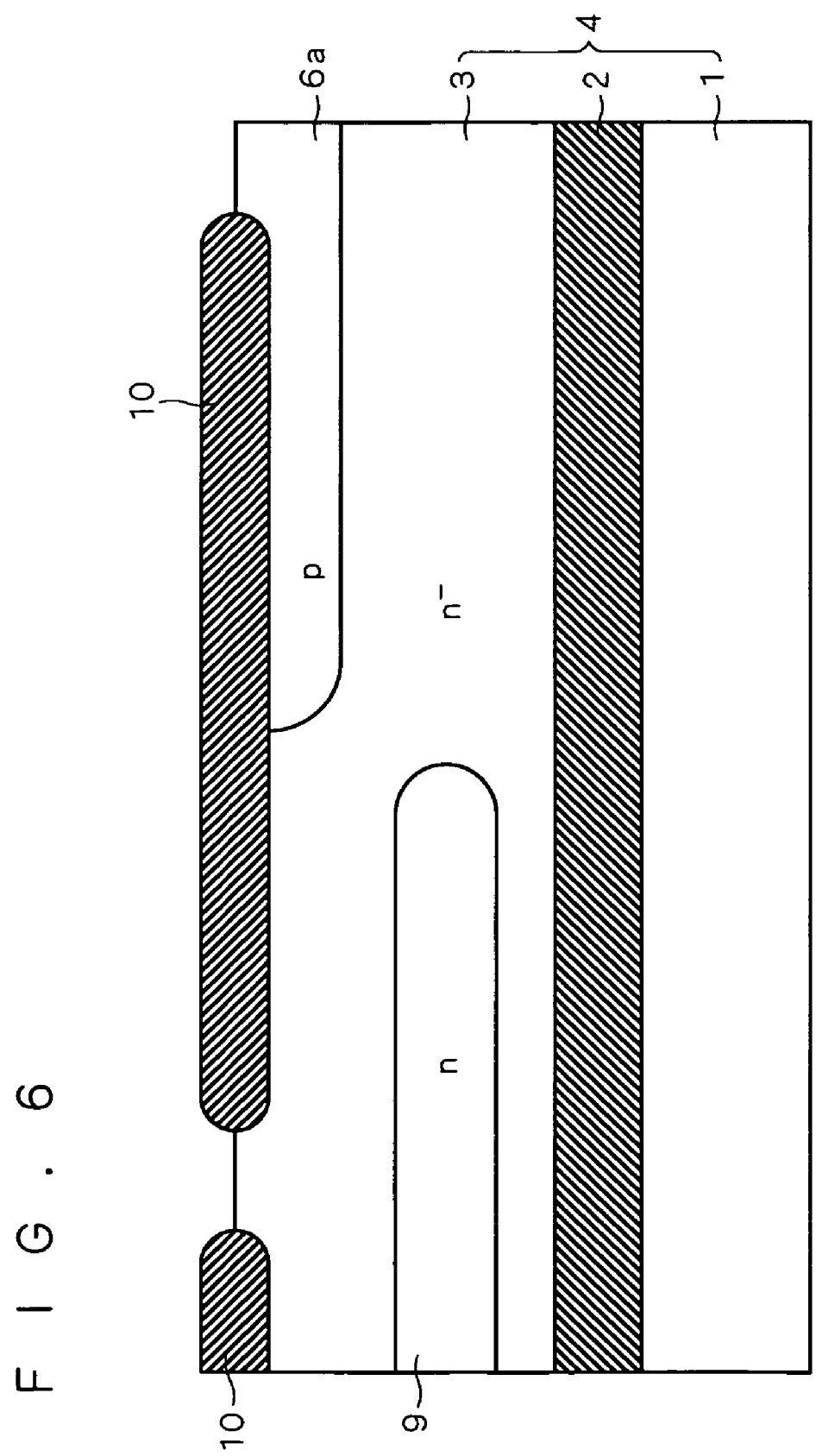

Next, as shown in FIG. 6, the upper surface of the semiconductor layer 3 is selectively thermally oxidized, so that a field oxide film 10 which also functions as a gate insulating film of the MOS transistor 20 is formed on the upper surface of the semiconductor layer 3. At this time, the film thickness of the field oxide film 10 is set at, for example, approximately 500 nm. In addition, the offset region 6a and the impurity region 9 are made to diffuse through the thermal oxidation at this time, and thereby, the offset region 6a and the impurity region 9 are completed. Here, the impurity concentration of the impurity region 9 after diffusion becomes approximately $5.0 \times 10^{16}$ ions/cm$^3$, which is higher than the impurity concentration of the semiconductor layer 3.

Figure 7:
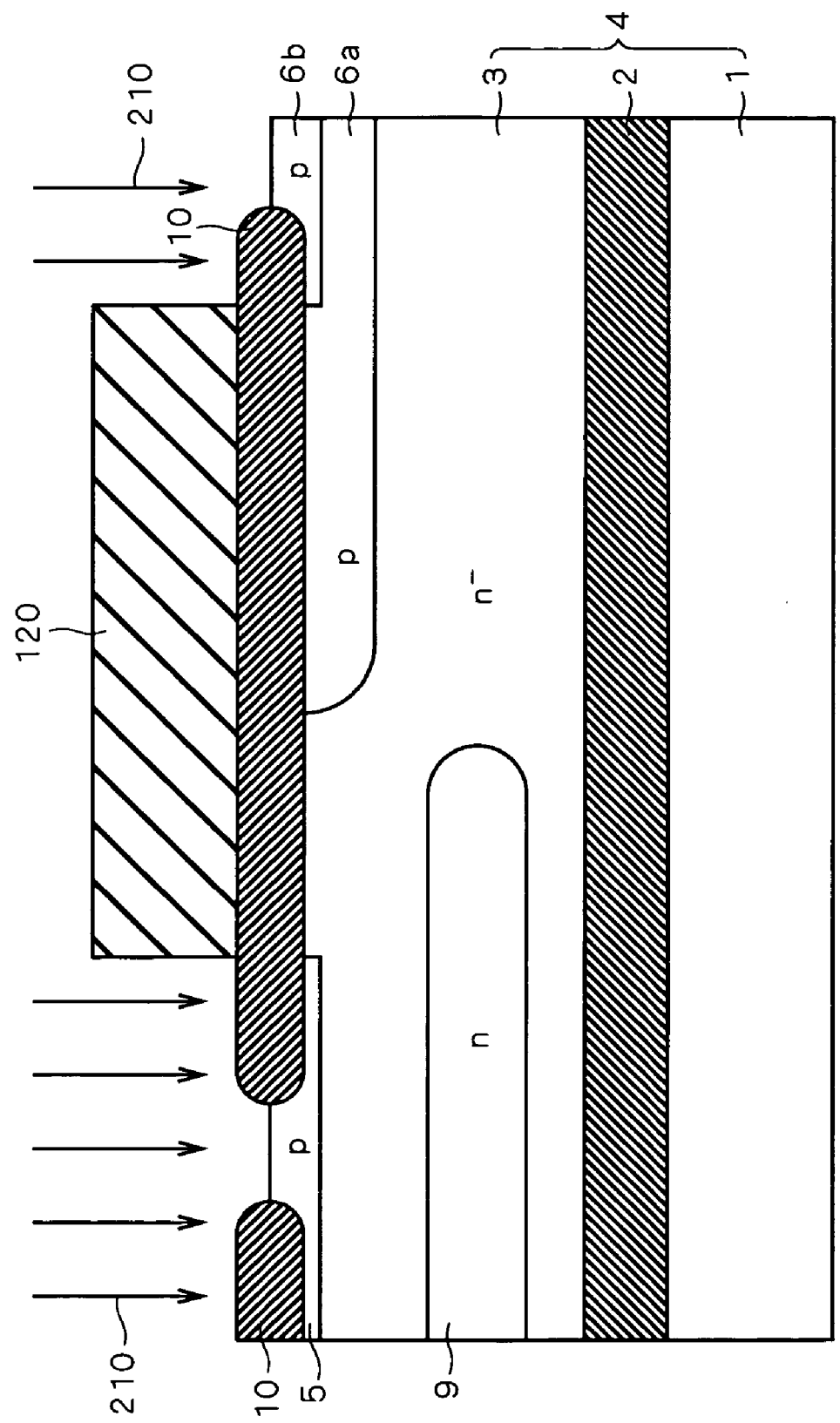
Figure 8:
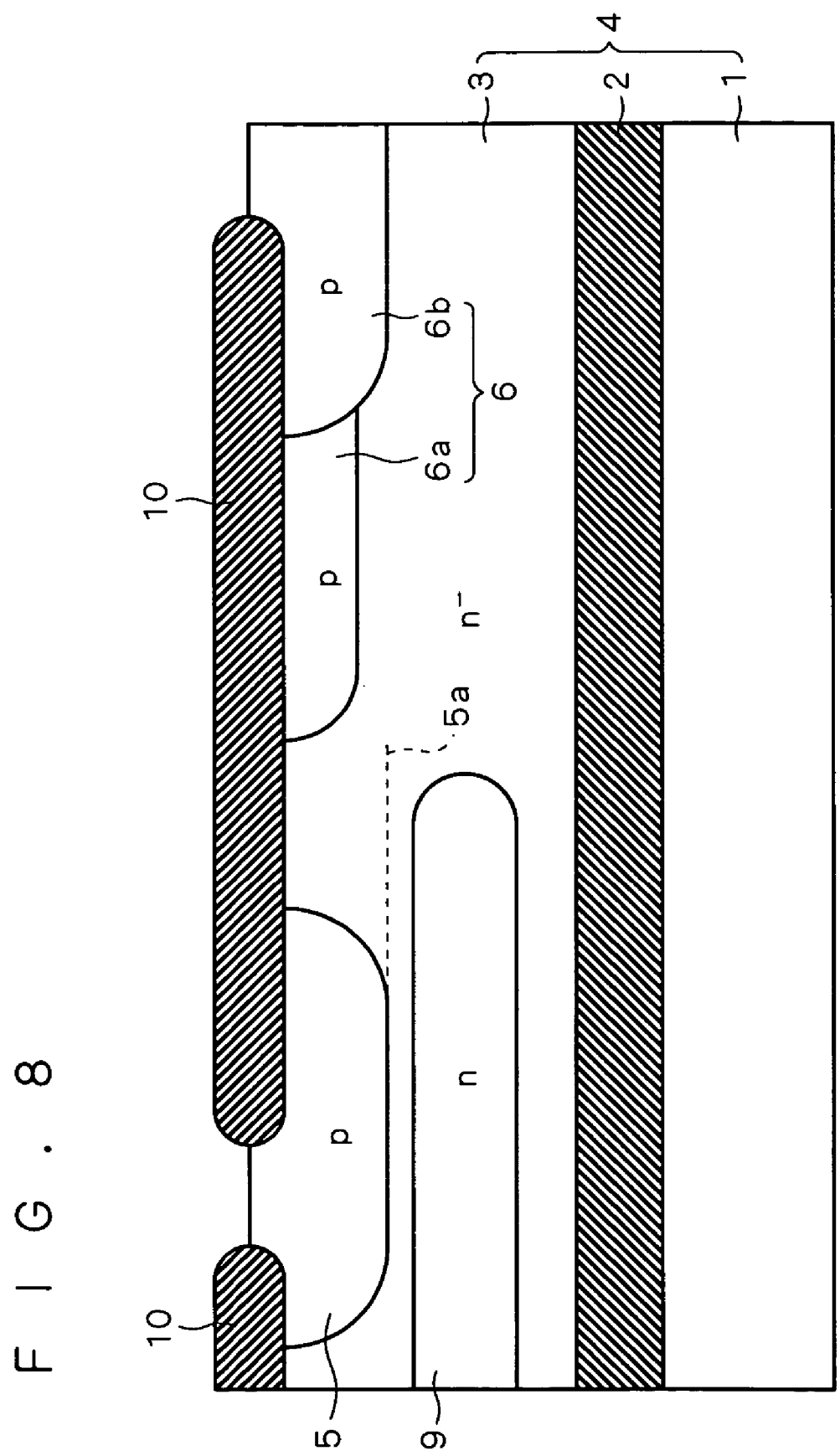

Next, as shown in FIG. 7, a resist 120 having a predetermined pattern with openings is formed on the field oxide film 10. After that, the resist 120 is used as a mask, and ions of a p type impurity 210, such as boron, are implanted in the exposed upper surface of the semiconductor layer 3, and then, the resist 120 that is used as a mask is removed. At this time, the implantation energy is set at, for example, approximately 300 keV, and the amount for implantation is set at approximately $2.0 \times 10^{12}$ ions/cm$^2$. As a result of this, a source region 5 and an impurity region 6b of a drain region 6 are selectively formed in the upper surface of the semiconductor layer 3. After that, heat treatment is carried out at, for example, 800° C. for approximately 30 minutes, and thereby, the source region 5 and the impurity region 6b are made to diffuse, and completed as shown in FIG. 8.

Figure 9:
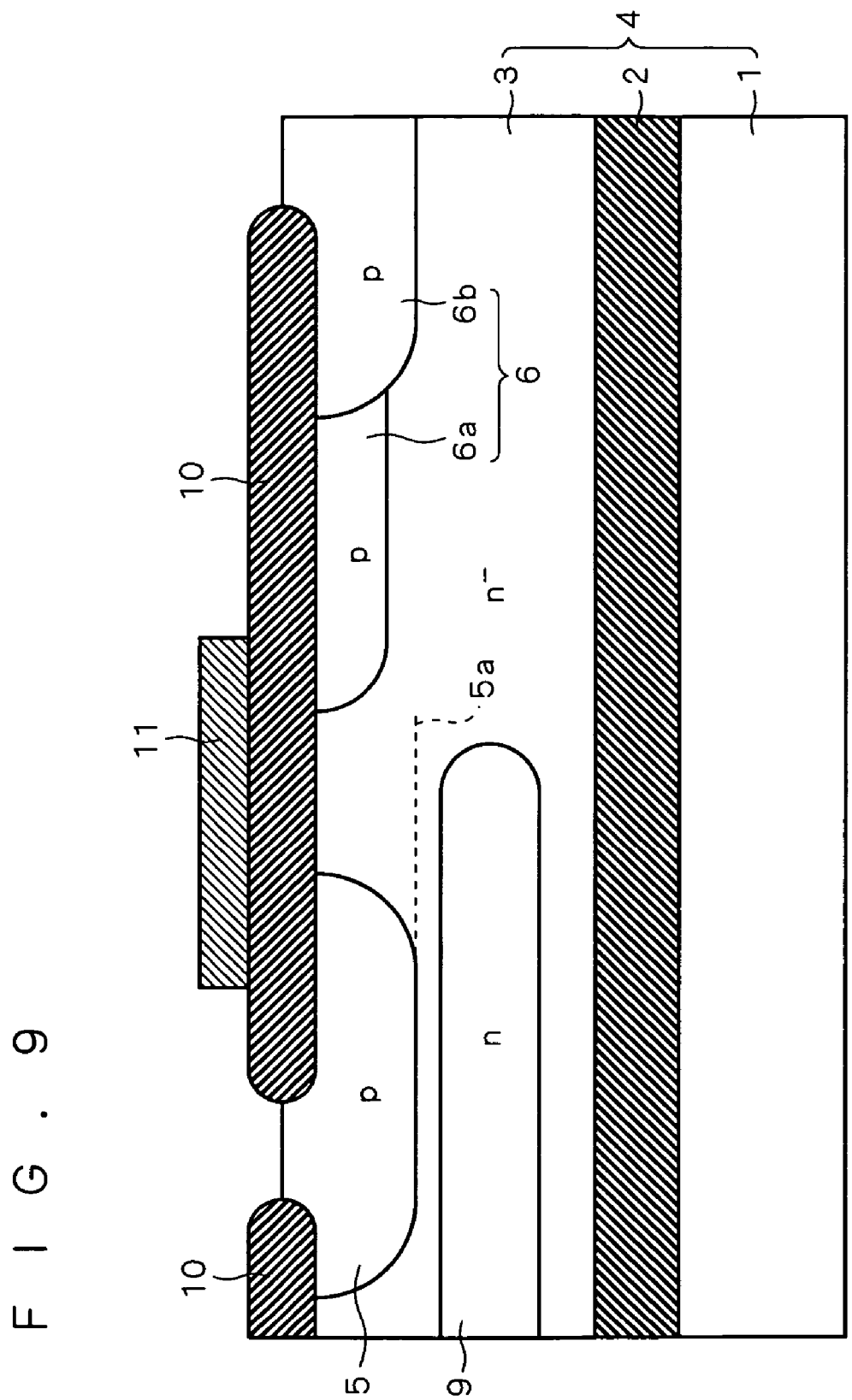

Next, as shown in FIG. 9, a gate electrode 11 of the MOS transistor 20 is selectively formed in a region of the field oxide film 10 which is located on the semiconductor layer 3 between the source region 5 and the drain region 6. After that, ions of a p type impurity, such as boron, are implanted in the upper surface of the semiconductor layer 3, and an impurity region 7 and an impurity region 8 are formed in the upper surface of the source region 5 and the upper surface of the impurity region 6b in the drain region 6, respectively. The energy for implantation at this time is set at, for example, approximately 50 keV, and the amount for implantation is set at, for example, approximately $1.0 \times 10^{14}$ ions/cm$^2$. After that, heat treatment is carried out at approximately 800° C., so as to make the impurity regions 7 and 8 diffuse, and then, an interlayer insulating film, a drain electrode, a source electrode, a metal wire and the like, not shown, are formed. As a result of this, the semiconductor device shown in FIG. 1 is completed.

As described above, in the semiconductor device according to the first embodiment, the impurity region 9, having an impurity concentration higher than that of the semiconductor layer 3, is formed over the entire bottom of the source region 5 at a portion directly below this source region 5, and is formed directly below the semiconductor layer 3 between the source region 5 and the drain region 6. Therefore, even in the case where the potential of the drain region 6 and the potential of the rear face of the SOI substrate 4 are set at the same potential, in order to stabilize the device properties, it becomes difficult for the depletion layer to extend to the source region 5, and it also becomes difficult for it to extend to the semiconductor layer 3 between the source region 5 and the drain region 6. Accordingly, the occurrence of punch-through between the source region 5 and the drain region 6 of the MOS transistor 20 can be prevented, making the withstand voltage between these increase.

Furthermore, according to the first embodiment, the concentration peak position 9a of the impurity region 9 is set so as to be below the lowest end 5a of the source region 5 at a portion directly below the upper surface of the semiconductor layer 3 between the source region 5 and the drain region 6, and therefore, the n type impurity concentration in the region where the channel layer of the MOS transistor 20 is formed can be prevented from increasing. Accordingly, the threshold voltage of the MOS transistor 20 can be prevented from increasing.

Figure 10:
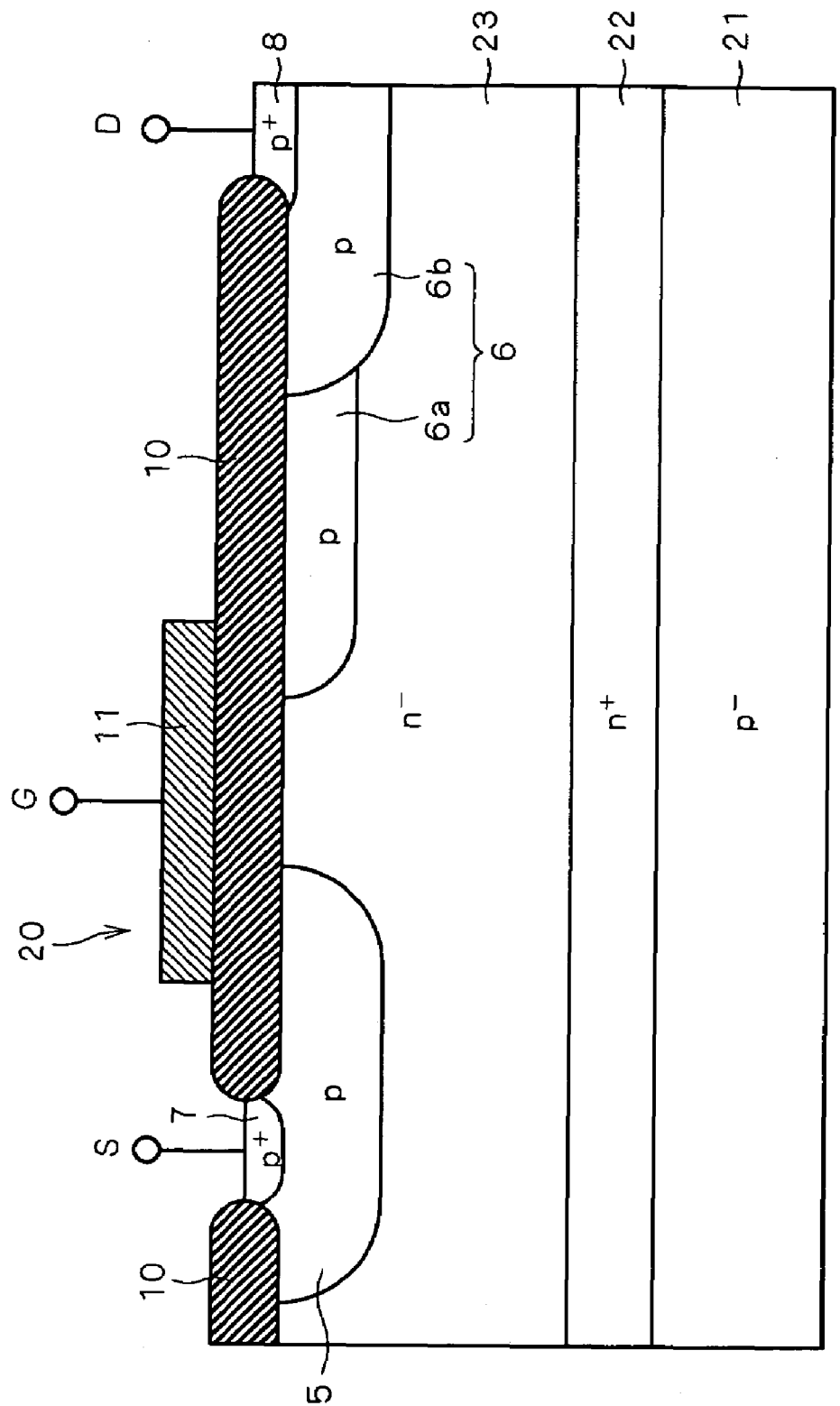
FIG. 10 is a sectional view showing a portion of the structure of a first comparative device.
Figure 11:
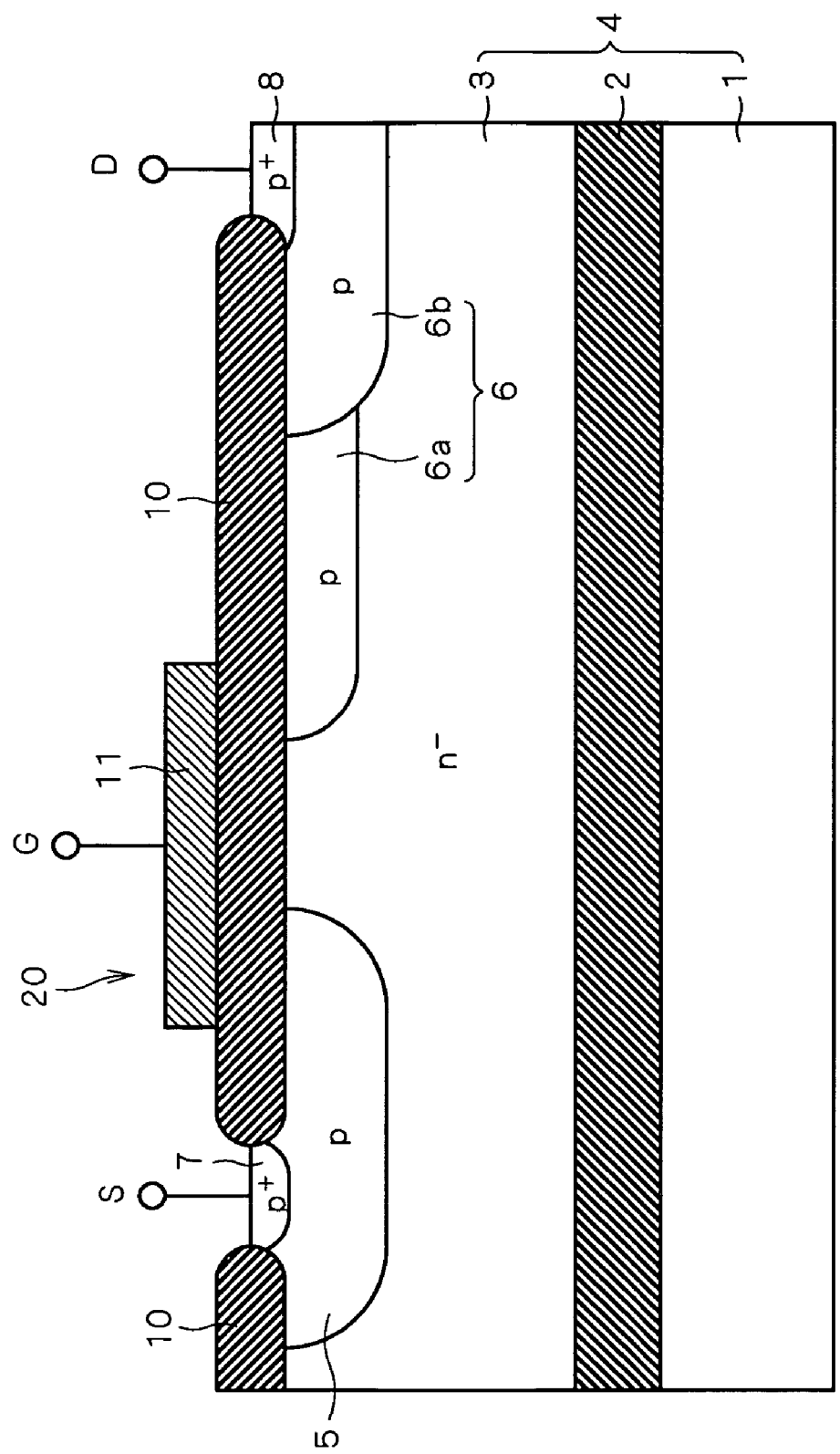
FIG. 11 is a sectional view showing a portion of the structure of a second comparative device.
Figure 12:
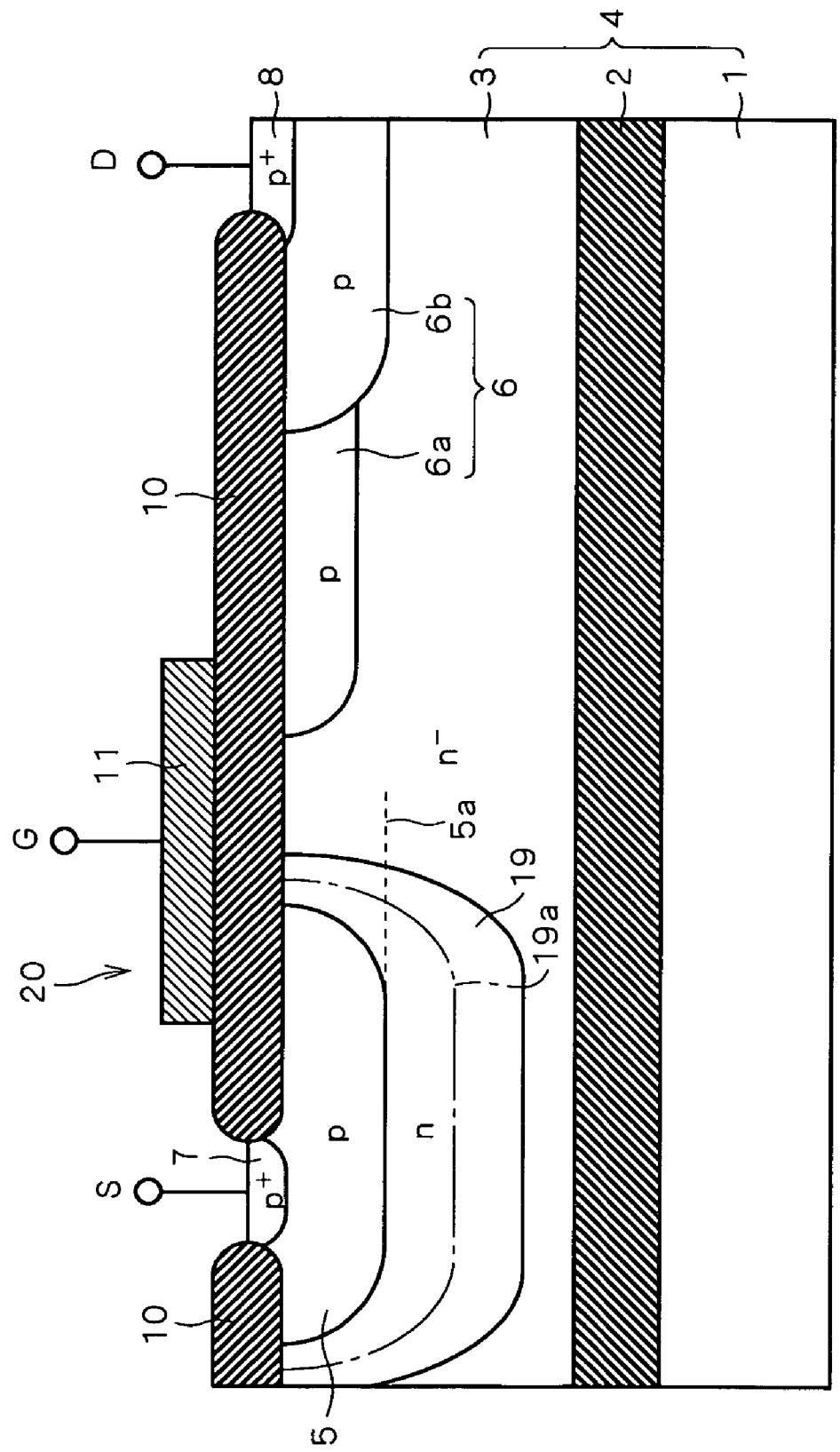
FIG. 12 is a sectional view showing a portion of the structure of a third comparative device.

Next, the electrical properties of the semiconductor device according to the first embodiment are described in detail, in comparison with the semiconductor devices shown in FIGS. 10 to 12. Here, the devices shown in FIGS. 10 to 12 are referred to as a first comparative device, a second comparative device and a third comparative device.

As shown in FIG. 10, the first comparative device is provided with a p$^-$ type semiconductor substrate 21 instead of the SOI substrate 4 in the semiconductor device according to the first embodiment, and no impurity region 9 is formed, and the MOS transistor 20 is formed in the semiconductor substrate 21. An n$^-$ type impurity region 23 is formed in the upper surface of the semiconductor substrate 21, and the source region 5 and the drain region 6 of the MOS transistor 20 are formed in the upper surface of this impurity region 23.

In addition, an n+ type buried impurity region 22 is formed at the bottom of the impurity region 23.

As shown in FIG. 11, in the second comparative device, no impurity region 9 is formed as in the semiconductor device according to the first embodiment.

As shown in FIG. 12, the third comparative device is further provided with an n type impurity region 19 having an impurity concentration higher than that of the semiconductor layer 3 in the second comparative device. The impurity region 19 is formed in the upper surface of the semiconductor layer 3, and the source region 5 is formed in the upper surface of the impurity region 19. In addition, the position 19a of the peak in the impurity concentration in the impurity region 19 is set so as to be above the lowest end 5a of the source region 5 directly below the upper surface of the semiconductor layer 3 between the source region 5 and the drain region 6. That is to say, the peak in the impurity concentration in the impurity region 19 exists between the source region 5 and the drain region 6.

Figure 13:
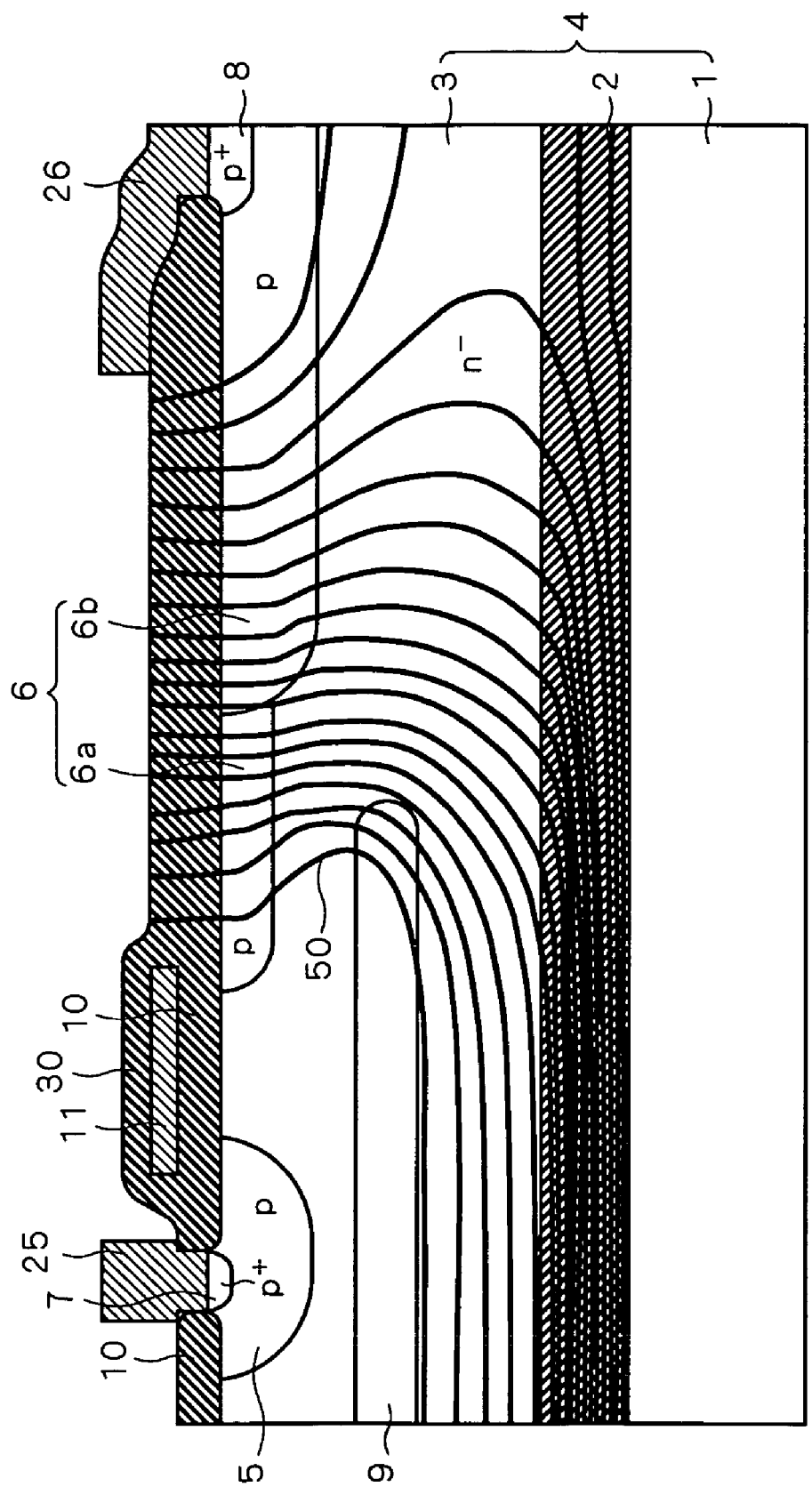
FIG. 13 shows the distribution in the potential in the semiconductor device according to the first embodiment of the present invention.
Figure 14:
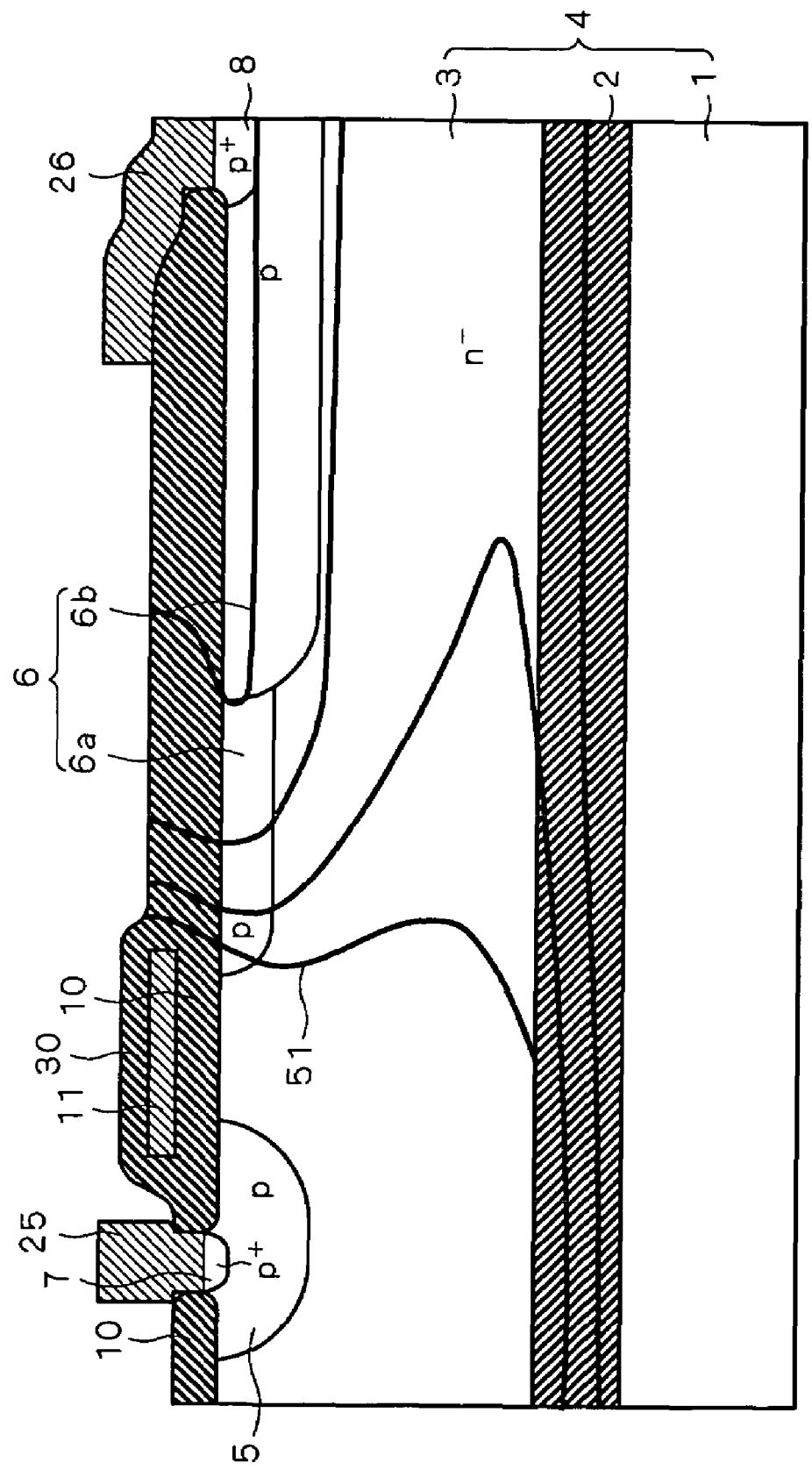
FIG. 14 shows the distribution in the potential in the second comparative device.

FIGS. 13 and 14 are sectional views showing the distribution in the potential in the semiconductor device according to the first embodiment and the second comparative device, respectively. FIGS. 13 and 14 show distribution in the potential when the ground potential and a negative potential are applied to the source region 5 and the drain region 6 of the MOS transistor 20, respectively, and furthermore, the potential of the drain region 6 and the potential of the rear face of the SOI substrate 4 are set at the same potential. Here, FIGS. 13 and 14 show a source electrode 25, a drain electrode 26 and an interlayer insulating film 30, which are not shown in FIGS. 1 and 11. In addition, FIGS. 13 and 14 show the devices shown in FIGS. 1 and 11, of which the ratio of the dimensions between the components have been changed.

As the equipotential line 50 in FIG. 13 shows, the electrical field is concentrated in the vicinity of the end of the drain region 6 on the source region 5 side in the semiconductor device according to the first embodiment. This is because the provision of the impurity region 9 prevents the depletion layer from extending, and thereby, the withstand voltage between the source and the drain of the MOS transistor 20 is sufficiently secured.

Meanwhile, in the second comparative device, as the equipotential line 51 in FIG. 14 shows, the electrical field is not concentrated very much in the vicinity of the end of the drain region 6 on the source region 5 side. This is because the field plate effect makes the semiconductor layer 3 between the source region 5 and the drain region 6 deplete, and the depletion layer reaches the source region 5, causing punch-through between the source region 5 and the drain region 6 of the MOS transistor 20.

As described above, it can be understood from the distribution in the potential show in FIGS. 13 and 14 that the withstand voltage between the source and the drain of the MOS transistor 20 has increased in the semiconductor device according to the first embodiment.

Figure 15:
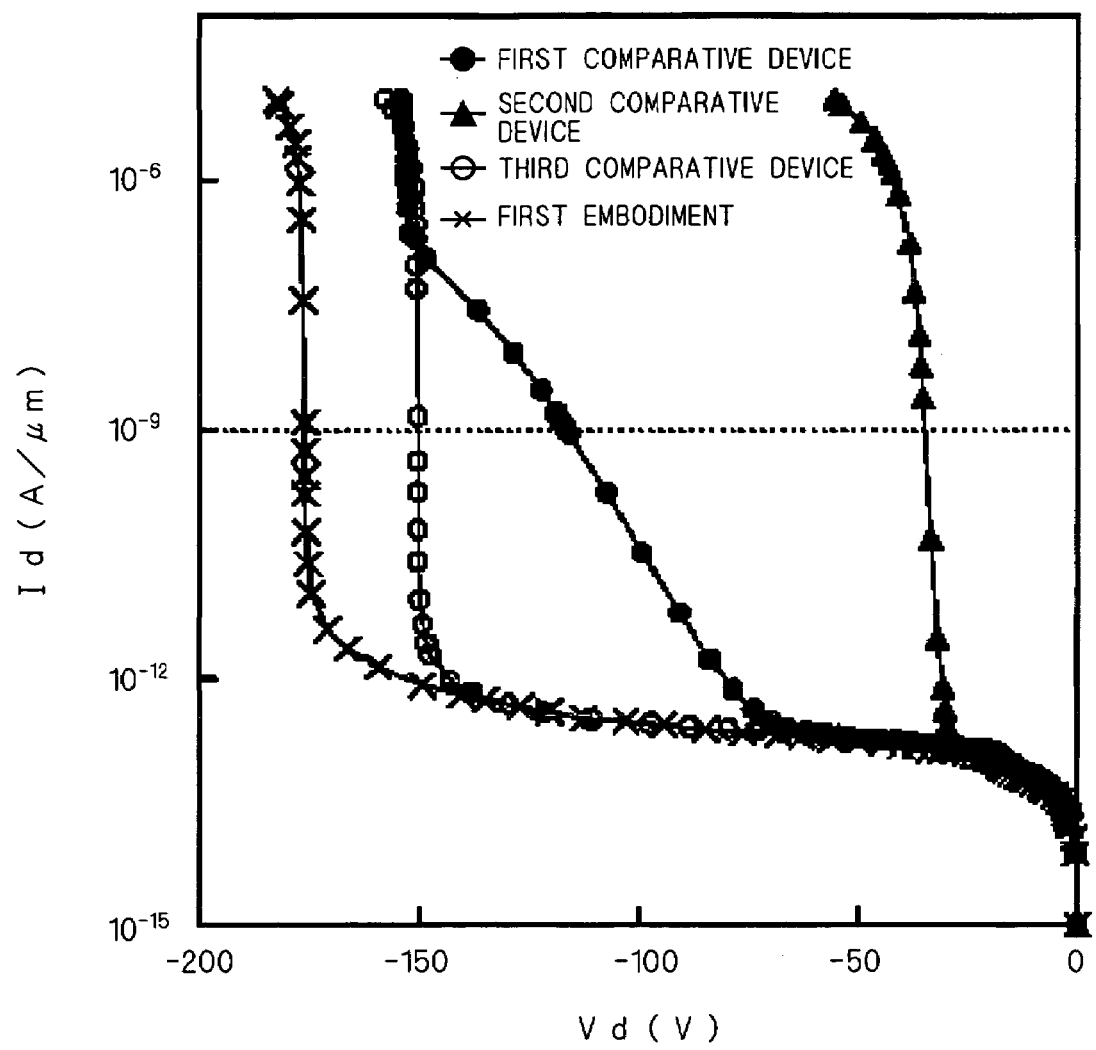
FIG. 15 is a graph showing the relationship between the drain potential and the drain current.
Figure 16:
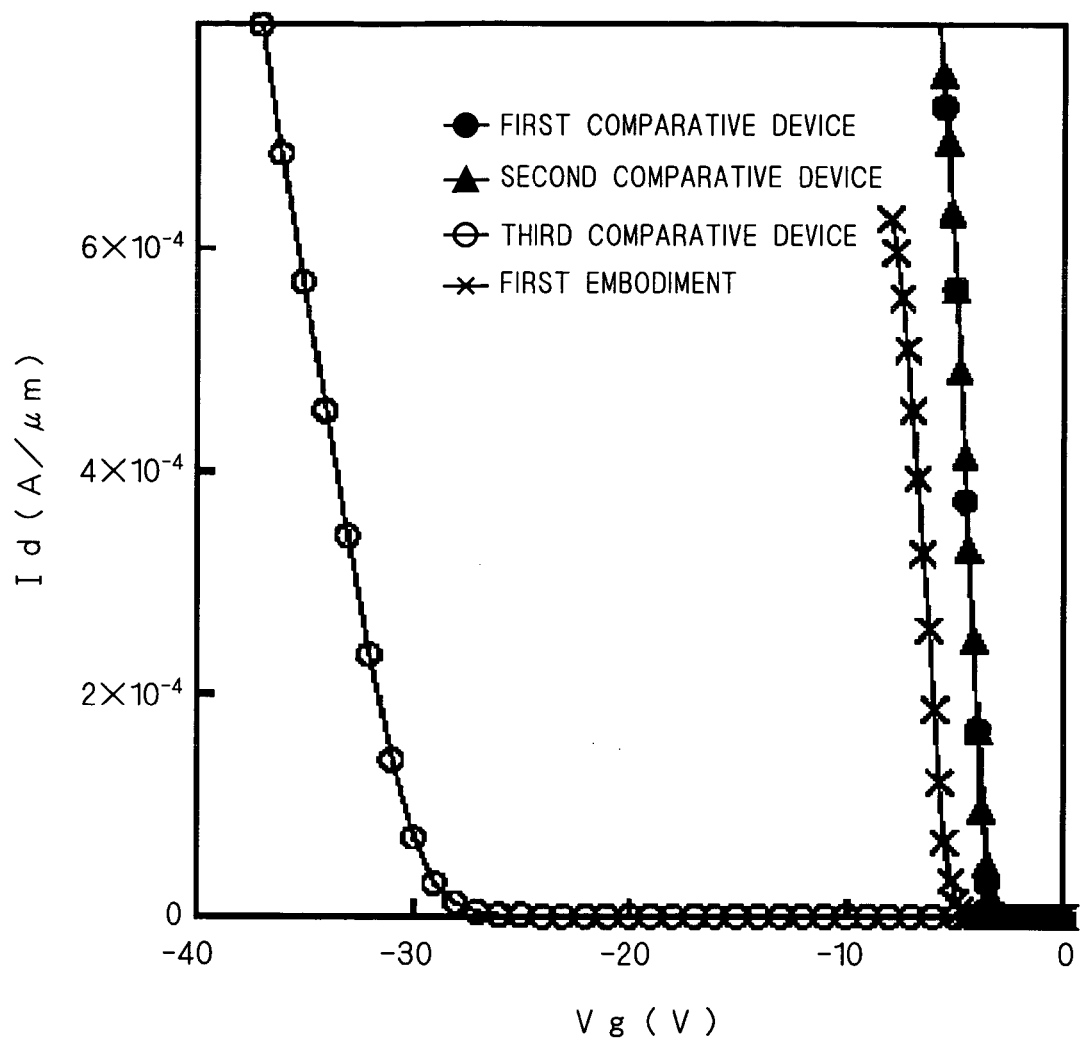
FIG. 16 is a graph showing the relationship between the gate potential and the drain current.

FIG. 15 is a graph showing the relationship between the drain potential Vd and the drain current Id in the MOS transistor 20, and FIG. 16 is a graph showing the relationship between the gate potential Vg and the drain current Id in the MOS transistor 20. Black circular marks in FIGS. 15 and 16 indicate data on the first comparative device, black triangular marks indicate data on the second comparative device, white circular marks indicate data on the third comparative device, and X marks indicate data on the semiconductor device according to the first embodiment.

As shown in FIG. 15, the withstand voltage between the source and the drain of the MOS transistor 20 is approximately 75 V in the first comparative device, approximately 25 V in the second comparative device, approximately 150 V in the third comparative device, and approximately 180 V in the semiconductor device according to the first embodiment. Accordingly, it can be understood from these experiment results that the withstand voltage between the source and the drain of the MOS transistor 20 has increased in the semiconductor device according to the first embodiment.

In addition, as shown in FIG. 16, in the third comparative device, the impurity region 19 is provided, and therefore, the n type impurity concentration in the region where the channel layer of the MOS transistor 20 is formed becomes high, and the threshold voltage of the MOS transistor 20 becomes approximately 30 V, whereas the threshold voltage of the semiconductor device according to the first embodiment is the same as those of the first and second devices which are objects for comparison, and is approximately 5 V.

As described above, in the semiconductor device according to the first embodiment, the withstand voltage between the source and the drain can be increased while preventing the threshold voltage of the MOS transistor 20 from increasing, and therefore, the semiconductor device is appropriate for circuits such as the scan drive IC of a PDP, where a high withstand voltage is required between sources and drains, and the threshold voltage of MOS transistors is required to have as low a value as possible.

Here, as shown in is required 17, it is desirable for the impurity region 9 not to be formed directly below the drain region 6. In other words, it is desirable for the impurity region 9 not to be formed so as to overlap the drain region 6 in a plan view.

Figure 18:
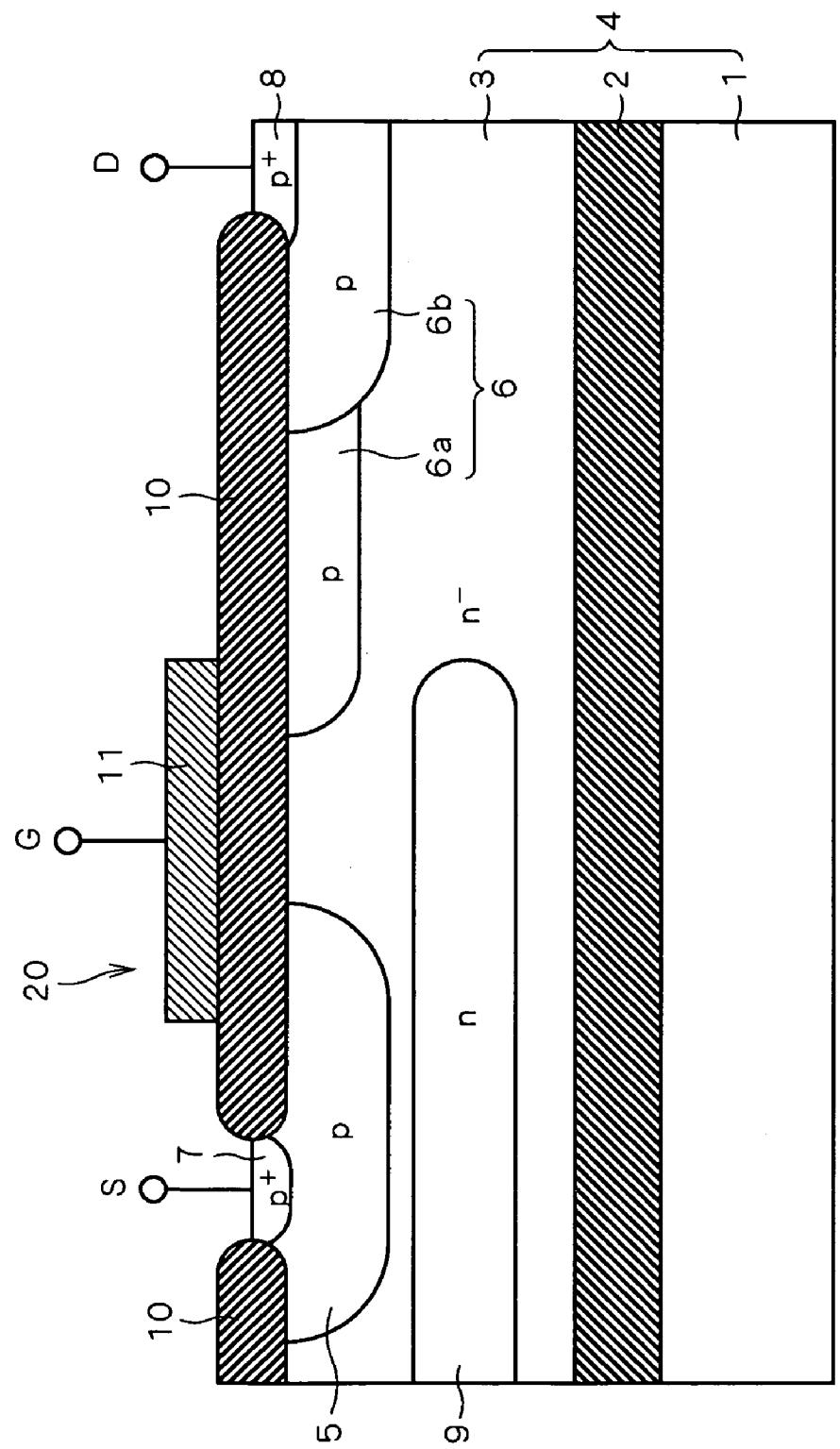

When a potential that is higher than that of the drain region 6 is applied to the source region 5, a potential that is higher than that of the drain region 6 is also applied to the impurity region 9. Therefore, opposite voltages are applied to the n type impurity region 9 and the p type drain region 6. Accordingly, as shown in FIG. 18, in the case where the impurity region 9 extends to a portion directly below the drain region 6, the distance between the impurity region 9 and the drain region 6 becomes relatively small, making the withstand voltage between the impurity region 9 and the drain region 6 lower, and as a result, there is a possibility that the withstand voltage between the source and the drain of the MOS transistor 20 will be lowered.

Figure 17:
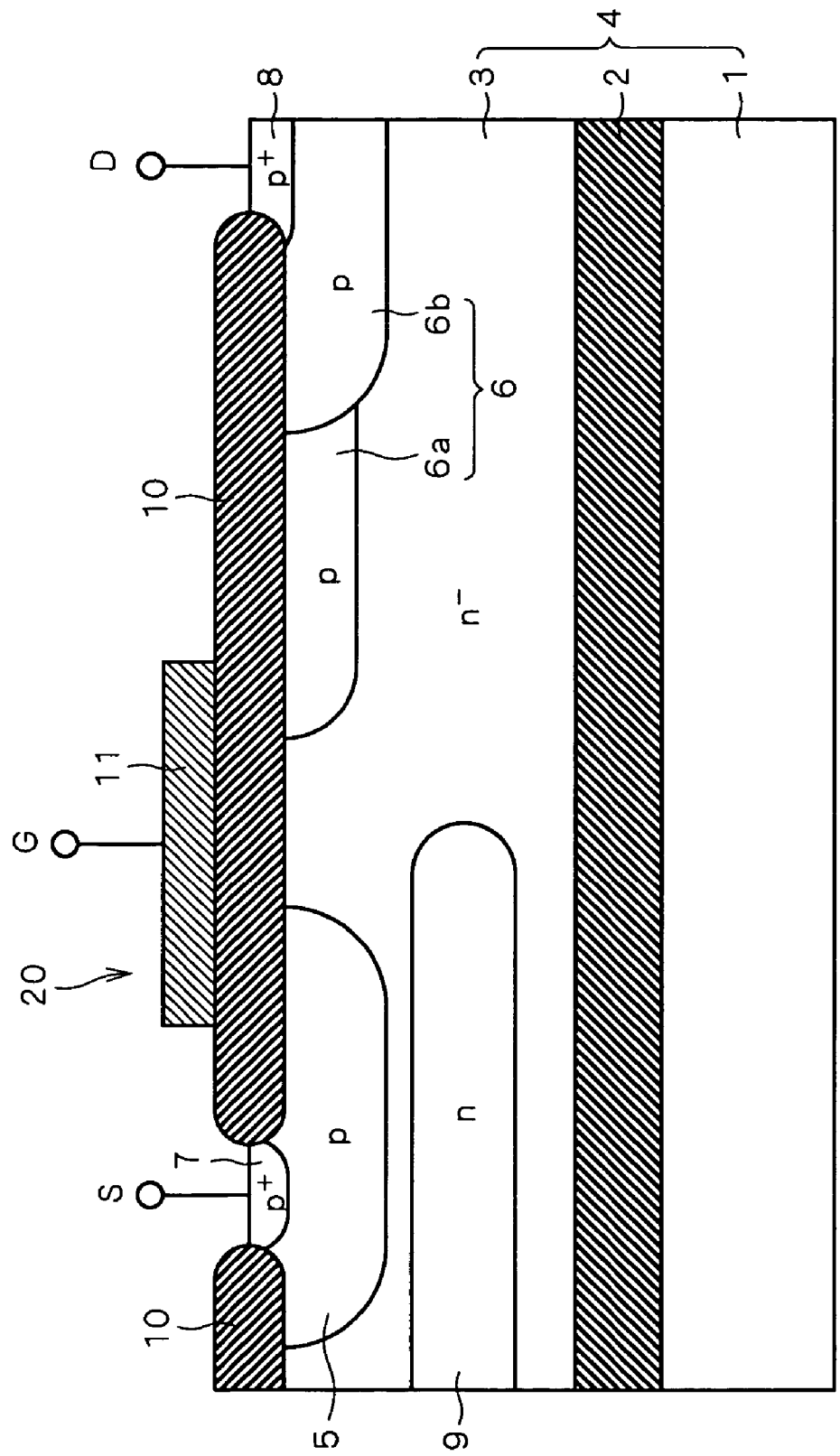
FIGS. 17 and 18 are sectional views showing a portion of the structure of the semiconductor device according to the first embodiment of the present invention.

As shown in FIG. 17, in the case where the impurity region 9 is not formed directly below the drain region 6, the distance between the impurity region 9 and the drain region 6 can be sufficiently secured, and the withstand voltage between the impurity region 9 and the drain region 6 can be prevented from lowering without fail. Accordingly, the withstand voltage between the source and the drain of the MOS transistor 20 can also be prevented from lowering without fail.

In addition, though in the semiconductor device according to the first embodiment, the impurity region 9 is located below the lowest end 5a of the source region 5 at a distance from this source region 5, this is not necessary. Even in the case where the impurity region 9 is located higher than that of FIG. 1 and the bottom of the source region 5 is surrounded by the impurity region 9 in such a manner that the impurity region 9 exists also in the semiconductor layer 3 between the source region 5 and the drain region 6, for example, the threshold voltage of the MOS transistor 20 can be prevented from increasing as compared with the third comparative device, when the concentration peak position 9a of the impurity region 9 is set so as to be below the lowest end 5a of the source region 5 directly below the upper surface of the semiconductor layer 3 between the source region 5 and the drain region 6. Here, in the case where the impurity region 9 is formed below the lowest end 5a of the source region 5 so as to be at a distance from this source region 5, like in the first embodiment, the n type impurity concentration between the source region 5 and the drain region 6 can further be prevented from increasing, and therefore, the threshold voltage of the MOS transistor 20 can further be prevented from increasing.

Second Embodiment

Figure 19:
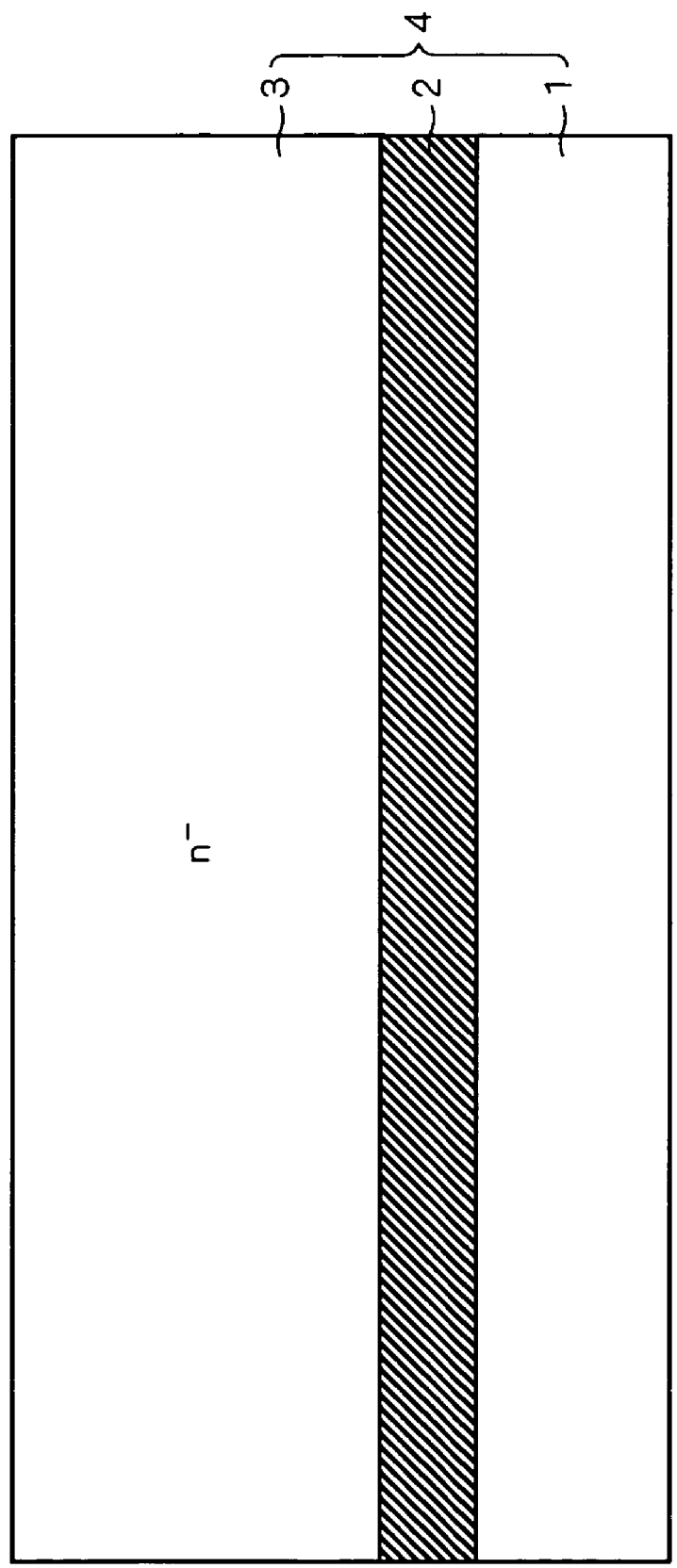
FIGS. 19 to 21 are sectional views showing the steps in a manufacturing method of a semiconductor device according to the second embodiment of the present invention in chronological order.
Figure 20:
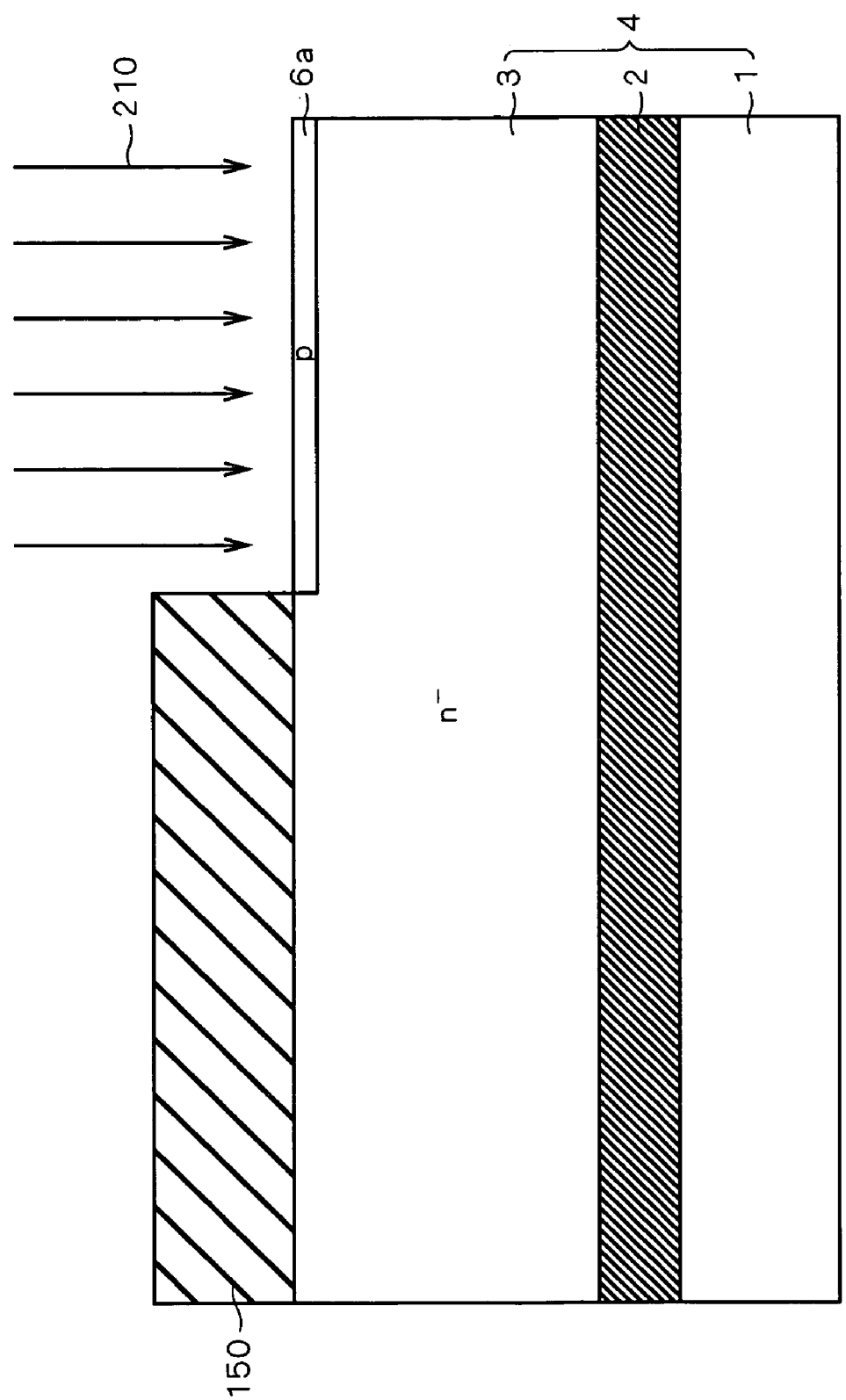
Figure 21:
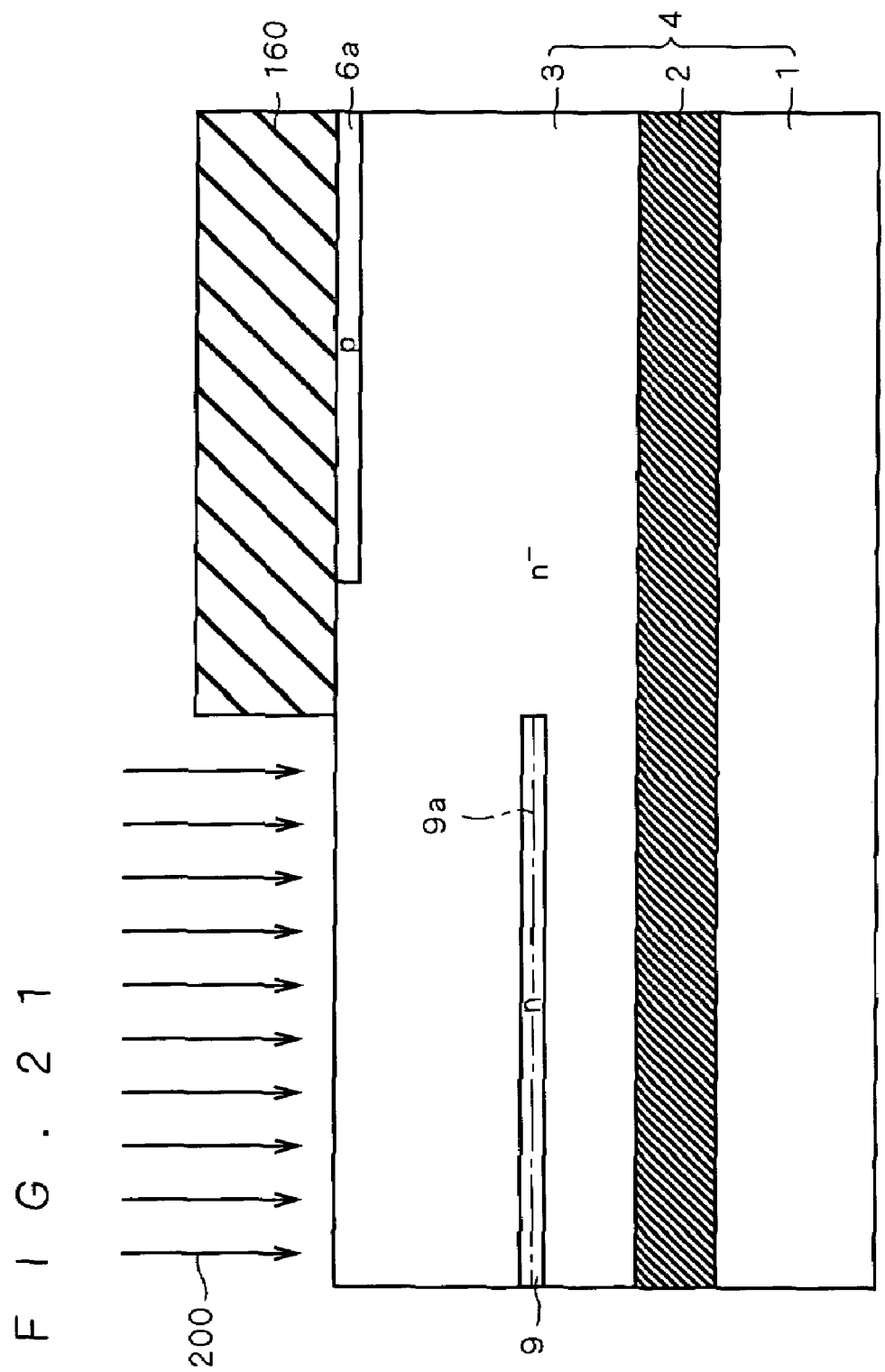

FIGS. 19 to 21 are sectional views showing the steps in a manufacturing method of a semiconductor device according to the second embodiment in chronological order. In accordance with the manufacturing method of a semiconductor device according to the second embodiment, the semiconductor device shown in FIG. 1 is manufactured in accordance with a method which is different from the manufacturing method according to the first embodiment.

As shown in FIG. 19, first, an SOI substrate 4 is formed. Here, the thickness of the semiconductor layer 3 of the SOI substrate 4 is different from that of the first embodiment, and is set so as to be the same as the thickness of the semiconductor layer 3 after completion at, for example, 5 μm. In addition, the impurity concentration of the semiconductor layer 3 is set at, for example, $2 \times 10^{15}$ ions/cm$^3$, in the same manner as in the first embodiment.

Next, as shown in FIG. 20, a resist 150 having a predetermined pattern with an opening is formed on the semiconductor layer 3. After that, the resist 150 is used as a mask, and ions of a p type impurity 210, such as boron, are implanted in the exposed upper surface of the semiconductor layer 3, and then, the resist 150 that is used as a mask is removed. At this time, the energy for implantation is set at, for example, approximately 100 keV, and the amount for implantation is set at approximately $3.0 \times 10^{12}$ ions/cm$^2$. As a result of this, an offset region 6a is selectively formed in the upper surface of the semiconductor layer 3. Here, this offset region 6a is made to diffuse in the subsequent step of heat treatment, in the same manner as in the first embodiment.

Next, as shown in FIG. 21, a resist 160 having a predetermined pattern with an opening is formed on the semiconductor layer 3. After that, the resist 160 is used as a mask, and ions of an n type impurity 200, such as phosphorous, are implanted in the exposed upper surface of the semiconductor layer 3, and then, the resist 160 that is used as a mask is removed. At this time, the energy for implantation is set at, for example, approximately several MeV, and the amount for implantation is set at $5.0 \times 10^{12}$ ions/cm$^2$. As a result of this, the impurity region 9 is formed and buried inside the semiconductor layer 3 so as not to be exposed from the semiconductor layer 3. In addition, the depth of the diffusion of the source region 5 that is formed in the subsequent step, as well as the amount of diffusion of the impurity region 9, are taken into consideration, and thus, the concentration peak position 9a of the impurity region 9 is set at a point at a depth of no less than 0.5 μm from the upper surface of the semiconductor layer 3.

Next, in the same manner as in the first embodiment, the upper surface of the semiconductor layer 3 is selectively thermally oxidized, and a field oxide film 10 is formed on the upper surface of the semiconductor layer 3. As a result of this, the offset region 6a and the impurity region 9 diffuse, and the structure shown in FIG. 6 is obtained.

Next, in the same manner as in the first embodiment, a source region 5 and a drain region 6 are formed (see FIGS. 7 and 8), and in addition, a gate electrode 11 is formed (see FIG. 8). Then, impurity regions 7 and 8, an interlayer insulating film and a drain electrode are formed, and thereby, the semiconductor device shown in FIG. 1 is completed.

Here, in the second embodiment, the impurity region 9 is formed after the formation of the offset region 6a, and conversely, the offset region 6a may be formed after the formation of the impurity region 9.

As described above, in accordance with the manufacturing method of a semiconductor device according to the second embodiment, the impurity region 9 is formed and buried inside the semiconductor layer 3 so as not to be exposed from this semiconductor layer 3, by introducing an n type impurity into the semiconductor layer 3 from the upper surface thereof. Therefore, the manufacturing method can be simplified and the cost for processing reduced, in comparison with a case as in the first embodiment, where the impurity region 9 is formed in the upper surface of a first portion of the semiconductor layer 3 (see FIG. 3), and then, a second portion of the semiconductor layer 3 is formed on this first portion of the semiconductor layer 3 (see FIG. 4), so that the impurity region 9 is buried inside the semiconductor layer 3.

Third Embodiment

Figure 22:
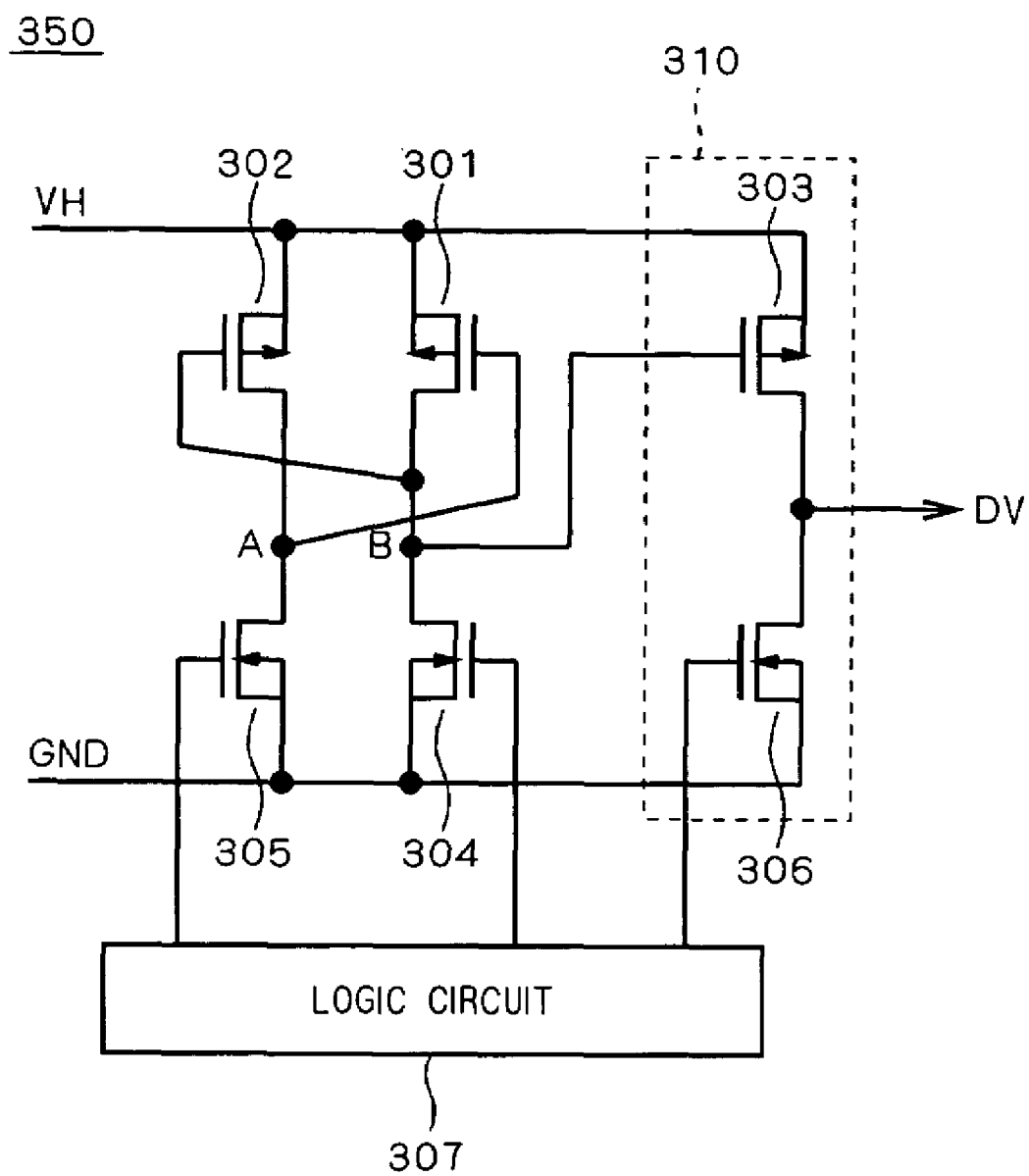
FIG. 22 shows the configuration of a driver circuit according to the third embodiment of the present invention.

FIG. 22 shows the configuration of a driver circuit 350 which uses the semiconductor device according to the first embodiment. The driver circuit 350 according to the third embodiment outputs a driving voltage DV to a display panel, such as a PDP, not shown, so as to drive this display panel.

As shown in FIG. 22, the driver circuit 350 is provided with p channel type MOS transistors 301 to 303, n channel type MOS transistors 304 to 306, and a logic circuit 307. The driver circuit 350 is provided with a number of structures which are the same as the structure shown in FIG. 1. A number of MOS transistors 20 in this structures are respectively used as MOS transistors 301 to 303. That is to say, each of the MOS transistors 301 to 303 is formed on a semiconductor layer 3 of an SOI substrate 4 as that described above and provided with a source region 5 and a drain region 6 as those described above. In addition, impurity regions 9 as those described above are formed in the semiconductor layer 3, where the MOS transistors 301 to 303 are formed, so as to correspond to the MOS transistors 301 to 303, respectively. Accordingly, in each of the MOS transistors 301 to 303, the threshold voltage is low in spite of having a structure which increases the gate withstand voltage, and the occurrence of punch-through between the source region 5 and the drain region 6 is prevented.

Meanwhile, each of the n channel type MOS transistors 304 to 306 is a DMOS (Double Diffused MOS) transistor, and is formed in the semiconductor layer 3 of the SOI substrate 4, together with, for example, the MOS transistors 301 to 303.

A high voltage VH of no lower than 60 V is applied to the source terminal of each of the MOS transistors 301 to 303, and a ground voltage GND which is lower than the high voltage VH is applied to the source terminal of each of the MOS transistors 304 to 306. The drain terminal of the MOS transistor 301, the gate terminals of the MOS transistors 302 and 303, and the drain terminal of the MOS transistor 304 are connected to each other, and the gate terminal of the MOS transistor 301, the drain terminal of the MOS transistor 302, and the drain terminal of the MOS transistor 305 are connected to each other. In addition, the drain terminal of the MOS transistor 303 and the drain terminal of the MOS transistor 306 are connected to each other. Thus, the logic circuit 307 outputs a control voltage to each of the gate terminals of the MOS transistors 304 to 306, so as to individually control the ON/OFF of the respective MOS transistors 304 to 306.

In the driver circuit 350 having the configuration, an output stage 310 is formed of the MOS transistors 303 and 306, which are connected in a totem pole manner between the high voltage VH and the ground voltage GND, and the voltage of the drain terminals of the MOS transistors 303 and 306 in this output stage 310 is outputted to a display panel as a driving voltage DV, so that this display panel is driven by the driving voltage DV. In the following, the operation of this driver circuit 350 is described in detail.

When low level, high level and high level signals are inputted into the gate terminals of the MOS transistors 304 to 306 from the logic circuit 307, respectively, the MOS transistors 304 to 306 become of the OFF state, the ON state and the ON state, respectively. Then, the voltage A of the drain terminals of the MOS transistors 302 and 305 becomes the ground voltage GND, making the MOS transistor 301 of the ON state. As a result, the voltage B of the drain terminals of the MOS transistors 301 and 304 becomes the high voltage VH, making the MOS transistor 302 of the OFF state. When the voltage B becomes the high voltage VH, the MOS transistor 303 on the high voltage side of the output stage 310 becomes of the OFF state. Accordingly, the voltage of the drain terminals of the MOS transistors 303 and 306 becomes the ground voltage GND, and a driving voltage DV of 0 V is applied, for example, to an address electrode or a continuous discharge electrode in a PDP.

Meanwhile, when high level, low level and low level signals are inputted into the gate terminals of the MOS transistors 304 to 306, from the logic circuit 307, respectively, the MOS transistors 304 to 306 become of the ON state, the OFF state and the OFF state, respectively. Thus, the voltage B of the drain terminals of the MOS transistors 301 dial number 304 becomes the ground voltage GND, making the MOS transistor 302 of the ON state. As a result, the voltage A of the drain terminals of the MOS transistors 302 and 305 becomes the high voltage VH, making the MOS transistor 301 of the OFF state. When the voltage B becomes the ground voltage GND, the MOS transistor 303 on the high voltage side of the output stage 310 becomes of the ON state. Accordingly, the voltage of the drain terminals of the MOS transistors 303 and 306 becomes the high voltage VH, and the driving voltage DV of no less than 60 V is applied to, for example, an address electrode or a continuous discharge electrode in a PDP.

As described above, in the driver circuit 350 according to the third embodiment, a MOS transistor 20 having a high gate withstand voltage and a low threshold voltage is used as the MOS transistor 303 on the high voltage side of the output stage 310.

Meanwhile, in the case where a DMOS transistor of which the gate withstand voltage is generally not very high is used as the MOS transistor 303 on the high voltage side of the output stage 310, unlike in the third embodiment, the high voltage VH of no less than 60 V that is outputted from a circuit in the stage before the output stage 310 generally cannot be directly applied to the gate terminal of the MOS transistor 303. Accordingly, in this case, it is necessary to insert a clamp diode between the gate terminal and the drain terminal of the MOS transistor 303, making the circuit configuration complicated.

In addition, in the case where the driver circuit 350 has the structure shown in FIG. 12 and a MOS transistor 20 as that shown in FIG. 12 is used as the MOS transistor 303, unlike in the third embodiment, it is difficult to increase the output current of the MOS transistor 303, due to the high threshold voltage thereof, though the withstand voltage of the MOS transistor increases. Accordingly, the MOS transistor 20 shown in FIG. 12 is not appropriate as the MOS transistor 303 of the output stage 310 for outputting a high voltage VH to a display panel.

In the third embodiment, as described above, a MOS transistor 20 having a high gate withstand voltage and a low threshold voltage is used as the MOS transistor 303 on the high voltage side of the output stage 310, and therefore, a high gate voltage can be supplied to the MOS transistor 303, and the output current from the MOS transistor 303 can be increased. Accordingly, even in the case where a gate voltage of a high voltage VH is outputted from the circuit in the stage before the output stage 310, like in the third embodiment, this gate voltage can be directly supplied to the gate terminal of the MOS transistor 303, and thus, the circuit configuration of the driver circuit 350 can be simplified, and the speed of operation of the MOS transistor 303 can be increased.

Fourth Embodiment

Figure 23:
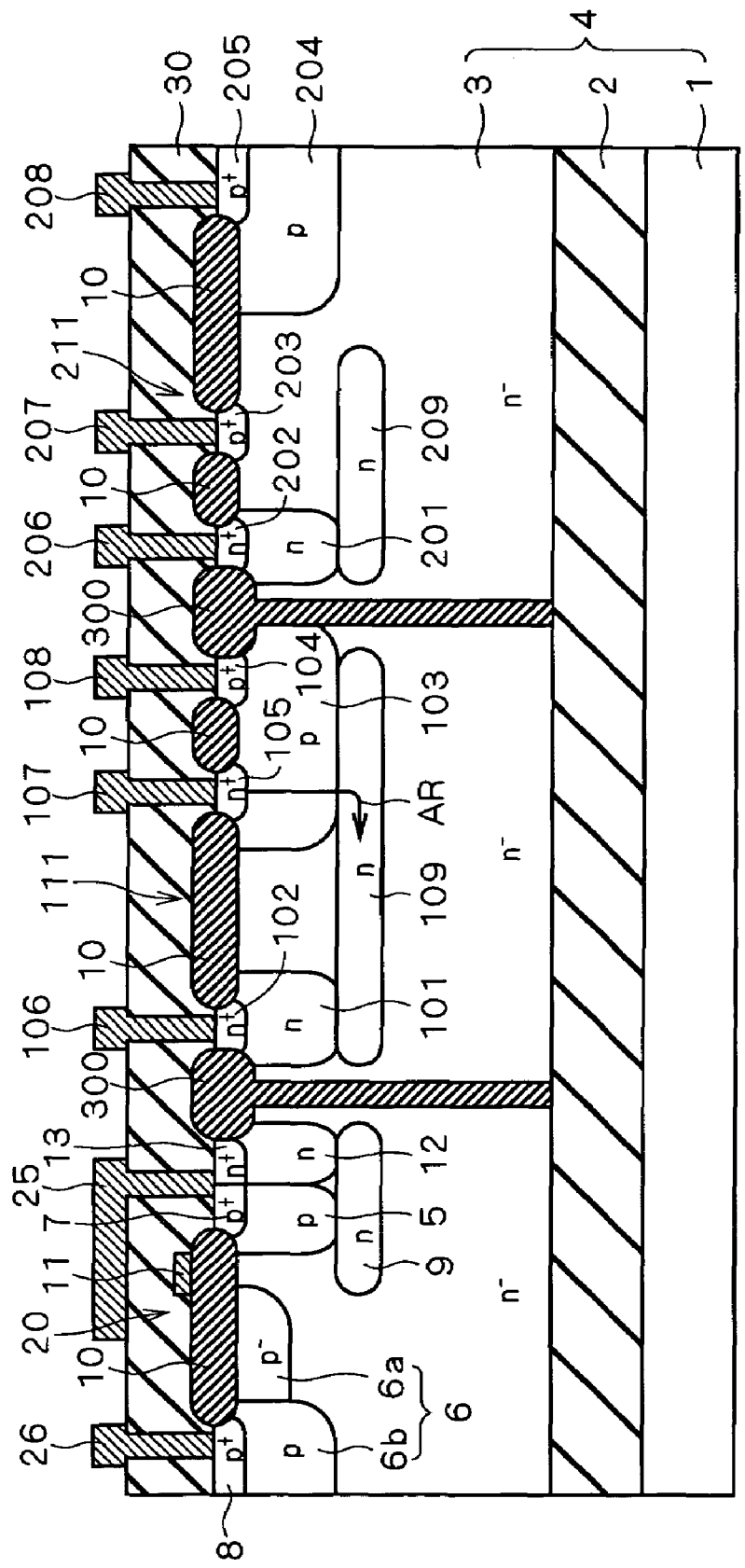
FIG. 23 is a sectional view showing the structure of a semiconductor device according to the fourth embodiment of the present invention.

FIG. 23 is a sectional view showing the structure of a semiconductor device according to the fourth embodiment of the present invention. As shown in FIG. 23, the semiconductor device according to the fourth embodiment is provided with an SOI substrate 4, as described above. A p channel type MOS transistor 20 as that described above, an NPN transistor 111 and a PNP transistor 211 are formed in the semiconductor layer 3 of the SOI substrate 4. An element isolation insulating film 300 is formed in the semiconductor layer 3 in such a manner as to penetrate this semiconductor layer 3, and this element isolation insulating film 300 electrically isolates the region where the MOS transistor 20 is formed, the region where the NPN transistor 111 is formed, and the region where the PNP transistor 211 is formed from each other in the semiconductor layer 3. The element isolation insulating film 300 is made of, for example, a silicon oxide film.

In the same manner as in the first embodiment, in the MOS transistor 20, a p$^+$ type impurity region 7 is formed in the upper surface of a source region 5, and a p$^+$ type impurity region 8 is formed in the upper surface of an impurity region 6b in a drain region 6. The offset region 6a in the drain region 6 according to the fourth embodiment is a p$^-$ type impurity region. An n type impurity region 12 is formed adjacent to the source region 5 in the upper surface of the semiconductor layer 3, and an n$^+$ type impurity region 13 is formed in the upper surface of this impurity region 12. An impurity region 9 as that described above is formed in the region where the MOS transistor 20 is formed in the semiconductor layer 3. The impurity region 9 according to the fourth embodiment is formed over the entire bottoms of the source region 5 and the impurity region 12, so as to make contact with these bottoms directly below the source region 5 and the impurity region 12. Furthermore, the impurity region 9 according to the fourth embodiment extends to a portion directly below the semiconductor layer 3 between the source region 5 and the drain region 6, and exists directly below the channel region of the MOS transistor 20 which is formed between the source region 5 and the drain region 6. In addition, in the same manner as in the first embodiment, the position of the peak in the impurity concentration in the impurity region 9 is set so as to be below the lowest end of the source region 5 directly below the upper surface of the semiconductor layer 3 between the source region 5 and the drain region 6.

The NPN transistor 111 is provided with an n type impurity region 101 which is electrically connected to a collector electrode 106, a p type base region 103 and an n$^+$ type emitter region 105. The impurity region 101 and the base region 103 are formed in the upper surface of the semiconductor layer 3 so as to be at a distance from each other, and the emitter region 105 is formed in the upper surface of the base region 103. An n$^+$ type impurity region 102 is formed in the upper surface of the impurity region 101, and a p$^+$ type impurity region 104 is formed in the upper surface of the base region 103 so as to be at a distance from the emitter region 105. In the semiconductor layer 3, an n type impurity region 109 having an impurity concentration higher than that of the semiconductor layer 3 is formed in the region where the NPN transistor 111 is formed. The impurity region 109 extends from a portion directly below the impurity region 101 to a portion directly below the base region 103 so as to reach a point directly below the impurity region 104 while making contact with the bottom of the impurity region 101 and the base region 103. Accordingly, the impurity region 109 exists directly below the emitter region 105.

The PNP transistor 211 is provided with an n type impurity region 201 which is electrically connected to a base electrode 206, a p$^+$ type emitter region 203 and a p type collector region 204. the impurity region 201 and the collector region 204 are formed in the upper surface of the semiconductor layer 3 so as to be at a distance from each other, and the emitter region 203 is formed in the upper surface of the semiconductor layer 3 between the impurity region 201 and the collector region 204 so as to be at a distance from these. An n$^+$ type impurity region 202 is formed in the upper surface of the impurity region 201, and a p$^+$ type impurity region 205 is formed in the upper surface of the collector region 204. In the semiconductor layer 3, an n type impurity region 209 having an impurity concentration higher than that of the semiconductor layer 3 is formed in the region where the PNP transistor 211 is formed. The impurity region 209 extends from a portion directly below the impurity region 201 to a portion directly below the emitter region 203 while making contact with the bottom of the impurity region 201, and in addition, extends to a portion directly below the semiconductor layer 3 between the emitter region 203 and the collector region 204.

A field oxide film 10 as that described above is formed on the upper surface of the semiconductor layer 3 excluding the upper surfaces of the impurity regions 7, 8, 13, 102, 104, 202 and 205, as well as the upper surfaces of the emitter regions 105 and 203, and the portion thereof which is formed on the semiconductor layer 3 between the source region 5 and the drain region 6 functions as the gate insulating film of the MOS transistor 20. In addition, a gate electrode 11 as that described above of the MOS transistor 20 is formed on the field oxide film 10 that functions as the gate insulating film so as to cover the end of the source region 5 on the drain region 6 side and the end of the offset region 6*a* on the source region 5 side, as viewed from the top.

An interlayer insulating film 30 is formed on the upper surface of the semiconductor layer 3 so as to cover the field oxide film 10 and the element isolation insulating film 300. The interlayer insulating film 30 is made of, for example, a silicon oxide film. A drain electrode 26 which reaches the impurity region 8, and a source electrode 25 which reaches both the impurity regions 7 and 13 are formed in the interlayer insulating film 30. In addition, a collector electrode 106 which reaches the impurity region 102, an emitter electrode 107 which reaches the emitter region 105 and a base electrode 108 which reaches the impurity region 104 are formed in the interlayer insulating film 30. In addition, a base electrode 206 which reaches the impurity region 202, an emitter electrode 207 which reaches the emitter region 203, and a collector electrode 208 which reaches the impurity region 205 are formed in the interlayer insulating film 30. Thus, the source electrode 25, the drain electrode 26, the collector electrodes 106 and 208, the emitter electrodes 107 and 207, and the base electrodes 108 and 206 respectively penetrate the interlayer insulating film 30, and are also provided on the upper surface of this interlayer insulating film 30.

In the semiconductor device according to the fourth embodiment which has the structure, in the same manner as in the first embodiment, a predetermined voltage is applied across the source electrode 25 and the drain electrode 26 in the MOS transistor 20, and thereby, a voltage is applied across the source region 5 and the drain region 6, so that a high potential is provided to the source region 5, and a negative gate potential is applied to the gate electrode 11. As a result of this, a channel layer is formed in the semiconductor layer 3 between the source region 5 and the drain region 6, making the MOS transistor 20 of the ON state, and thus, a current flows between the source region 5 and the drain region 6, so that the MOS transistor 20 functions as a semiconductor switch.

In addition, the region where the NPN transistor 111 is formed in the semiconductor layer 3, as well as the impurity regions 101 and 109, function as the collector region of the NPN transistor 111. A voltage is applied across the collector electrode 106 and the emitter electrode 107, so that a high potential is provided to the collector electrode 106, and a positive gate potential is applied to the base electrode 108. As a result, a voltage is applied across the collector region and the emitter region 105, so that a high potential is provided to this collector region, and a positive base potential is applied to the base region 103. Accordingly, as shown by arrow AR in FIG. 23, electrons move directly downward from the emitter region 105, pass through the base region 103 so as to reach a portion directly below this base region 103, and after that, move toward the impurity region 101, and after passing through this region, reach the collector electrode 106. As a result of this, a current flows between the emitter region 105 and the collector region that is formed of the impurity region 101, the semiconductor layer 3 and the impurity region 109, so that the NPN transistor 111 functions as a semiconductor switch. In the fourth embodiment, an impurity region 109 having an impurity concentration higher than that of the semiconductor layer 3 is provided at least directly below the emitter region 105 and the base region 103, and therefore, the electrical resistance of the path through which electrons flow between the impurity region 101 and the emitter region 105 can be reduced. Accordingly, an NPN transistor 111 having a collector region with low resistance can be implemented, so that the output current of this NPN transistor 111 can be increased.

In addition, the region where the PNP transistor 211 is formed in the semiconductor layer 3 and the impurity region 201 function as the base region of the PNP transistor 211. A voltage is applied across the emitter electrode 207 and the collector electrode 208, so that a high potential is provided to the emitter electrode 207, and a negative base potential is applied to the base electrode 206. As a result, a voltage is applied across the emitter region 203 and the collector region 204, so that a high potential is provided to this emitter region 203, and a negative base potential is applied to the base region that is formed of the impurity region 201 and the semiconductor layer 3. As a result of this, a current flows between the emitter region 203 and the collector region 204, so that the PNP transistor 211 functions as a semiconductor switch.

In the fourth embodiment, the potential of the drain region 6 of the MOS transistor 20, the potential of the emitter region 105 of the NPN transistor 111, and the potential of the collector region 204 of the PNP transistor 211 are set at the same value. In addition, in order to stabilize the device properties, the potential of the rear face of the SOI substrate 4, that is to say, the potential of the semiconductor substrate 1, is set at a value that is the same as that of the potential of the drain region 6, the emitter region 105 and the collector region 204. Accordingly, as described above, the depletion layer tends to extend toward the source region 5 or toward the semiconductor layer 3 between the source region 5 and the drain region 6, due to the field plate effect, but it becomes difficult for this depletion layer to extend, due to the existence of the impurity region 9 having an impurity concentration higher than that of the semiconductor layer 3. Accordingly, the occurrence of punch-through between the source region 5 and the drain region 6 of the MOS transistor 20 can be prevented, and the withstand voltage between these can be increased. In addition, in the PNP transistor 211, the depletion layer also tends to extend toward the emitter region 203, but in the fourth embodiment, this depletion layer is prevented from extending, because an impurity region 209 having an impurity concentration higher than that of the semiconductor layer 3 is provided at least directly below the emitter region 203. Accordingly, the occurrence of punch-through between the emitter region 203 and the collector region 204 can be prevented, and the withstand voltage between these can be increased.

Here, as in the fourth embodiment, it is preferable for the impurity region 209 to be connected to the impurity region 201. In this case, the potential of the impurity region 209 becomes approximately equal to the base potential that is applied to the base electrode 206. In general, the base potential and the emitter potential that is applied to the emitter electrode 207 are set at the same value when the PNP transistor 211 is in the OFF state. Therefore, the potential of the impurity region 209 becomes approximately the same as the potential of the emitter region 203 when the PNP transistor 211 is in the OFF state. As a result, the extension of the depletion layer due to the field plate effect can further be prevented.

Figure 24:
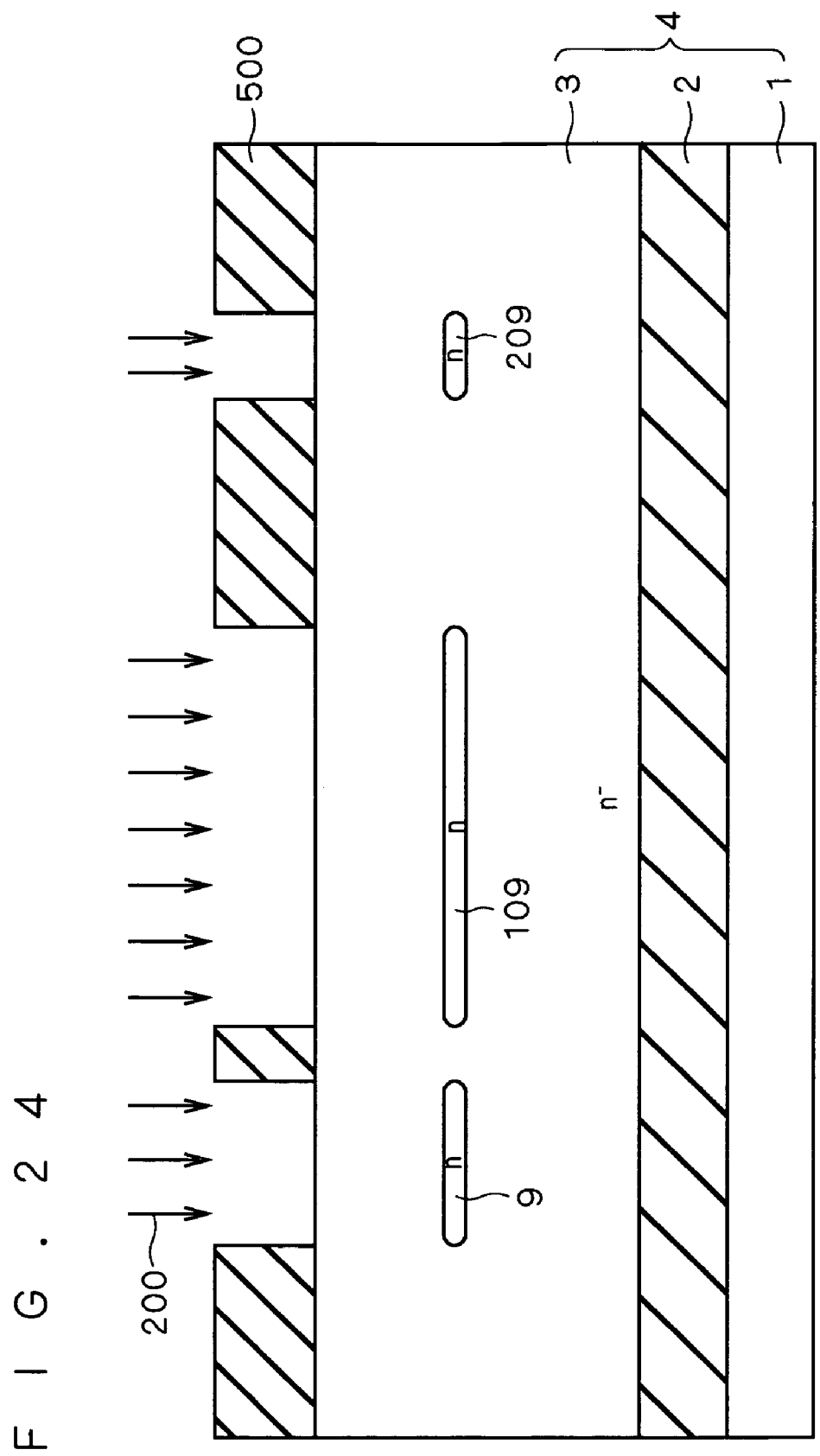
FIGS. 24 to 33 are sectional views showing the steps in a manufacturing method of a semiconductor device according to the fourth embodiment of the present invention in chronological order.

Next, a manufacturing method of the semiconductor device shown in FIG. 23 is described. FIGS. 24 to 37 are sectional views showing the steps in a manufacturing method of the semiconductor device according to the fourth embodiment of the present invention in chronological order. First, an SOI substrate 4 is formed in the same manner as in the second embodiment. Then, as shown in FIG. 24, a resist 500 having a predetermined pattern with openings is formed on the semiconductor layer 3, and this resist 500 is used as a mask, so that ions of an n type impurity 200, such as phosphorous, are implanted in the upper surface of the semiconductor layer 3. At this time, the energy for implantation is set at, for example, approximately several MeV, and the amount for implantation is set at approximately $5.0 \times 10^{12}$ ions/cm$^2$. As a result of this, n type impurity regions 9, 109 and 209 are simultaneously formed, in such a manner that they are buried inside the semiconductor layer 3 so as not to be exposed from the semiconductor layer 3. After that, the resist 500 is removed. Here, the impurity regions 9, 109 and 209 are made to diffuse in the subsequent step of heat treatment.

Figure 25:
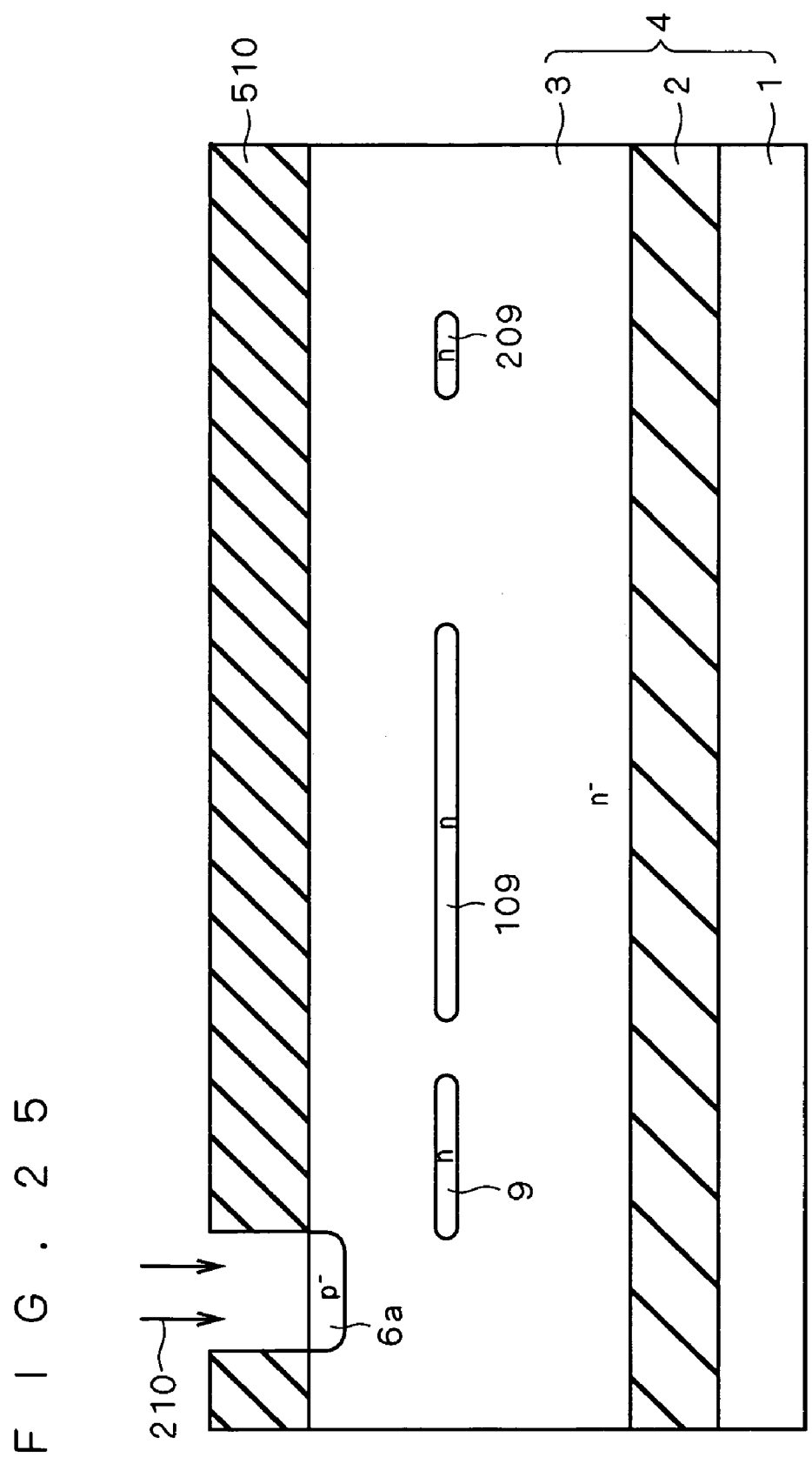

Next, as shown in FIG. 25, a resist 510 having a predetermined pattern with openings is formed on the semiconductor layer 3, and this resist 510 is used as a mask, so that ions of a p type impurity 210, such as boron, are implanted in the upper surface of the exposed semiconductor layer 3. At this time, the energy for implantation is set at, for example, approximately 100 keV, and the amount of implantation is set at approximately $3.0 \times 10^{12}$ ions/cm$^2$. As a result of this, an offset region 6a is selectively formed in the upper surface of the semiconductor layer 3. After that, the resist 510 is removed. Here, the offset region 6a is made to diffuse in the subsequent step of heat treatment.

Figure 26:
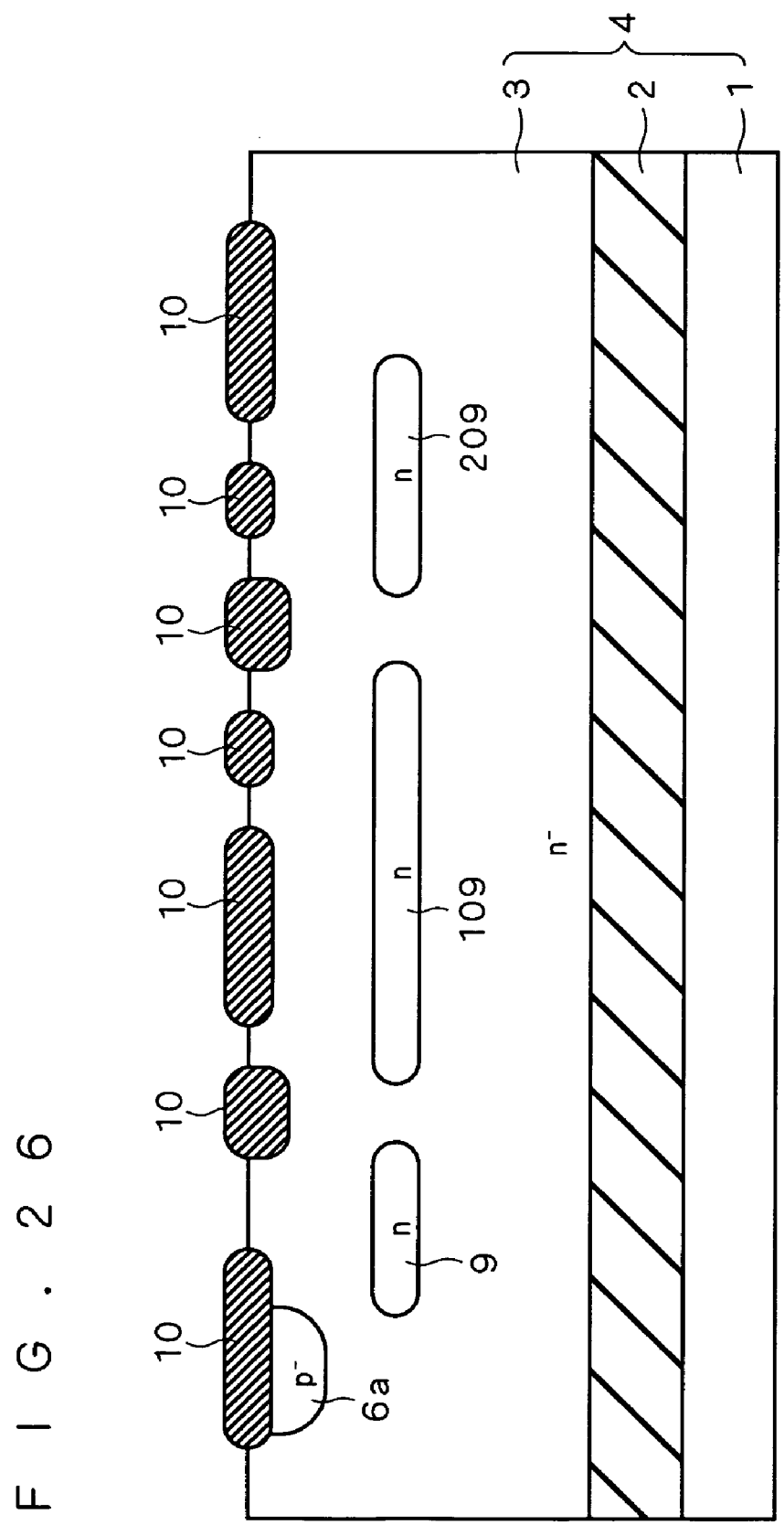
Figure 27:
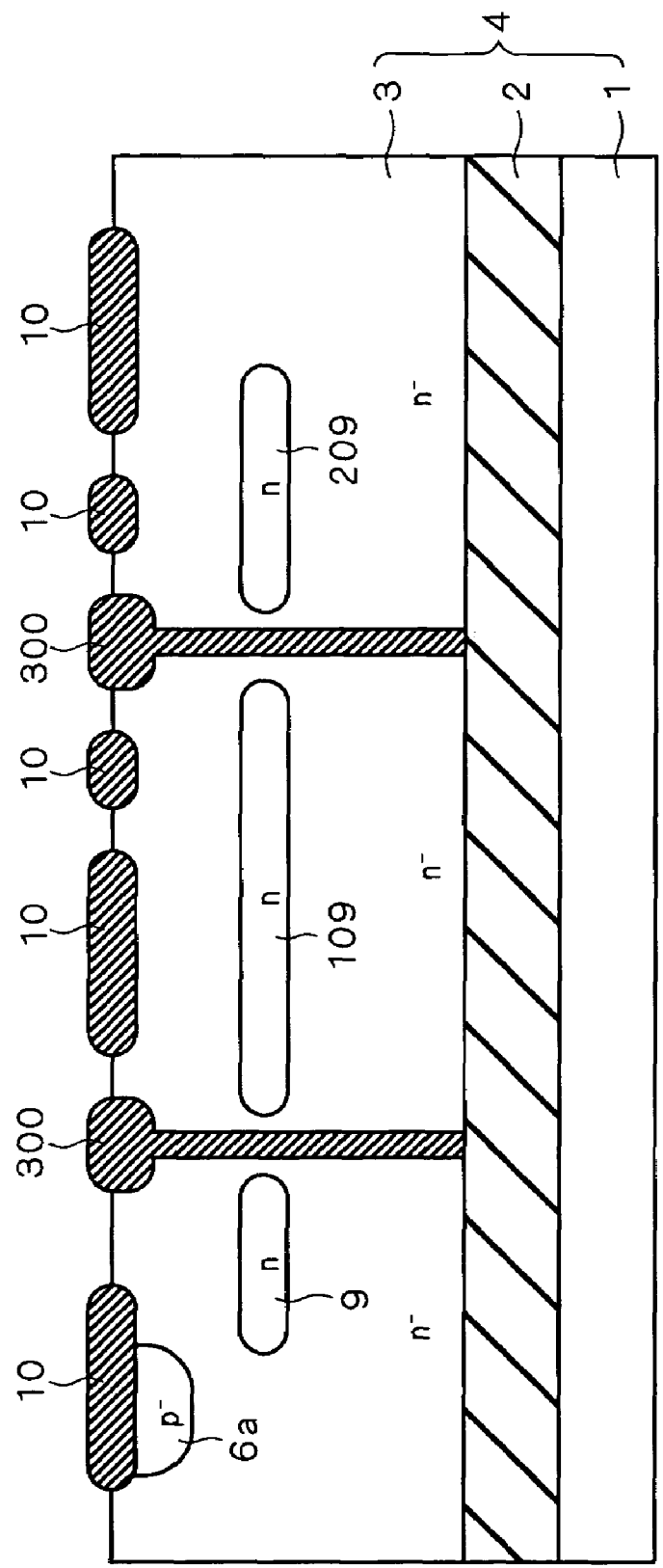

Next, as show in FIG. 26, the upper surface of the semiconductor layer 3 is selectively thermally oxidized so as to form a field oxide film 10 on the upper surface of the semiconductor layer 3. Through the thermal oxidation at this time, the offset region 6a, as well as the impurity regions 9, 109 and 209, are made to diffuse. Then, as shown in FIG. 27, an element isolation insulating film 300 for electrically separating a region where a MOS transistor 20 is to be formed, a region where an NPN transistor 111 is to be formed, and a region where a PNP transistor 211 is to be formed from each other is formed in the semiconductor layer 3.

Figure 28:
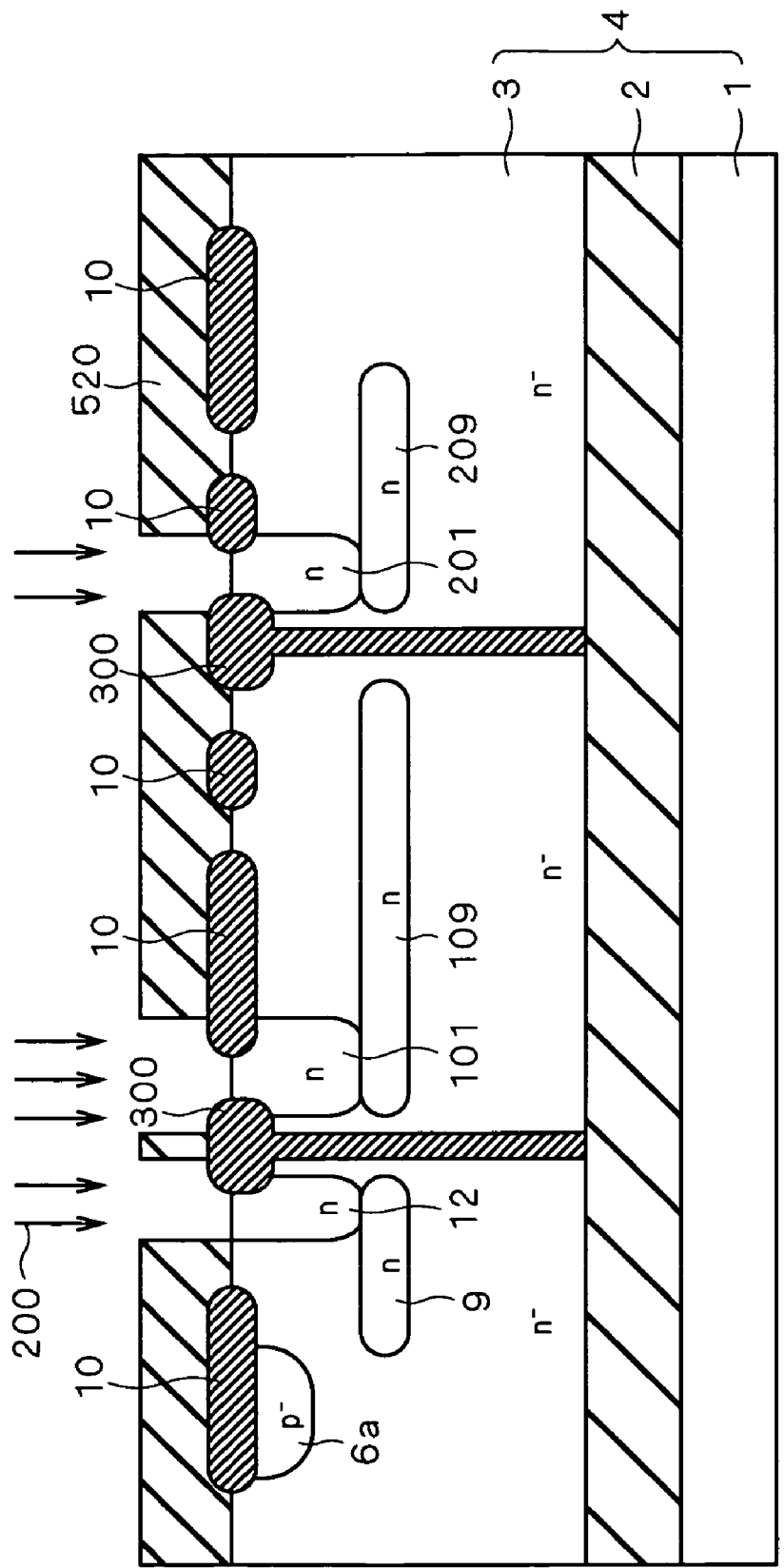

Next, as shown in FIG. 28, a resist 520 having a predetermined pattern with openings is formed on the semiconductor layer 3, and this resist 520 is used as a mask so that ions of an n type impurity 200, such as phosphorous, are implanted in the upper surface of the exposed semiconductor layer 3. At this time, the energy for implantation is set at, for example, approximately 600 keV, and the amount for implantation is set at approximately $5.0 \times 10^{12}$ ions/cm$^2$. As a result of this, impurity regions 12, 101 and 201 are formed in the upper surface of the semiconductor layer 3. After that, the resist 520 is removed.

Figure 29:
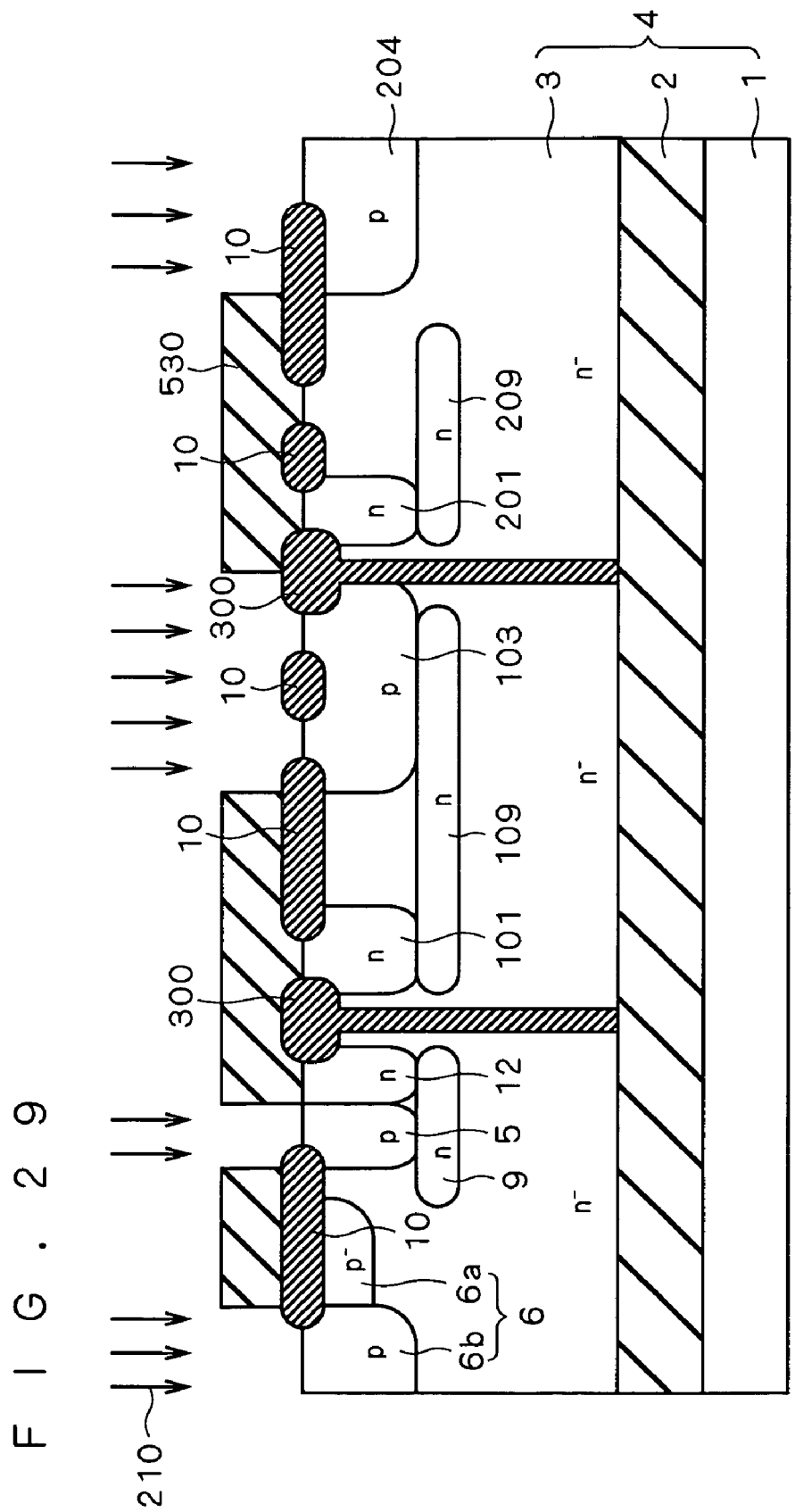

Next, as shown in FIG. 29, a resist 530 having a predetermined pattern with openings is formed on the semiconductor layer 3, and this resist 530 is used as a mask, so that ions of a p type impurity 210, such as boron, are implanted in the upper surface of the exposed semiconductor layer 3. At this time, the energy for implantation is set at, for example, approximately 300 keV, and the amount for implantation is set at approximately $2.0 \times 10^{12}$ ions/cm$^2$. As a result of this, a source region 5, an impurity region 6b for a drain region 6, a base region 103 and a collector region 204 are formed in the upper surface of the semiconductor layer 3. After that, the resist 530 is removed, and heat treatment is carried out at, for example, 800° C. for approximately 30 minutes, so that the source region 5, the impurity region 6b, the base region 103 and the collector region 204 are made to diffuse.

Figure 30:
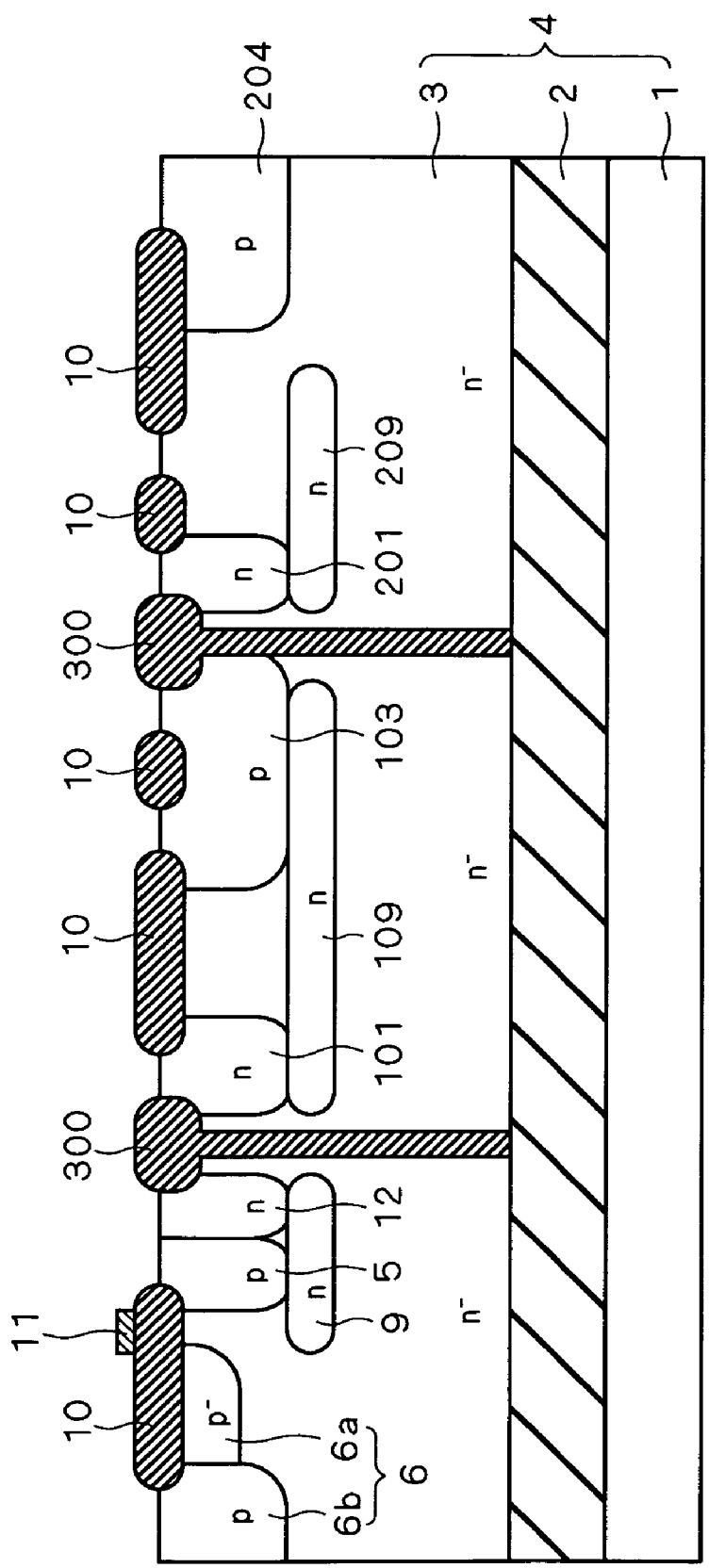
Figure 31:
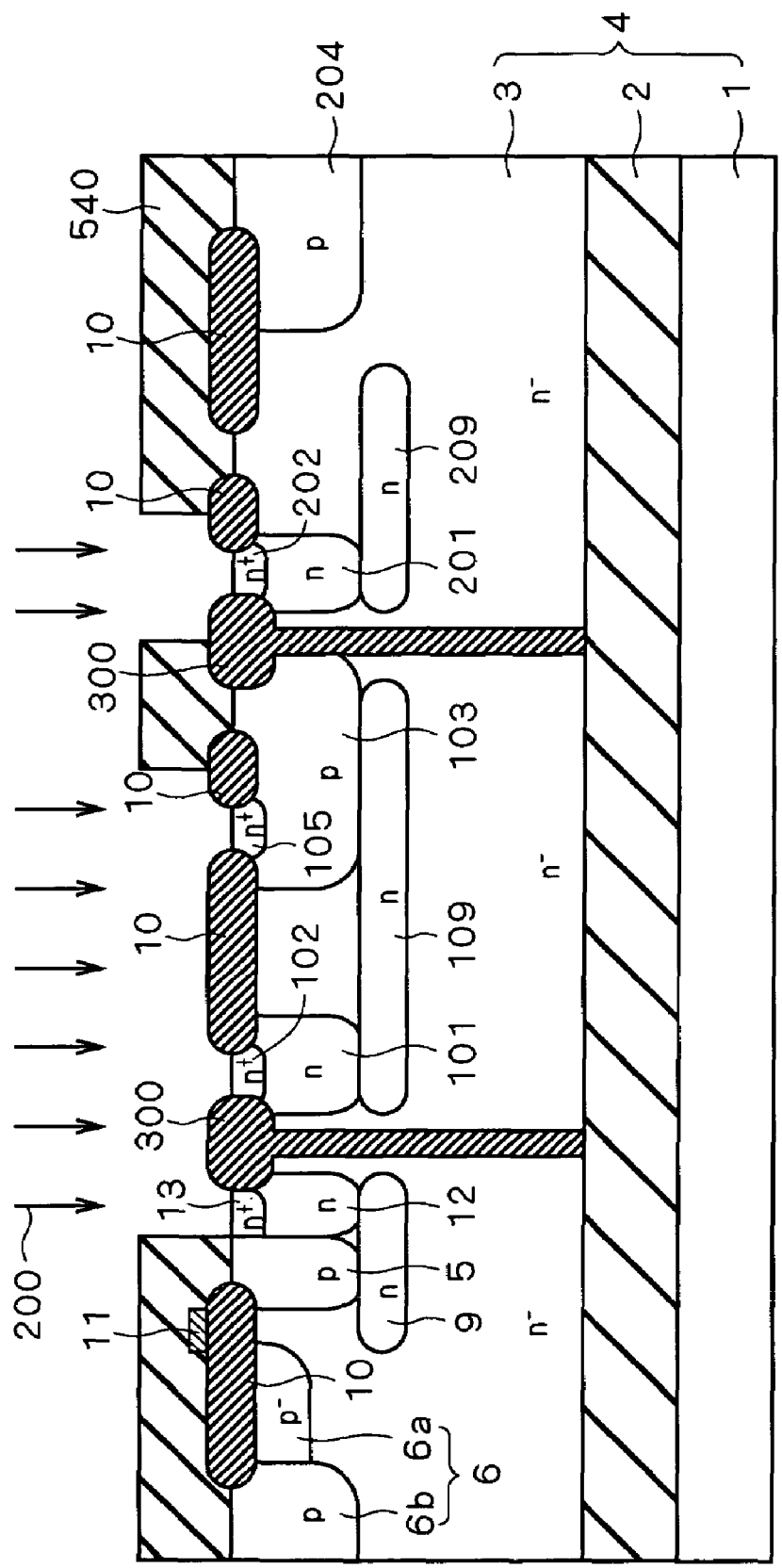

Next, as shown in FIG. 30, a gate electrode 11 of the MOS transistor 20 is selectively formed on a portion of the field oxide films 10 that is located above the semiconductor layer 3 between the source region 5 and the drain region 6. Then, as shown in FIG. 31, a resist 540 having a predetermined pattern with openings is formed on the semiconductor layer 3, and this resist 540 and the field oxide film 10 are used as a mask, so that ions of an n type impurity 200, such as phosphorous, are implanted in the upper surface of the semiconductor layer 3. At this time, the energy for implantation is set at, for example, approximately 50 keV, and the amount for implantation is set at approximately $2.0 \times 10^{15}$ ions/cm$^2$. As a result of this, impurity regions 13, 102 and 202 are respectively formed in the upper surfaces of the impurity regions 12, 101 and 201, and an emitter region 105 is formed in an upper surface of the base region 103. After that, the resist 540 is removed, and heat treatment is carried out at, for example, 800° C. for approximately 30 minutes, so that the impurity regions 13, 102 and 202, as well as the emitter region 105, are made to diffuse.

Figure 32:
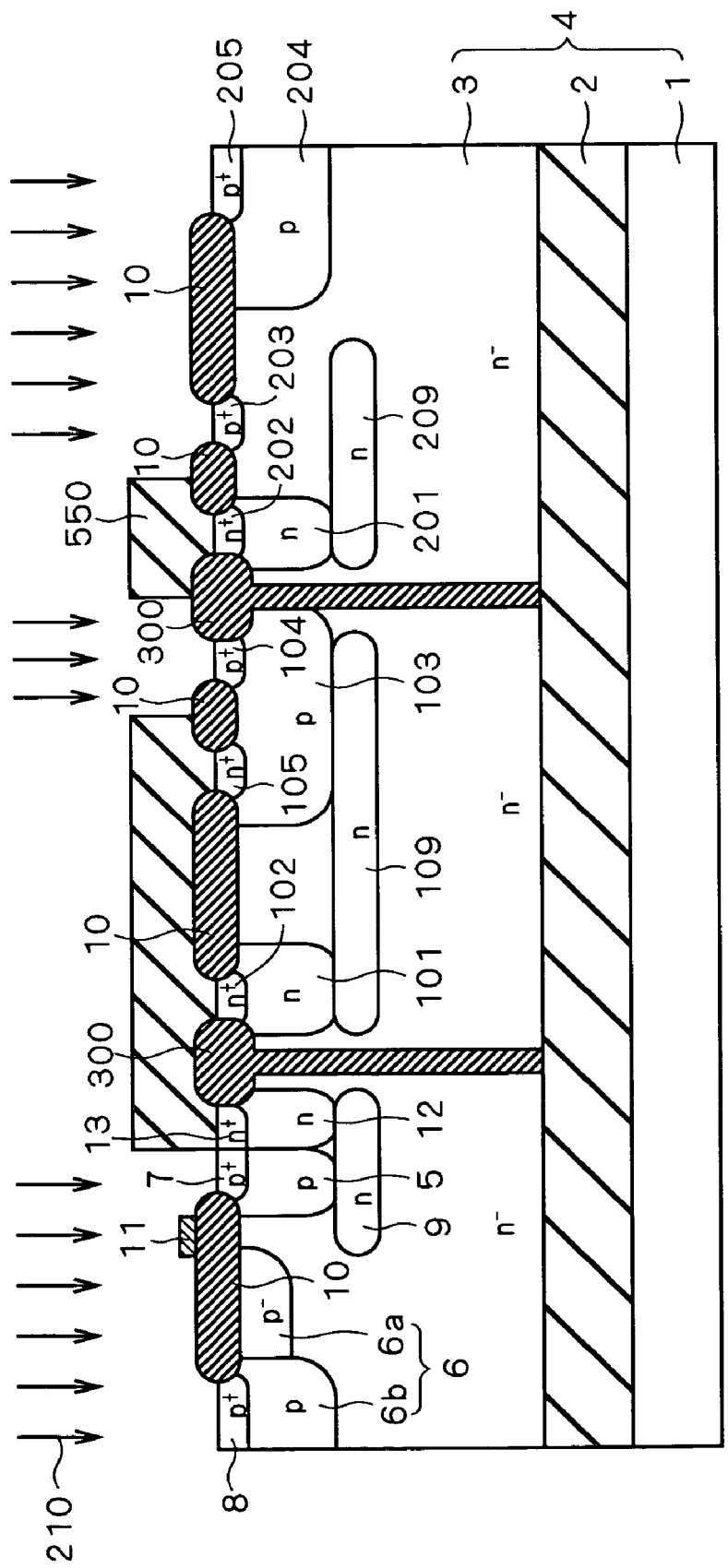

Next, as shown in FIG. 32, a resist 550 having a predetermined pattern with openings is formed on the semiconductor layer 3, and this resist 550 and the field oxide film 10 are used as a mask, so that ions of a p type impurity 210, such as boron, are implanted in the upper surface of the semiconductor layer 3. At this time, the energy for implantation is set at, for example, approximately 50 keV, and the amount for implantation is set at approximately $1.0 \times 10^{14}$ ions/cm$^2$. As a result of this, an impurity region 8 is formed in the upper surface of the impurity region 6b of the drain region 6, an impurity region 7 is formed in the upper surface of the source region 5, an impurity region 104 is formed in the upper surface of the base region 103, an emitter region 203 is formed in the upper surface of the semiconductor layer 3, and an impurity region 205 is formed in the upper surface of the collector region 204. After that, the resist 550 is removed, and heat treatment is carried out at, for example, 800° C. for approximately 30 minutes, so that the impurity regions 7, 8, 104 and 205, as well as the emitter region 203, are made to diffuse.

Figure 33:
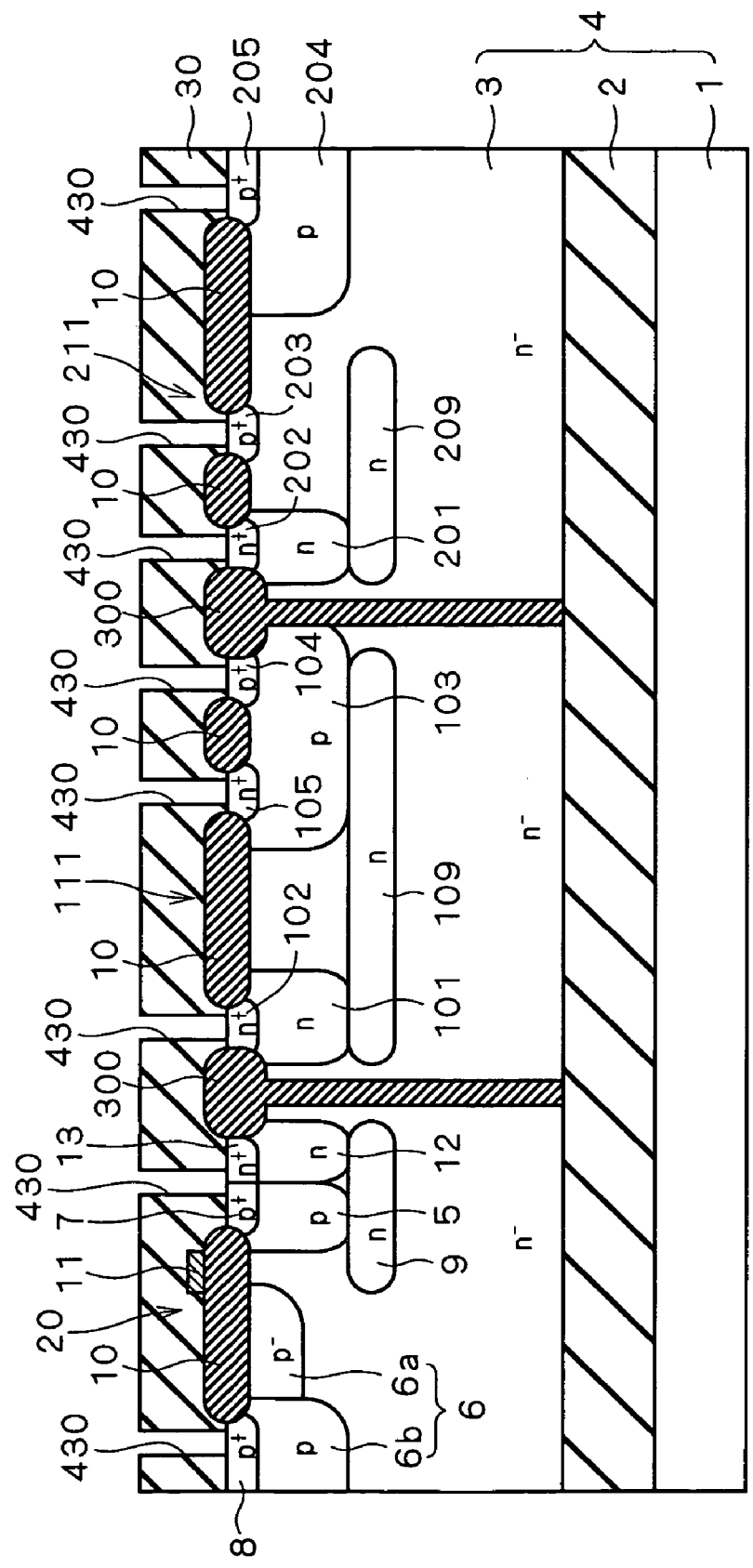

Next, an interlayer insulating film 30 is formed on the entire surface, and a resist, not shown, having a predetermined pattern with openings is formed on this interlayer insulating film 30. In addition, this resist is used as a mask, so as to etch the interlayer insulating film 30, and then, the resist that is used as a mask is removed. As a result of this, as shown in FIG. 33, a number of contact holes 430 which respectively penetrate through the interlayer insulating film 30 and reach the impurity regions 8, 102, 104, 202 and 205, as well as the emitter regions 105 and 203 are formed in the interlayer insulating film 30, and a contact hole 430 which reaches both the impurity regions 7 and 13 are formed. After that, a metal film with which the contact holes 430 are respectively filled in is formed on the entire surface, and this metal film is etched. As a result of this, a source electrode 25, a drain electrode 26, collector electrodes 106 and 208, emitter electrodes 107 and 20, and base electrodes 108 and 206 are formed, and thus, the structure shown in FIG. 23 is completed.

Here, in order to reduce the contact resistance between the electrodes and the impurity regions, the upper surface of the impurity regions 7, 8, 13, 102, 104, 202 and 205, as well as the emitter regions 105 and 203, is converted to silicide, so that silicide, for example, cobalt silicide, may be formed on these upper surfaces.

As described above, in accordance with the manufacturing method of a semiconductor device according to the fourth embodiment, the impurity region 9 and the impurity region 109 are formed at the same time, and therefore, a MOS transistor 20 having a high withstand voltage and a low threshold voltage, as well as an NPN transistor 111 having a collector region with low resistance can be formed without increasing the number of steps.

In addition, in the fourth embodiment, the impurity region 9 and the impurity region 209 are formed at the same time, and therefore, a MOS transistor 20 having a high withstand voltage and a low threshold voltage, as well as a PNP transistor 211 having a high withstand voltage between the emitter and the collector can be formed without increasing the number of steps.

Here, though in the fourth embodiment, in the same manner as in the second embodiment, an n type impurity 200 is implanted relatively deeply in the semiconductor layer 3, and thereby, impurity regions 9, 109 and 209 are formed in the semiconductor layer 3 so as not to be exposed from the upper surface of this semiconductor layer 3, impurity regions 9, 10 and 209 may be formed in the semiconductor layer 3 so as not to be exposed from the upper surface of this semiconductor layer 3 by forming a portion of the semiconductor layer 3, and then, forming impurity regions 9, 109 and 209 in the vicinity of the upper surface of this semiconductor layer 3, and after that, forming the remaining portion of the semiconductor layer 3 by means of epitaxial growth or the like, as in the first embodiment.

Fifth Embodiment

Figure 34:
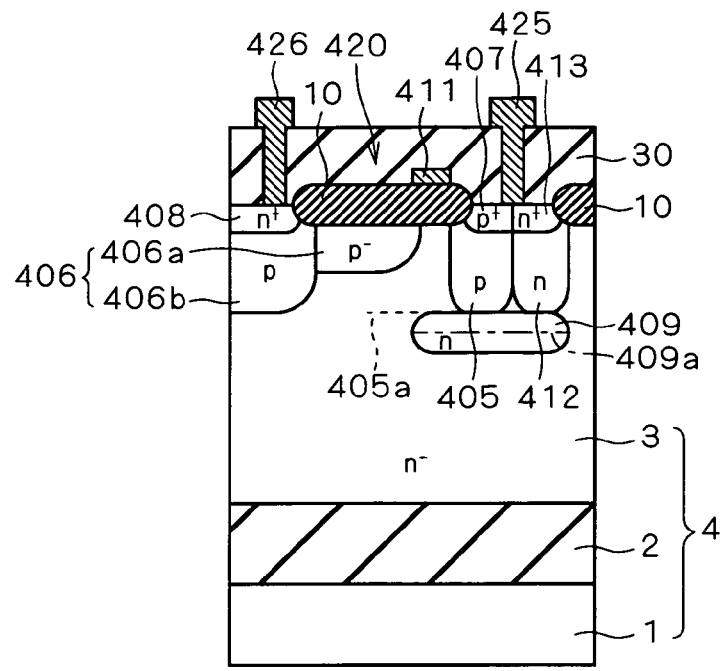
FIG. 34 is a sectional view showing the structure of a semiconductor device according to the fifth embodiment of the present invention.

FIG. 34 is a sectional view showing the structure of a semiconductor device according to the fifth embodiment of the present invention. The structure of the semiconductor device according to the fifth embodiment is approximately the same as the structure of the region where the MOS transistor 20 is formed, as shown in the FIG. 23, but is different from the structure in FIG. 23 in that the structure of the semiconductor device according to the fifth embodiment is provided with an n$^+$ type impurity region instead of the p$^+$ type impurity region 8.

As shown in FIG. 34, the semiconductor device according to the fifth embodiment is provided with an SOI substrate 4 as that described above, and a p channel type insulating gate type bipolar transistor 420 (hereinafter referred to as "IGBT") which is formed in this SOI substrate 4.

The IGBT 420 is formed in a semiconductor layer 3 of the SOI substrate 4, and is provided with a p type emitter region 405, an impurity region 406 and an n$^+$ type collector region 408. The emitter region 405 and the impurity region 406 are formed in the upper surface of the semiconductor layer 3 so as to be at a distance from each other. The impurity region 406 is formed of a p type impurity region 406b and a p$^-$ type offset region 406a. The impurity region 406b is formed so as to be at a distance from the emitter region 405, and the offset region 406a is formed so as to extend from the end of the impurity region 406b on the emitter region 405 side toward the emitter region 405. The collector region 408 is formed in the upper surface of the impurity region 406b. Accordingly, the collector region 408 and the impurity region 406 make contact with each other.

A p$^+$ type impurity region 407 is formed in the upper surface of the emitter region 405. An n type impurity region 412 is formed adjacent to the emitter region 405 in the upper surface of the semiconductor layer 3. An n$^+$ type impurity region 413 is formed in the upper surface of the impurity region 412.

A field oxide film 10 as that described above is formed on the upper surface of the semiconductor layer 3, excluding the upper surface of the collector region 408 and the impurity regions 407 and 413, and the portion thereof which is formed on the semiconductor layer 3 between the offset region 406a and the emitter region 405 functions as the gate insulating film of the IGBT 420. In addition, a gate electrode 411 of the IGBT 420 is formed on the field oxide film 10, which functions as the gate insulating film, so as to cover the end of the emitter region 405 on the impurity region 406 side, and the end of the offset region 406a on the emitter region 405 side, as viewed from the top. The gate electrode 411 is a layered film of, for example, a doped polysilicon film and a tungsten silicide film.

The interlayer insulating film 30 is formed on the upper surface of the semiconductor layer 3, so as to cover the field oxide film 10 and the gate electrode 411. A collector electrode 426 which reaches the collector region 408, and an emitter electrode 425 which reaches both the impurity regions 407 and 413 are formed in the interlayer insulating film 30. The emitter electrode 425 and the collector 426 respectively penetrate the interlayer insulating film 30, and are also provided on the upper surface of this interlayer insulating film 30.

The semiconductor device according to the fifth embodiment is formed in a semiconductor layer 3, in the same manner as the semiconductor device according to the first embodiment, and is further provided with an n type impurity region 409 having an impurity concentration higher than that of this semiconductor layer 3.

The impurity region 409 is formed over the entire bottom of the emitter region 405, so as to make contact with the emitter region 405 directly below the emitter region 405. Furthermore, the impurity region 409 extends to a portion directly below the semiconductor layer 3 between the emitter region 405 and the impurity region 406, and exists directly below the channel region of the IGBT 420 that is formed between the emitter region 405 and the impurity region 406. In addition, the position 409a of the peak in the impurity concentration is below the lowest end 405a of the emitter region 405 throughout the entirety of the impurity region 409.

In the semiconductor device having the structure according to the fifth embodiment, a predetermined voltage is applied across the emitter electrode 425 and the collector electrode 426, and thereby, a voltage which makes the emitter region 405 of a high potential is applied across the emitter region 405 and the collector region 408, and a negative gate potential is applied to the gate electrode 411. Furthermore, in order to stabilize the device properties, the potential of the rear face of the SOI substrate 4, that is to say, the potential of the semiconductor substrate 1, is set at the same value as the potential of the collector region 408. As a result of this, the emitter region 405 functions as a source and the impurity region 406 functions as a drain, so that a channel layer is formed in the semiconductor layer 3 between the emitter region 405 and the impurity region 406, converting the IGBT 420 to the ON state. As a result, a current flows between the emitter region 405 and the collector region 408, making the IGBT 420 function as a semiconductor switch.

As described above, in the semiconductor device according to the fifth embodiment, the impurity region 409, having an impurity concentration higher than that of the semiconductor layer 3, is formed over the entire bottom of the emitter region 405 at a portion directly below this emitter region 405, and is formed directly below the semiconductor layer 3 between the emitter region 405 and the impurity region 406. Therefore, even in the case where the potential of the collector region 408 and the potential of the rear face of the SOI substrate 4 are set at the same potential in order to stabilize the device properties, it becomes difficult for the depletion layer to extend to the emitter region 405, and it also becomes difficult for it to extend to the semiconductor layer 3 between the emitter region 405 and the impurity region 406. Accordingly, the occurrence of punch-through between the emitter region 405 that functions as a source and the impurity region 406 that functions as a drain can be prevented, and the withstand voltage between these can be increased.

Furthermore, in accordance with the fifth embodiment, the position 409a of the concentration peak in the impurity region 409 is set so as to be below the lowest end 405a of the emitter region 405 at a portion directly below the upper surface of the semiconductor layer 3 between the emitter region 405 and the impurity region 406, and therefore, an increase in the n type impurity concentration in the region where the channel layer of the IGBT 420 is formed can be prevented. Accordingly, an increase in the threshold voltage of the IGBT 420 can be prevented.

Figure 35:
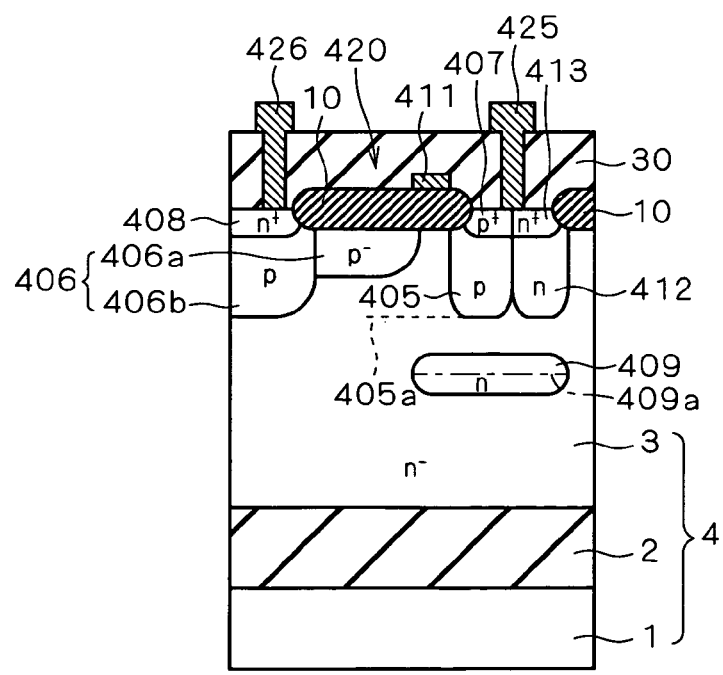
FIGS. 35 and 36 are sectional views showing the structures of modifications of the semiconductor device according to the fifth embodiment of the present invention.

Here, though in accordance with the fifth embodiment, the impurity region 409 is formed so as to make contact with the bottom of the emitter region 405, it is preferable, as shown in FIG. 35, for the impurity region 409 to be formed below the lowest end 405a of the emitter region 405 so as to be at a distance from the emitter region 405. In this case, an increase in the n type impurity concentration between the emitter region 405 and the impurity region 406 can further be prevented, and therefore, an increase in the threshold voltage of the IGBT 420 can further be prevented.

Figure 36:
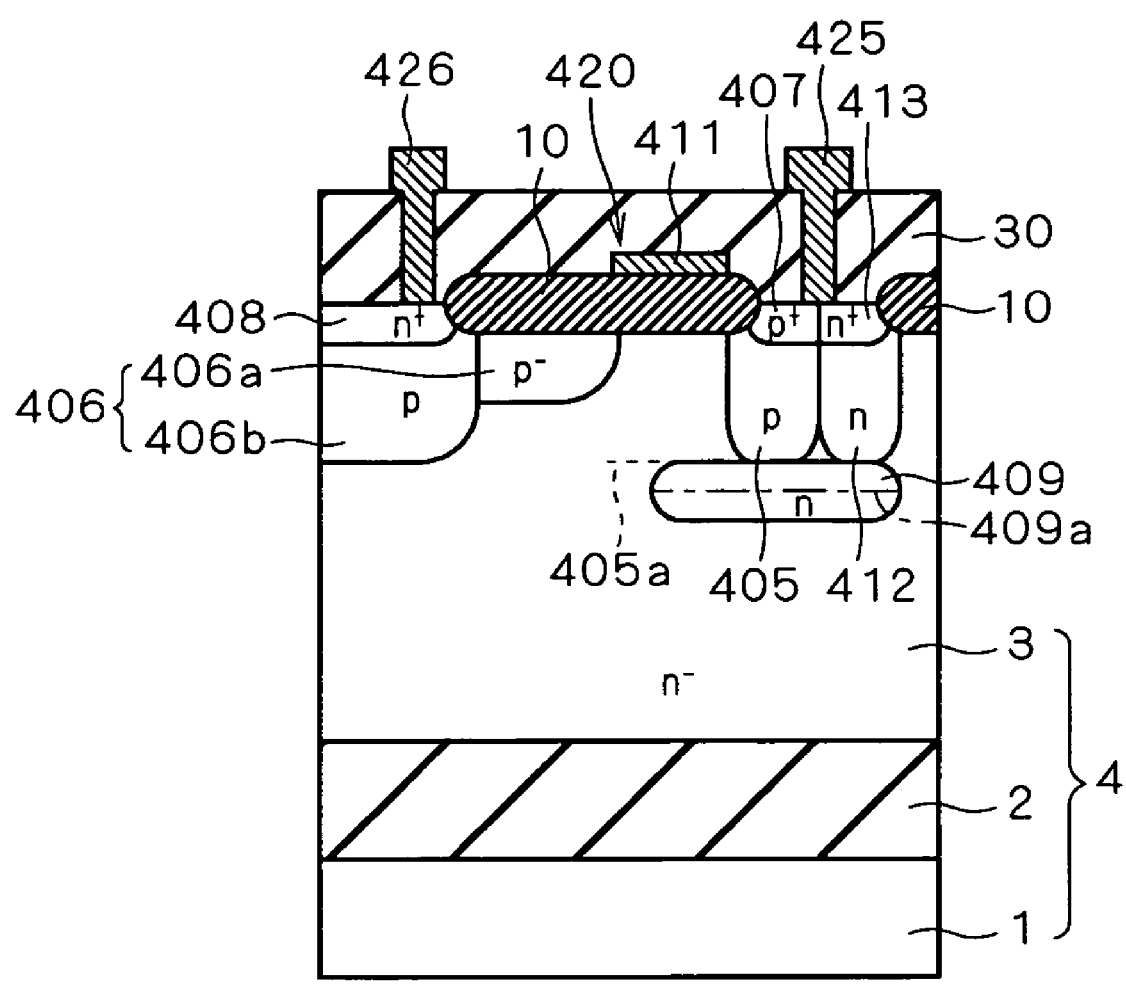

In addition, in accordance with the fifth embodiment, the impurity region 409 also exists directly below the impurity region 406, and it is preferable, as shown in FIG. 36, for the impurity region 409 not to be located directly below the impurity region 406. In this case, the distance between the impurity region 409 and the impurity region 406 can be sufficiently secured, and therefore, the withstand voltage between the impurity region 409 and the impurity region 406 can be prevented from lowering without fail. Accordingly, the withstand voltage of the IGBT 420 can be prevented from lowering without fail.

In addition, the semiconductor device according to the fifth embodiment may be used instead of the semiconductor device according to the first embodiment in the driver circuit 350 according to the third embodiment. The driver circuit 350 may, for example, be provided with a number of structures as those shown in FIG. 34. A number of p channel type IGBTs 420 in the structures may be respectively used instead of the p channel type MOS transistors 301 to 303. As a result of this, the IGBT 420 is utilized as the transistor on the high voltage side in the output stage 310 for outputting a driving voltage DV to a display panel.

As described above, an IGBT 420 having a high gate withstand voltage and a low threshold voltage is used as the transistor of the output stage 310 on the high voltage side, and thereby, a high gate voltage can be supplied to the transistor on the high voltage side, and the output current of this transistor can be increased. Accordingly, even in the case where a gate voltage which is a high voltage VH is outputted from the circuit in the stage before the output stage 310 in accordance with the third embodiment, this gate voltage can be supplied directly to the gate terminal of the transistor on the high voltage side, and thus, the circuit configuration of the driver circuit 350 can be simplified, and the operation speed of the transistor on the high voltage side can be increased. Here, n channel type IGBTs may be respectively utilized instead of the n channel type MOS transistors 304 to 306 in the driver circuit 350.

In addition, the semiconductor device according to the fifth embodiment may be utilized instead of the structure of the region where the MOS transistor 20 is formed in the semiconductor device according to the fourth embodiment, and a semiconductor device with an IGBT 420, an NPN transistor 111 and a PNP transistor 211 may be implemented.

Such a semiconductor device can be fabricated in accordance with a manufacturing method which is almost the same as the manufacturing method of a semiconductor device according to the fourth embodiment. In the following, this manufacturing method of a semiconductor device is described in reference to FIGS. 37 to 43.

Figure 37:
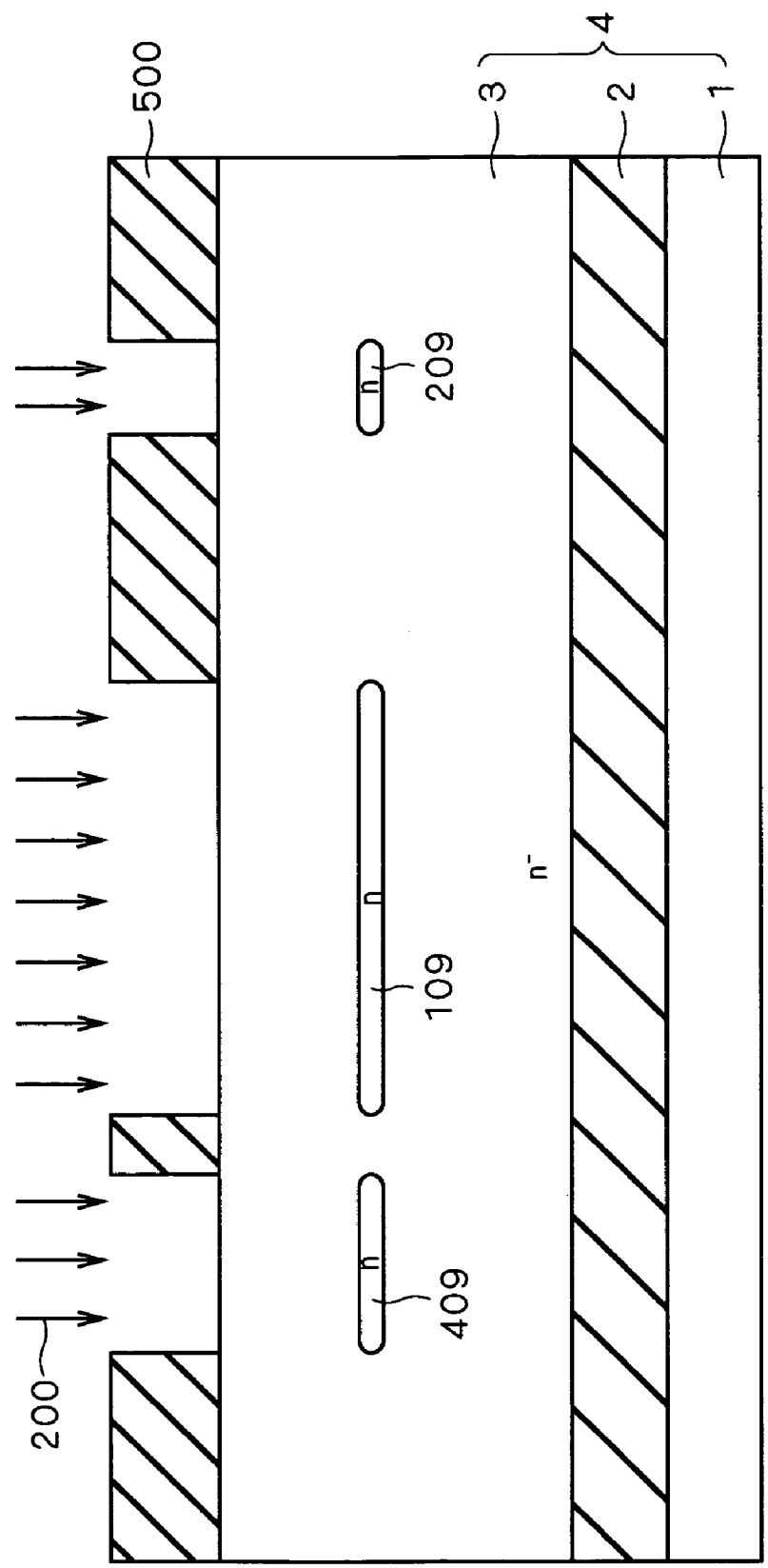
FIGS. 37 to 41 are sectional views showing the steps in a manufacturing method of a semiconductor device according to the fifth embodiment of the present invention in chronological order.

First, an SOI substrate 4 is formed in the same manner as in the fourth embodiment. Then, as shown in FIG. 37, ions of an n type impurity 200 are implanted in the upper surface of the semiconductor layer 3, in the same manner as in the manufacturing method when the impurity regions 9, 109 and 209 are formed according to the fourth embodiment, and the impurity regions 109, 209 and 409 are simultaneously formed and buried inside the semiconductor layer 3 so as not to be exposed from this semiconductor layer 3.

Figure 38:
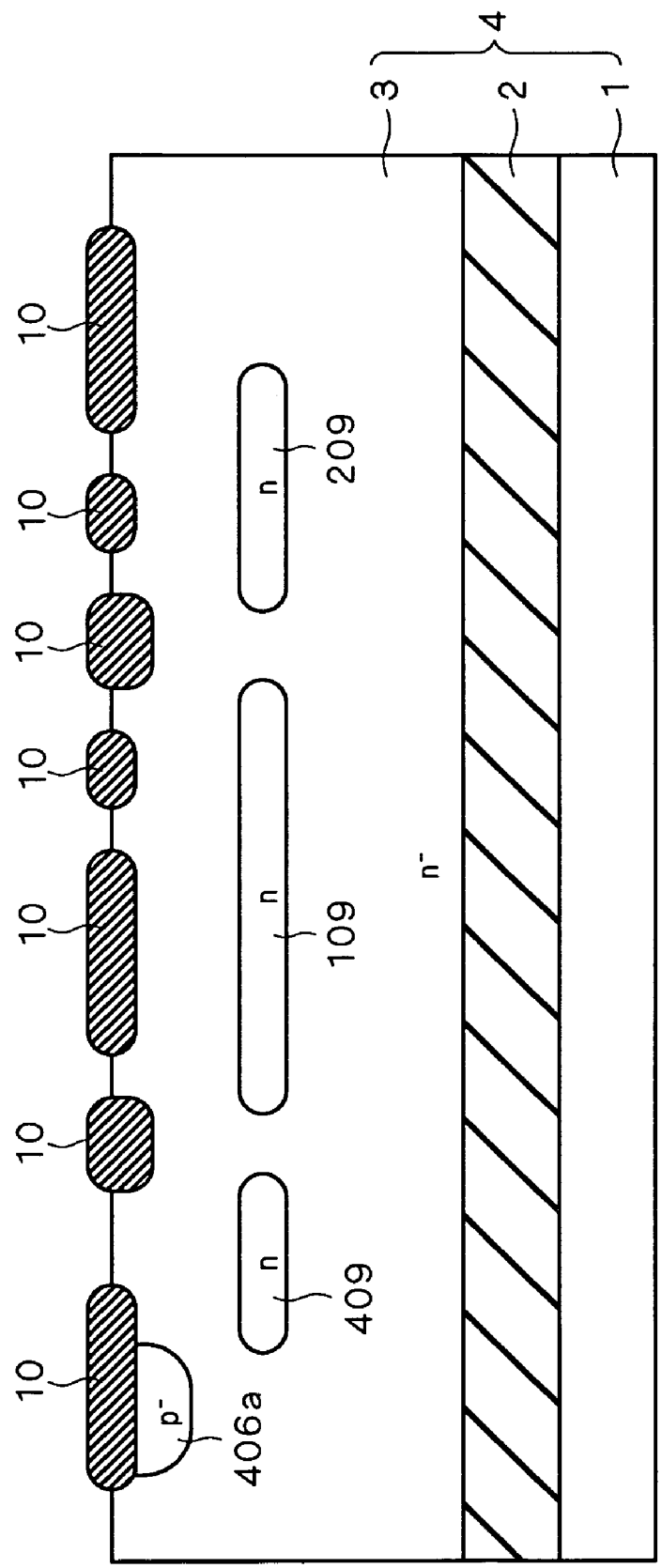

Next, ions of a p type impurity are implanted in the upper surface of the semiconductor layer 3, in the same manner as in the manufacturing method when the offset region 6a is formed in accordance with the fourth embodiment, so that an offset region 406a is formed in the upper surface of the semiconductor layer 3. After that, the field oxide film 10 is formed in the same manner as in the manufacturing method according to the fourth embodiment. Through the thermal oxidation at the time of formation of the field oxide film 10, as shown in FIG. 38, the offset region 406a and the impurity regions 109, 209 and 409 are made to diffuse. Then, the element isolation insulating film 300 which electrically separates a region where an IGBT 420 is to be formed, a region where an NPN transistor 111 is to be formed, and a region where a PNP transistor 211 is to be formed from each other is formed in the semiconductor layer 3.

Figure 39:
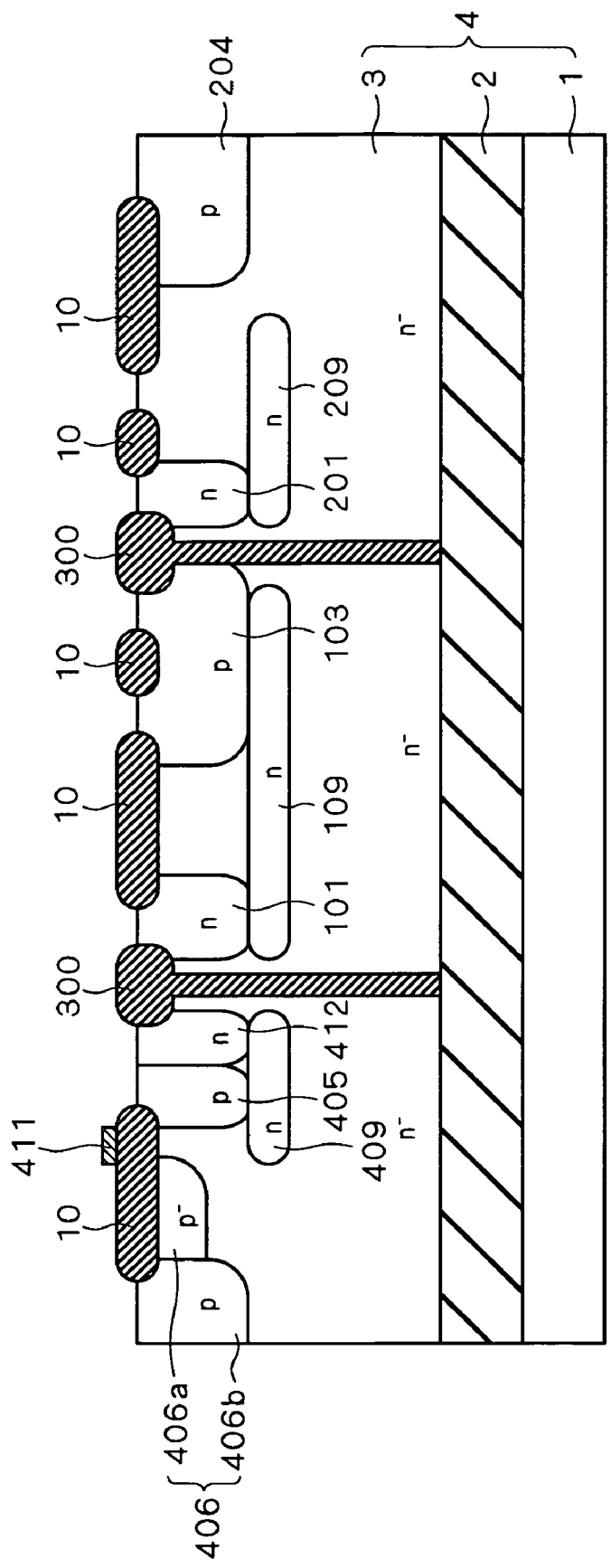

Next, ions of an n type impurity are implanted in the upper surface of the semiconductor layer 3, in the same manner as in the manufacturing method when the impurity regions 12, 101 and 201 are formed in accordance with the fourth embodiment, so that impurity regions 101, 201 and 412 are formed in the upper surface of the semiconductor layer 3. In addition, ions of a p type impurity are implanted in the upper surface of the semiconductor layer 3, in the same manner as in the manufacturing method when the source region 5, the impurity region 6b, the base region 103 and the collector region 204 are formed in accordance with the fourth embodiment, so that the emitter region 405, the impurity region 406a, the base region 103 and the collector region 204 are formed in the upper surface of the semiconductor layer 3. After that, a gate electrode 411 is formed in the same manner as the gate electrode 11, and thus, the structure shown in FIG. 39 is obtained.

Figure 40:
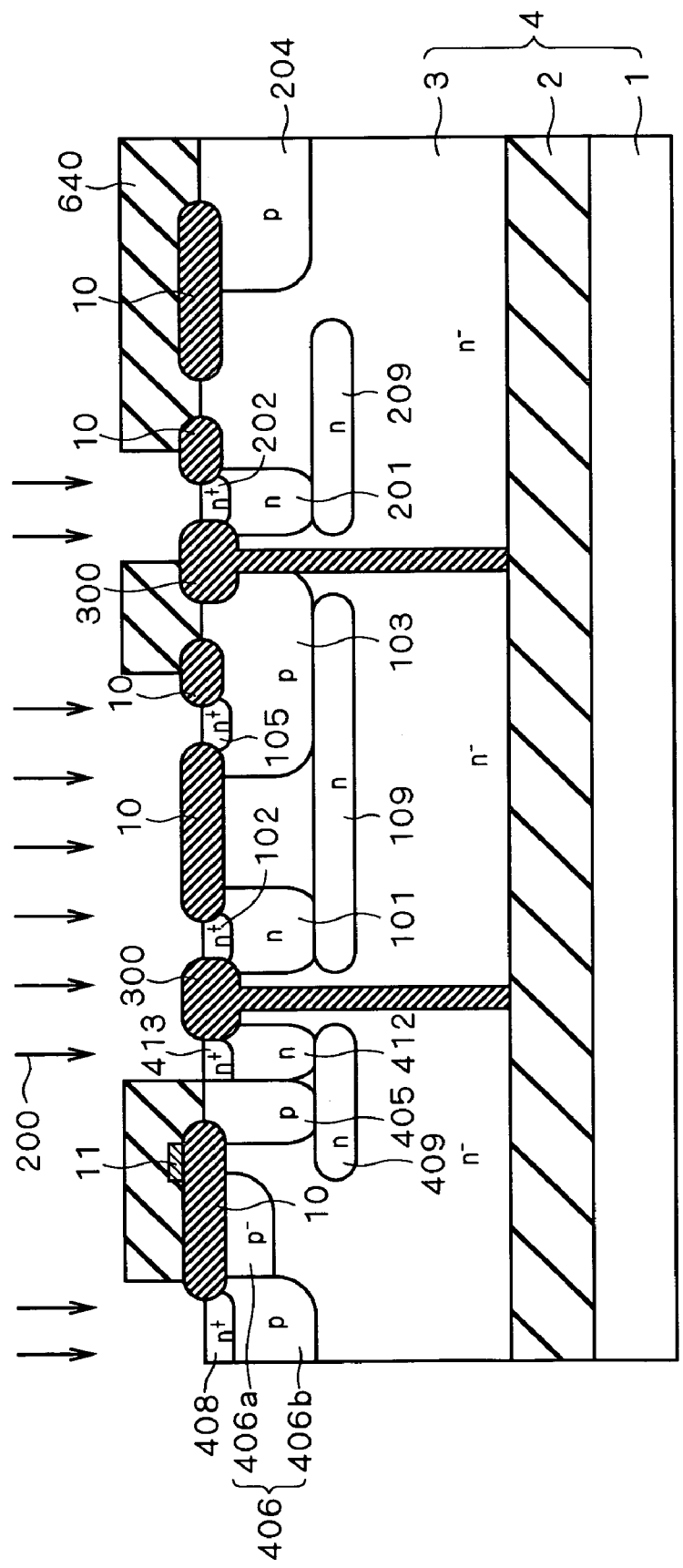

Next, as shown in FIG. 40, a resist 640 having a predetermined pattern with openings is formed on the semiconductor layer 3. Then, the resist 640 and the field oxide film 10 are used as a mask, and ions of an n type impurity 200, such as phosphorous, are implanted in the upper surface of the semiconductor layer 3 under the same conditions for ion implantation as those for the formation of the impurity regions 13, 102 and 202, as well as the emitter region 105, according to the fourth embodiment. As a result of this, impurity regions 102, 202 and 413 are formed in the upper surface of the impurity regions 101, 201 and 412, a collector region 408 is formed in the upper surface of the impurity region 6b, and an emitter region 105 is formed in the upper surface of the base region 103. After that, the resist 640 is removed, and heat treatment is carried out at, for example, 800° C. for approximately 30 minutes, so that the impurity regions 102, 202 and 413, the collector region 408 and the emitter region 105 are made to diffuse.

Figure 41:
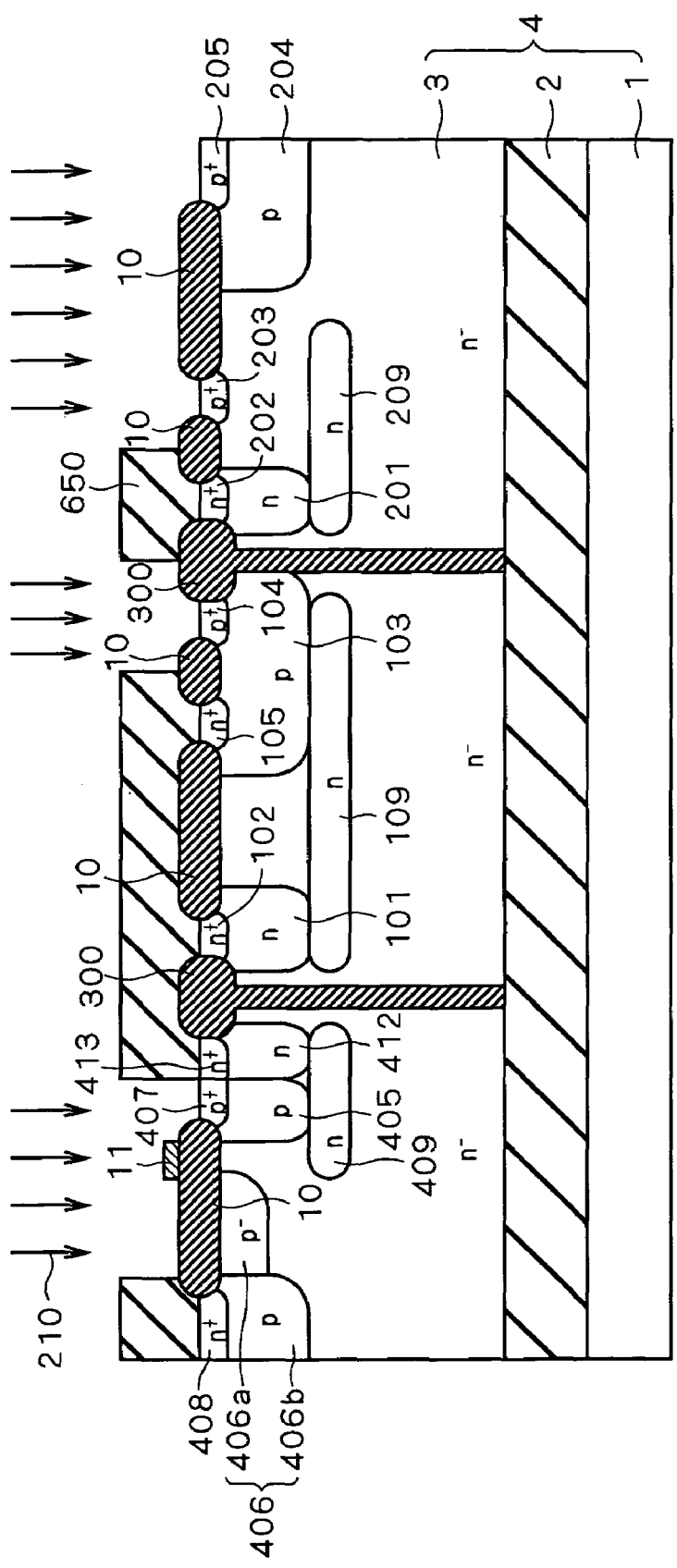

Next, as shown in FIG. 41, a resist 650 having a predetermined pattern with openings is formed on the semiconductor layer 3. Then, the resist 650 and the field oxide film 10 are used as a mask, and ions of a p type impurity 210, such as boron, are implanted in the upper surface of the semiconductor layer 3 under the same conditions for implanting ions as those for the formation of the impurity regions 7, 8, 104 and 205, as well as the emitter region 203, according to the fourth embodiment. As a result of this, an impurity region 407 is formed in the upper surface of the emitter region 405, an impurity region 104 is formed in the upper surface of the base region 103, an emitter region 203 is formed in the upper surface of the semiconductor layer 3, and an impurity region 205 is formed in the upper surface of the collector region 204. After that, the resist 650 is removed, and heat treatment is carried out at, for example, 800° C. for approximately 30 minutes, so that the impurity regions 104, 205 and 407, as well as the emitter region 203, are made to diffuse.

After that, an interlayer insulating film 30 is formed, and collector electrodes 106, 208 and 426, emitter electrodes 107, 207 and 425, and base electrodes 108 and 206, are formed in this interlayer insulating film 30.

In accordance with the manufacturing method, an n type impurity is introduced into the semiconductor layer 3 from the upper surface, and thereby, an impurity region 409 is formed and buried inside the semiconductor layer 3 so as not to be exposed from the semiconductor layer 3. Accordingly, the manufacturing method can be simplified and the cost for processing can be reduced, in comparison with a case where the impurity region 409 is formed in the upper surface of a first portion of the semiconductor layer 3, and then, a second portion of the semiconductor layer 3 is formed on top of this first portion of the semiconductor layer 3, in the same manner as with the formation of the impurity region 9 according to the first embodiment.

In addition, the impurity region 409 and the impurity region 109 are simultaneously formed in accordance with the manufacturing method, and thereby, an IGBT 420 having a high withstand voltage and a low threshold voltage, and an NPN transistor 111 having a collector region with a low resistance can be formed without increasing the number of steps.

In addition, the impurity region 409 and the impurity region 209 are simultaneously formed, and thereby, an IGBT 420 having a high withstand voltage and a low threshold voltage, and a PNP transistor 211 having a high withstand voltage between the emitter and the collector can be formed without increasing the number of steps.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a semiconductor substrate;
an insulating layer which is formed on said semiconductor substrate;
an n type semiconductor layer which is formed on said insulating layer;
a p channel type MOS transistor which is formed in said semiconductor layer; and
an n type impurity region which is formed in said semiconductor layer and has an impurity concentration higher than that of said semiconductor layer, wherein said MOS transistor has p type source and drain regions which are formed in an upper surface of said semiconductor layer at a distance from each other, said impurity region, at least, is formed over the entire bottom of said source region at a portion directly below said source region and is formed directly below said semiconductor layer between said source region and said drain region, and a peak position of the impurity concentration in said impurity region is set below a lowest end of said source region at a portion directly below the upper surface of said semiconductor layer between said source region and said drain region.

2. The semiconductor device according to claim 1, wherein said impurity region is located below said lowest end at a distance from said source region.

3. The semiconductor device according to claim 1, wherein said impurity region is not located directly below said drain region.

4. A driver circuit having an output stage which is configured by two transistors connected in a totem pole manner between a first voltage and a second voltage lower than the first voltage, and outputting a driving voltage from the output stage, the driver circuit comprising a semiconductor device, wherein said semiconductor device comprises:

a semiconductor substrate;

an insulating layer which is formed on said semiconductor substrate;

an n type semiconductor layer which is formed on said insulating layer;

a p channel type MOS transistor which is formed in said semiconductor layer; and an n type impurity region which is formed in said semiconductor layer and has an impurity concentration higher than that of said semiconductor layer, said MOS transistor has p type source and drain regions which are formed in an upper surface of said semiconductor layer at a distance from each other, said impurity region, at least, is formed over the entire bottom of said source region at a portion directly below said source region and is formed directly below said semiconductor layer between said source region and said drain region, a peak position of the impurity concentration in said impurity region is set below a lowest end of said source region at a portion directly below the upper surface of said semiconductor layer between said source region and said drain region, and said MOS transistor in said semiconductor device is used as said transistor on said first voltage side in said output stage.

5. A manufacturing method of a semiconductor device, wherein said semiconductor device comprises:

a semiconductor substrate;

an insulating layer which is formed on said semiconductor substrate;

an n type semiconductor layer which is formed on said insulating layer;

a p channel type MOS transistor which is formed in said semiconductor layer; and an n type impurity region which is formed in said semiconductor layer and has an impurity concentration higher than that of said semiconductor layer, said MOS transistor has p type source and drain regions which are formed in an upper surface of said semiconductor layer at a distance from each other, said impurity region, at least, is formed over the entire bottom of said source region at a portion directly below said source region and is formed directly below said semiconductor layer between said source region and said drain region, and a peak position of the impurity concentration in said impurity region is set below a lowest end of said source region at a portion directly below the upper surface of said semiconductor layer between said source region and said drain region, the manufacturing method comprising the steps of:

(a) preparing an SOI substrate including said semiconductor substrate, said insulating layer and said semiconductor layer; and (b) forming said MOS transistor and said impurity region in said semiconductor layer, wherein said step (b) includes the steps of:

(b-1) introducing n type impurities into said semiconductor layer from above, thereby forming said impurity region in such a manner that said impurity region is buried into said semiconductor layer so as not to be exposed from said semiconductor layer; and (b-2) forming said drain and source regions of said MOS transistor in the upper surface of said semiconductor layer.

6. A manufacturing method of a semiconductor device, wherein said semiconductor device comprises:

a semiconductor substrate;

an insulating layer which is formed on said semiconductor substrate;

an n type semiconductor layer which is formed on said insulating layer;

a p channel type MOS transistor which is formed in said semiconductor layer;

an n type first impurity region which is formed in said semiconductor layer and has an impurity concentration higher than that of said semiconductor layer;

an NPN transistor which is formed in said semiconductor layer; and an n type second impurity region which is formed in said semiconductor layer and has an impurity concentration higher than that of said semiconductor layer, said MOS transistor has p type source and drain regions which are formed in an upper surface of said semiconductor layer at a distance from each other, said first impurity region, at least, is formed over the entire bottom of said source region at a portion directly below said source region and is formed directly below said semiconductor layer between said source region and said drain region, a peak position of the impurity concentration in said first impurity region is set below a lowest end of said source region at a portion directly below the upper surface of said semiconductor layer between said source region and said drain region, said NPN transistor has:

a p type base region which is formed in the upper surface of said semiconductor layer;

an n type emitter region which is formed in an upper surface of said base region; and an n type third impurity region which is formed in the upper surface of said semiconductor layer at a distance from said base region, and is electrically connected to a collector electrode, and said second impurity region is provided at least directly below said emitter region and said base region, the manufacturing method comprising the steps of:
(a) preparing an SOI substrate including said semiconductor substrate, said insulating layer and said semiconductor layer;
(b) simultaneously forming said first impurity region and said second impurity region; and
(c) forming said drain and source regions of said MOS transistor, and said base region, emitter region and third impurity region of said NPN transistor.

7. A manufacturing method of a semiconductor device, wherein
said semiconductor device comprises:
a semiconductor substrate;
an insulating layer which is formed on said semiconductor substrate;
an n type semiconductor layer which is formed on said insulating layer;
a p channel type MOS transistor which is formed in said semiconductor layer;
an n type first impurity region which is formed in said semiconductor layer and has an impurity concentration higher than that of said semiconductor layer;
a PNP transistor which is formed in said semiconductor layer; and
an n type second impurity region which is formed in said semiconductor layer and has an impurity concentration higher than that of said semiconductor layer,
said MOS transistor has p type source and drain regions which are formed in an upper surface of said semiconductor layer at a distance from each other,
said first impurity region, at least, is formed over the entire bottom of said source region at a portion directly below said source region and is formed directly below said semiconductor layer between said source region and said drain region,
a peak position of the impurity concentration in said first impurity region is set below a lowest end of said source region at a portion directly below the upper surface of said semiconductor layer between said source region and said drain region,
said PNP transistor has:
an n type third impurity region which is formed in the upper surface of said semiconductor layer and is electrically connected to a base electrode;
a p type collector region which is formed in the upper surface of said semiconductor layer; and
a p type emitter region which is formed in the upper surface of said semiconductor layer between said third impurity region and said collector region, and
said second impurity region is provided at least directly below said emitter region,
the manufacturing method comprising the steps of:
(a) preparing an SOI substrate including said semiconductor substrate, said insulating layer and said semiconductor layer;
(b) simultaneously forming said first impurity region and said second impurity region; and
(c) forming said drain and source regions of said MOS transistor and said third impurity region, collector region and emitter region of said PNP transistor.

8. A semiconductor device comprising:
a semiconductor substrate;
an insulating layer which is formed on said semiconductor substrate;
an n type semiconductor layer which is formed on said insulating layer;
a p channel type insulating gate type bipolar transistor which is formed in said semiconductor layer; and
an n type first impurity region which is formed in said semiconductor layer and has an impurity concentration higher than that of said semiconductor layer, wherein
said insulating gate type bipolar transistor has a p type emitter region and a p type second impurity region which are formed in an upper surface of said semiconductor layer at a distance from each other, and an n type collector region which is formed in said semiconductor layer in contact with said second impurity region,
said first impurity region, at least, is formed over the entire bottom of said emitter region at a portion directly below said emitter region and is formed directly below said semiconductor layer between said emitter region and said second impurity region, and
a peak position of the impurity concentration in said first impurity region is set below a lowest end of said emitter region at a portion directly below the upper surface of said semiconductor layer between said emitter region and said second impurity region.

9. The semiconductor device according to claim 8, wherein
said first impurity region is located below said lowest end at a distance from said emitter region.

10. The semiconductor device according to claim 8, wherein
said first impurity region is not located directly below said second impurity region.

11. A driver circuit having an output stage which is configured by two transistors connected in a totem pole manner between a first voltage and a second voltage lower than the first voltage, and outputting a driving voltage from the output stage,
the driver circuit comprising a semiconductor device, wherein
said semiconductor device comprises:
a semiconductor substrate;
an insulating layer which is formed on said semiconductor substrate;
an n type semiconductor layer which is formed on said insulating layer;
a p channel type insulating gate type bipolar transistor which is formed in said semiconductor layer; and
an n type first impurity region which is formed in said semiconductor layer and has an impurity concentration higher than that of said semiconductor layer,
said insulating gate type bipolar transistor has a p type emitter region and a p type second impurity region which are formed in an upper surface of said semiconductor layer at a distance from each other, and an n type collector region which is formed in said semiconductor layer in contact with said second impurity region,
said first impurity region, at least, is formed over the entire bottom of said emitter region at a portion directly below said emitter region and is formed directly below said semiconductor layer between said emitter region and said second impurity region,
a peak position of the impurity concentration in said first impurity region is set below a lowest end of said emitter region at a portion directly below the upper surface of said semiconductor layer between said emitter region and said second impurity region, and said insulating gate type bipolar transistor in said semiconductor device is used as said transistor on said first voltage side in said output stage.

12. A manufacturing method of a semiconductor device, wherein said semiconductor device comprises:

a semiconductor substrate;

an insulating layer which is formed on said semiconductor substrate;

an n type semiconductor layer which is formed on said insulating layer;

a p channel type insulating gate type bipolar transistor which is formed in said semiconductor layer; and an n type first impurity region which is formed in said semiconductor layer and has an impurity concentration higher than that of said semiconductor layer, said insulating gate type bipolar transistor has a p type emitter region and a p type second impurity region which are formed in an upper surface of said semiconductor layer at a distance from each other, and an n type collector region which is formed in said semiconductor layer in contact with said second impurity region, said first impurity region, at least, is formed over the entire bottom of said emitter region at a portion directly below said emitter region and is formed directly below said semiconductor layer between said emitter region and said second impurity region, and a peak position of the impurity concentration in said first impurity region is set below a lowest end of said emitter region at a portion directly below the upper surface of said semiconductor layer between said emitter region and said second impurity region, the manufacturing method comprising the steps of:

(a) preparing an SOI substrate including said semiconductor substrate, said insulating layer and said semiconductor layer; and (b) forming said insulating gate type bipolar transistor and said first impurity region in said semiconductor layer, wherein said step (b) includes the steps of:

(b-1) introducing n type impurities into said semiconductor layer from above, thereby forming said first impurity region in such a manner that said first impurity region is buried into said semiconductor layer so as not to be exposed from said semiconductor layer; and (b-2) forming said emitter region, collector region and second impurity region of said insulating gate type bipolar transistor in the upper surface of said semiconductor layer.

13. A manufacturing method of a semiconductor device, wherein said semiconductor device comprises:

a semiconductor substrate;

an insulating layer which is formed on said semiconductor substrate;

an n type semiconductor layer which is formed on said insulating layer;

a p channel type insulating gate type bipolar transistor which is formed in said semiconductor layer;

an n type first impurity region which is formed in said semiconductor layer and has an impurity concentration higher than that of said semiconductor layer;

an NPN transistor which is formed in said semiconductor layer; and an n type second impurity region which is formed in said semiconductor layer and has an impurity concentration higher than that of said semiconductor layer, said insulating gate type bipolar transistor has a p type emitter region and a p type third impurity region which are formed in an upper surface of said semiconductor layer at a distance from each other, and an n type collector region which is formed in said semiconductor layer in contact with said third impurity region, said first impurity region, at least, is formed over the entire bottom of said emitter region at a portion directly below said emitter region and is formed directly below said semiconductor layer between said emitter region and said third impurity region, a peak position of the impurity concentration in said first impurity region is set below a lowest end of said emitter region at a portion directly below the upper surface of said semiconductor layer between said emitter region and said third impurity region, said NPN transistor has:

a p type base region which is formed in the upper surface of said semiconductor layer;

an n type emitter region which is formed in an upper surface of said base region; and an n type fourth impurity region which is formed in the upper surface of said semiconductor layer at a distance from said base region, and is electrically connected to a collector electrode, and said second impurity region is provided at least directly below said emitter region and base region of said NPN transistor, the manufacturing method comprising the steps of:

(a) preparing an SOI substrate including said semiconductor substrate, said insulating layer and said semiconductor layer;

(b) simultaneously forming said first impurity region and said second impurity region; and (c) forming said emitter region, collector region and third impurity region of said insulating gate type bipolar transistor and said base region, emitter region and fourth impurity region of said NPN transistor.

14. A manufacturing method of a semiconductor device, wherein said semiconductor device comprises:

a semiconductor substrate;

an insulating layer which is formed on said semiconductor substrate;

an n type semiconductor layer which is formed on said insulating layer;

a p channel type insulating gate type bipolar transistor which is formed in said semiconductor layer;

an n type first impurity region which is formed in said semiconductor layer and has an impurity concentration higher than that of said semiconductor layer;

a PNP transistor which is formed in said semiconductor layer; and an n type second impurity region which is formed in said semiconductor layer and has an impurity concentration higher than that of said semiconductor layer, said insulating gate type bipolar transistor has a p type emitter region and a p type third impurity region which are formed in an upper surface of said semiconductor layer at a distance from each other, and an n type collector region which is formed in said semiconductor layer in contact with said third impurity region, said first impurity region, at least, is formed over the entire bottom of said emitter region at a portion directly below said emitter region and is formed directly below said semiconductor layer between said emitter region and said third impurity region, a peak position of the impurity concentration in said first impurity region is set below a lowest end of said emitter region at a portion directly below the upper surface of said semiconductor layer between said emitter region and said third impurity region, said PNP transistor has:

an n type fourth impurity region which is formed in the upper surface of said semiconductor layer, and is electrically connected to a base electrode;

a p type collector region which is formed in the upper surface of said semiconductor layer; and a p type emitter region which is formed in the upper surface of said semiconductor layer between said fourth impurity region and said p type collector region, and said second impurity region is provided at least directly below said emitter region of said PNP transistor, the manufacturing method comprising the steps of:

(a) preparing an SOI substrate including said semiconductor substrate, said insulating layer and said semiconductor layer;

(b) simultaneously forming said first impurity region and said second impurity region; and (c) forming said emitter region, collector region and third impurity region of said insulating gate type bipolar transistor and said fourth impurity region, p type collector region and emitter region of said PNP transistor.

* * * * *